United States Patent [19]
Onakado et al.

[11] Patent Number: 5,818,761
[45] Date of Patent: Oct. 6, 1998

[54] NON-VOLATILE SEMICONDUCTOR MEMORY DEVICE CAPABLE OF HIGH SPEED PROGRAMMING/ERASURE

[75] Inventors: Takahiro Onakado; Hiroshi Takada; Kiyoshi Hayashi, all of Hyogo, Japan

[73] Assignee: Mitsubishi Denki Kabushiki Kaisha, Tokyo, Japan

[21] Appl. No.: 897,101

[22] Filed: Jul. 18, 1997

[30]    Foreign Application Priority Data

Sep. 10, 1996   [JP]   Japan ................................. 8-239077

[51] Int. Cl.$^6$ .................................................. G11C 16/04
[52] U.S. Cl. ............................... 365/185.18; 365/185.11; 365/185.13; 365/185.24
[58] Field of Search .......................... 365/185.18, 185.11, 365/185.13, 185.24, 189.09

[56]               References Cited

U.S. PATENT DOCUMENTS

| | | | |
|---|---|---|---|
| 5,218,571 | 6/1993 | Norris ................................. | 365/189.09 |
| 5,303,189 | 4/1994 | Devin et al. .................... | 365/189.09 X |
| 5,398,203 | 3/1995 | Prickett, Jr. .................... | 365/185.18 X |
| 5,576,990 | 11/1996 | Camerlenghi et al. ......... | 365/185.18 X |

OTHER PUBLICATIONS

"Novel Electron Injection Method Using . . . with a P–Channel Cell", Ohnakado et al.., IEDM 95, pp. 279–282.

"A High Programming . . . DINOR Flash Memory", O. Sakamoto et al., 1996 Symposium on VLSI Technology Digest of Technical Papers, pp. 222–223.

"3.3V–Only 16 Mb DINOR Flash Memory", S. Kobayashi et al., 1995 IEEE International Solid–State Circuits Conference, pp. 122–123.

*Primary Examiner*—Huan Hoang
*Attorney, Agent, or Firm*—McDermott, Will & Emery

[57]               ABSTRACT

To a column line to which a selected memory cell is connected, a write bias voltage is supplied through a selection gate transistor having different channel conductivity type than the memory cell transistor. Current drivability of the selection gate transistor is adapted to be larger than a leak current of the memory cell and to supply a current smaller than the channel current when a channel is formed in one aspect. When a verifying voltage is applied to the selected word line, a large channel current flows when a channel is formed, potential of a subbit line is changed accordingly, and programming is suppressed. In another aspect, the selection gate transistor serves as a constant current source to make the programming speed of the memory cells constant. Thus distribution of threshold values after programming can be made narrow.

20 Claims, 28 Drawing Sheets

Vstp

PROGRAM BIAS VOLTAGE,
SUBSTRATE POTENTIAL
OF PSG

WORD LINE

SOURCE LINE

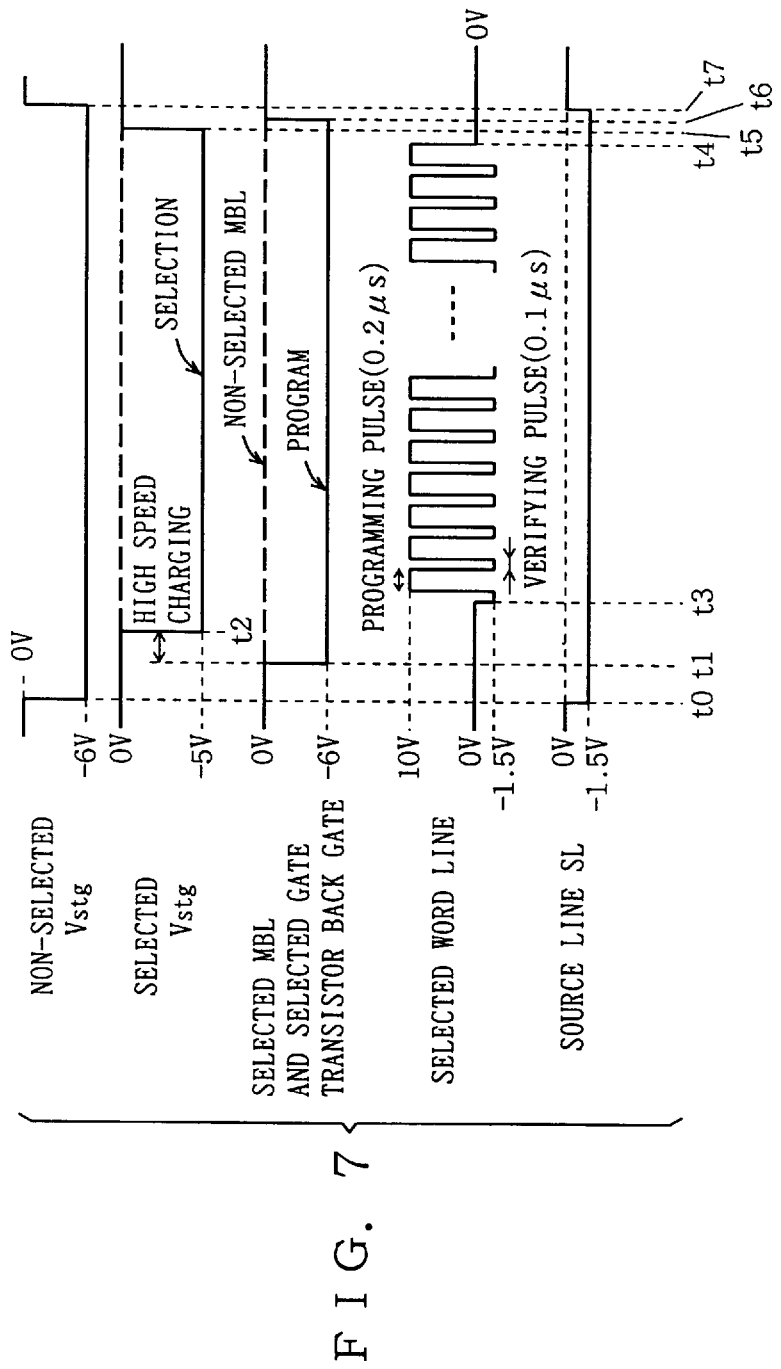
F I G. 7

<PROGRAMMING>

<ERASURE>

<ERASURE>

5,818,761

NON-VOLATILE SEMICONDUCTOR MEMORY DEVICE CAPABLE OF HIGH SPEED PROGRAMMING/ERASURE

BACKGROUND OF THE INVENTION

1. Field of the Invention

The present invention relates to a non-volatile semiconductor memory device. More specifically, it relates to a structure for enabling high speed programming/erasure of a non-volatile semiconductor memory device in which a memory cell is constituted by one stacked gate transistor.

2. Description of the Background Art

FIG. 44 shows an electrical equivalent circuit of a memory cell of a conventional flash EEPROM (Electrically Erasable and Programmable Memory; hereinafter referred to as a flash memory). Referring to FIG. 44, the flash memory cell consists of a stacked gate transistor including a drain node D, a source node S, a floating gate FG separated from these source and drain nodes S and D by a tunnel insulating film, and a control gate CG formed on floating gate FG with an interlayer insulating film interposed therebetween. In accordance with the amount of electrons accumulated at floating gate FG, threshold voltage of the stacked gate transistor changes.

When a voltage larger in absolute value than the threshold value of the stacked gate transistor is applied to control gate CG, the stacked gate transistor is rendered conductive and a current flows. Meanwhile, if the absolute value of the voltage applied to control gate CG is smaller than the absolute value of the threshold voltage of the stacked gate transistor, the stacked gate transistor is kept off, and current does not flow. By detecting presence/absence of the current, information stored in the flash memory cell is read. Therefore, the flash memory cell stores data "0" and "1" in accordance with the amount of electrons accumulated in floating gate FG.

Floating gate FG is isolated from peripheral portions by an insulating film, and electrons are stored in the floating gate FG in non-volatile manner. Therefore, once information is stored, the flash memory cell retains the stored information in non-volatile manner. In the flash memory, which is one type of the non-volatile semiconductor memory devices, the memory cell consists of one transistor. Therefore, compared with a dynamic random access memory (DRAM) in which the memory cell consists of one MOS transistor (insulated gate type field effect transistor) and one capacitor, unit price per bit is lower, and it is more suitable to higher degree of integration. Therefore, the flash memory is considered a promising memory device of the next generation.

In the flash memory, when data is written to store information, electrons are injected to/extracted from the floating gate FG. There are various methods of data writing. Representative data writing operation will be described in the following.

FIG. 45 shows a cross sectional structure of a conventional NOR type flash memory and condition of application of a voltage during writing (programming) operation. Referring to FIG. 45, the flash memory cell includes highly doped n type (n+) impurity regions 932 and 933 formed spaced from each other at a surface of a P well 931 as a semiconductor substrate region; a floating gate 935 formed on a channel forming region between impurity regions 932 and 933 at the surface of P well 931 with a thin tunnel insulating film 934 interposed; and a control gate electrode 932 formed on floating gate 935 with an interlayer insulating film 936 interposed. Impurity region 932 serves as a source region and is connected to source node S while impurity region 933 serves as a drain region and is connected to drain node D.

In the NOR type flash memory, source impurity region 932(S) is connected to a source line, and drain impurity region 933(D) is connected to a bit line. Control gate electrode 937(CG) is connected to a word line. Flash memory cells are arranged in rows and columns, bit lines are arranged corresponding to respective columns and word lines are arranged corresponding to respective rows. All the memory cells of a column are connected to a corresponding bit line, and control gates of the memory cells of a row are connected to a corresponding word line.

In programming operation, referring to FIG. 45, a voltage of about +5V is applied to drain impurity region 933, and a voltage of about +10V is applied to control gate electrode 937. Source impurity region 932 and P well 931 are kept at a ground voltage (0V).

Under such condition of voltage application, in the stacked gate transistor (hereinafter referred to as a memory transistor), a channel is formed in accordance with the voltage applied to control gate electrode 937, and a current of several hundreds µA flows in the channel region. Of the electrons which flow from source impurity region 932 to drain impurity region 933 through the channel, those accelerated near drain impurity region 933 turn to electrons having high energy, that is, so called channel hot electrons, because of a drain high electric field formed near the drain impurity region 933.

The channel hot electrons are injected to floating gate electrode 935 as shown by the arrow A in FIG. 45, because of an electric field induced by the voltage applied to control gate electrode 937. When electrons are accumulated in floating gate 935, the threshold voltage Vth of the memory transistor attains to 8V, for example. This state is referred to as written (programmed) state, which corresponds to the state storing data "0".

Erasing operation will be described with reference to FIG. 46. In this erasing operation, a voltage of about +5V is applied to source impurity region 932, a negative voltage of about −10V is applied to control gate electrode 937 and P well 931 is kept at the level of the ground voltage, as shown in FIG. 46. At this time, drain impurity region 933 is opened.

Under such condition of voltage application, by the high voltage applied between source impurity region 932 and control gate electrode 937, a high electric field is applied between floating gate 935 and source impurity region 932, and electrons existing in floating gate electrode 935 pass through thin tunnel insulating film 934 by FN (Fowler-Nordheim) tunneling phenomenon, as shown by the arrow B in FIG. 46. By the FN tunneling phenomenon, electrons existing in floating gate electrode 935 are extracted, amount of electrons in floating gate electrode 935 reduces, and the threshold voltage vth of the memory transistor attains to 2V, for example. This state is referred to as an erased state, which corresponds to the state storing data "1".

Other than the NOR type flash cell in which programming is performed by using channel hot electrons (CHE) and erasure is performed utilizing FN tunneling phenomenon, various memory cells have been developed to reduce power consumption at the time of programming and erasure, so that only one single power supply can be used. One of such flash memory cells is a DINOR (divided bit line NOR) type flash memory.

FIG. 47 shows a cell structure of the DINOR type flash memory and conditions for applying voltages during programming operation. Referring to FIG. 47, the DINOR type flash memory cell has the same structure as NOR type flash memory cell, and corresponding portions are denoted by the same reference numerals. However, in the DINOR type flash memory cell structure, source and drain impurity regions 932 and 933 are partially overlapping floating gate electrode 935, with tunnel insulating film 934 interposed.

In the DINOR type flash memory, main bit lines are arranged corresponding to columns of memory cells. In each column of the memory cells, a subbit line is arranged for every prescribed number of memory cells, and the memory cells are connected to the subbit line. A subbit line is connected to the corresponding main bit line through a selection gate transistor. Only that subbit line to which a selected memory cell is connected to the corresponding main bit line. Since the bit line is adapted to have a hierarchical structure of the main bit line and the subbit line, the number of memory cells connected to the main bit line can be reduced equivalently, and parasitic capacitance/resistance connected to the main bit line can be reduced.

Referring to FIG. 47, source impurity regions 932 of all the memory cells or of the memory cells in a block (sector) constituted by a prescribed number of memory cells are electrically connected commonly through a source line. A word line is connected to control gate electrode 937, and drain impurity region 933 is connected to the subbit line. Writing/reading of data is performed through the subbit line and the main bit line.

In programming operation, referring to FIG. 47, a negative potential of about −8 to about −11V is applied to control gate electrode 937 and a positive potential of about +4 to about +8V is applied to drain impurity region 933. P well 931 is maintained at the ground voltage (0V), and source impurity region 932 is held opened. In this state, an intensive electric field is applied to the tunnel insulating film 934 at that region where floating gate electrode 935 and drain impurity region 933 overlap. By the application of this intensive electric field, FN tunneling phenomenon occurs, and electrons are injected from floating gate electrode 935 through tunnel insulating film 934 to drain impurity region 933. By this programming operation, electrons are extracted from floating gate electrode 935, and therefore the memory cell attains to the "low Vt" state (in which the threshold voltage is low).

Meanwhile, in the erasing operation, referring to FIG. 48, a positive potential of about +8 to about +12V is applied to control gate electrode 937, and a negative potential of about −6 to about −11V is applied to source impurity region 932 and to P well 931. Drain impurity region 933 is maintained open. In this state, by the high positive potential applied to control gate electrode 937, a channel layer of electrons 938 is formed, and because of a large voltage between control gate electrode 937 and the P well, an intensive electric field is applied to tunnel insulating film 930 between the channel layer and floating gate electrode 935. By this intensive electric field, FN tunneling phenomenon occurs, and electrons 938 in the channel layer are injected to floating gate 935. By this erasing operation, the memory cell attains to the "high Vt" state (in which threshold voltage Vth is high).

In reading operation, a positive potential of about +3 to about +5V, which is intermediate between "high Vt" and "low Vt" is applied to control gate electrode 937. Source impurity region 932 and P well 931 are grounded. A positive potential of about +1V to about +2V is applied to drain impurity region 933, whether a current flows in the memory cell transistor or is detected, and based on the result of detection, whether the memory cell is at the "high Vt" state or "low Vt" state is determined.

In the DINOR type flash memory, programming and erasing operations are reverse to those in a common NOR type flash memory.

Further, recently, a flash memory has been proposed in which the memory cell is formed by a p channel MOS (PMOS) transistor and programming is performed by using injection current caused by hot electrons induced by band to band tunneling current. Principle of operations of a DINOR flash memory using the PMOS transistor will be described in the following.

FIG. 49A shows a cross sectional structure of the PMOS type DINOR flash memory cell and condition for applying voltages at the time of programming. Referring to FIG. 49A, the PMOS type flash memory cell includes p type impurity regions 2 and 3 of high concentration formed spaced from each other at a surface of an N type well 1, a floating gate electrode 5 formed on the channel region between p type impurity regions 2 and 3 with a thin tunnel insulating film 4 interposed, and a control electrode 7 formed on floating gate electrode 5 with an interlayer insulating film 6 interposed. The p type impurity region 2 serves as a source region and p type impurity region 3 serves as a drain region. These p type impurity regions 2 and 3 are partially overlapped with floating gate electrode 5 with tunnel insulating film 4 interposed.

In programming operation, referring to FIG. 49A, a positive potential of about +4 to about +11V is applied to control gate electrode 7, a negative potential of about −3 to about −10V is applied to drain impurity region 3, and source impurity region is set to open state. N well 1 is maintained at the ground potential. More specifically, voltages of opposite polarity to those in programming of the DINOR type flash memory cell using n channel MOS transistor shown in FIG. 47 are applied. Here, referring to FIG. 49A, PN junctions 2a and 3a are formed between N well 1 and p type impurity regions 2 and 3, respectively.

Under such condition of voltage application, a high electric field is applied to drain impurity region 3, band to band tunneling current is generated and as shown in an enlarged view of portion A shown in FIG. 49B, electron-hole pairs 9 are generated. Of the generated electron-hole pairs 9, electrons 9a are accelerated to the channel region by lateral electric field. These accelerated electrons acquire high energy, and became hot electrons. A positive potential is applied to control gate electrode 7, and hot electrons are accelerated by the high electric field induced by the high voltage between control gate electrode 7 and drain impurity region 3 and injected to floating gate electrode 5 through tunnel insulating film 4. By injection of hot electrons induced by band to band tunneling current, electrons are injected to floating gate electrode 5, enabling programming operation of the memory cell. By this programming operation, the memory cell, which consists of a p channel type transistor is set to "low Vt" state where the absolute value of the threshold voltage is small.

FIG. 50 is an illustration showing the band to band tunneling phenomenon. Referring to FIG. 50, a valence band Ev and a conduction band Ec at the tunnel insulating film (oxide film) between gate electrode (floating gate electrode) and n type impurity region (drain impurity region) are shown. Under the condition of voltage application at the time of programming, silicon energy band bends in a depletion region in the drain impurity region. If the bending of the band exceeds the band gap of silicon, the valence band Ev becomes higher than the conduction band Ec, and tunneling of electrons in valence band Ev to the conduction band Ec in the silicon substrate occurs, leaving holes in the valence band Ev. Accordingly, electron-hole pairs are generated. The electrons tunneled to conduction band Ec are accelerated by the high electric field in the depletion region, and become hot electrons.

The higher the electric field intensity in the silicon substrate (drain impurity region), the sharper the band bending in the silicon substrate (drain impurity).

Referring to FIG. 51, erasing operation will be described. In the erasing operation, a negative potential of about −5 to −12V is applied to control gate electrode 7, a positive potential of about +5 to about +12V is applied to source impurity region 2 and N well 1, and drain impurity region 3 is set to open state. In this case also, voltages of opposite polarity to those used for erasing the DINOR type flash memory cell employing an n channel type MOS transistor are applied. Because of a large negative potential to control gate electrode 7, a channel layer of holes 9b is formed in a region between impurity regions 2 and 3 of N well 1. To the tunnel insulating film 4 between thus formed channel layer and the floating gate electrode 5, a high electric field is applied due to the voltages applied to control gate electrode 7 and N well 1, and by FN tunneling phenomenon, electrons are extracted from floating gate electrode 5 to the channel layer (p type channel layer) 8 of the holes. By this erasing operation, the memory cell is set to "high Vt" state (where the absolute value of the threshold voltage is increased).

In reading operation, a negative potential of about −1.5 to about −5V, which is approximately intermediate between "high Vt" and "low Vt" is applied to control gate electrode 7, source impurity region 2 and N well 1 are kept at the ground potential, and a negative potential of about −1 to about −2V is applied to drain impurity region 3 to cause a current in the bit line. By detecting whether a current flows in a bit line, which is connected to the drain impurity region 3, through the memory cell, whether the memory cell is at "low Vt" or "high Vt" is determined.

In the PMOS type memory cell, of the electron-hole pair 9 generated by the band to band tunneling current, holes 9b (see FIG. 49A and 49B) are pulled into drain impurity region 3, and scatters because of holes existing in a high concentration in the drain impurity region, whereby energy thereof is lost. Accordingly, hot holes will never be generated from the generated electron-hole pairs. Even if there exist hot holes, the hot holes will never be injected to floating gate electrode 5, since the floating gate electrode is set to a positive potential at the time of programming. Therefore, hot hole injection to the tunnel insulating film 4 never occurs, and thus degradation of the tunnel insulating film caused by hot hole injection can be prevented. Further, since hot holes are not injected to the tunnel insulating film, the electric field relaxing layer in the NMOS type memory cell can be dispensed with. Accordingly, effective gate length can be made longer than in the NMOS type memory cell structure, which allows further miniaturization and higher degree of integration.

Further, when electrons are injected to the floating gate electrode, the efficiency of electron injection through band to band tunneling current injection is higher as compared to electron extraction by FN tunneling current used for programming or erasing operation (the band to band tunneling current is higher by one or two orders of magnitude than FN tunneling current). Therefore, programming at the same speed can be realized by lower current consumption, and if programming is done with the same current consumption as NMOS type memory cell, speed of programming can be increased.

The PMOS type DINOR flash memory is capable of simultaneous parallel writing of 512 bytes at 4 $\mu$sec with low power consumption, and very high write data transfer rate of 8 nsec/byte is realized, as disclosed in T. Ohnakado et. al., "Novel Electron Injection Method Using Band-to-Band Tunneling Induced Hot Electron (BBHE) for Flash Memory with a P-channel Cell", IEEE, IEDM, Technical Digest of Papers, pp. 279–282, 1995, and O. Sakamoto et al., "A High Programming Throughput 0.35 $\mu$m P-channel DINOR Flash Memory", IEEE, 1996 Symposium on VLSI Technology Digest of Technical Papers, pp. 222–223, 1996. Therefore, the PMOS type DINOR flash memory of which the method of programming using injection current of hot electrons induced by band to band tunneling current is promising as a high performance flash memory using a single external operational power supply of 3.3V of the next generation.

FIG. 52 shows relation between time of programming and the threshold value of the memory cell at the time of programming of the PMOS type DINOR flash memory cell. Referring to FIG. 52, the abscissa represents the time of writing (unit: microsecond), and the ordinate represents threshold voltage of the memory cell. At the time of programming, electrons are injected to the floating gate electrode, and therefore the threshold voltage of the memory cell becomes smaller in absolute value with time (the threshold voltage becomes higher).

FIG. 53 shows relation between the time for erasure and the threshold voltage of the memory cell of the PMOS type DINOR flash memory cell. In FIG. 53, the abscissa represents time for erasure and the ordinate represents the threshold value of the memory cell. As shown in FIG. 53, at the time of erasure, the longer the time for extracting electrons from the floating gate, the larger the amount of electrons extracted from the floating gate, and accordingly the threshold voltage of the memory cell transistor becomes more negative and its absolute value becomes larger. When the threshold voltage of the memory cell becomes higher than a prescribed value (becomes smaller in absolute value) at the time of programming, the memory cell attains to the low Vt state, and when the threshold voltage of the memory cell becomes more negative than the prescribed value (becomes larger in absolute value), for example −4.5V, the memory cell attains to the high Vt state.

In the DINOR flash memory, as disclosed in S. Kobayashi et. al., "A 3.3V-Only 16 Mb DINOR Flash Memory", 1995 IEEE ISSCC Digest of Technical Papers, pp. 122–123, 1995, a bit by bit verifying method can be applied at the time of programming, width of distribution of the threshold voltages at the time of programming can be made narrow, and even with a low read voltage of 3.3V, it can operate without causing any defect of over-programming. In the aforementioned article by Kobayashi et al. the following bit by bit verifying method is described.

Namely, in the DINOR flash memory, a selected memory cell is connected to a corresponding main bit line through a subbit line and a selection gate. Column latch circuits are provided for respective main bit lines, and write data is latched for every main bit line. At the time of programming, voltage necessary for programming is applied to the bit line in accordance with the data latched in the column latch circuit, and necessary program voltage is applied also to the selected word line. When the programming operation is completed after a prescribed period, a verifying voltage (a voltage slightly larger in absolute value than the threshold voltage of the programmed memory cell) is applied to the selected word line. The main bit line is precharged to a prescribed potential level in accordance with the data latched in the column latch circuit, and only the main bit line to which the programmed memory cell is connected is precharged to the prescribed potential.

When the source line is forced to the level of the ground potential in this state, current flows through the memory cell which is at the low Vt state and its absolute value of the threshold voltage has been made smaller because of programming. By this current, the potential of the main bit line changes, the flow of current of the main bit line is detected by the corresponding column latch circuit, and the data latched in the column latch circuit is inverted. Thus, further programming to the memory cell which is set to the low Vt state is inhibited. In this manner, whether the memory cell has been programmed or not can be verified bit by bit (on the basis of main bit line). By using this bit by bit verifying operation, distribution of the threshold voltage can be made narrow.

FIG. 54 schematically shows a structure of an array portion of the PMOS type DINOR flash memory. FIG. 54 schematically shows a structure of a portion related to two subbit lines SBLi and SBLj. Corresponding to subbit lines SBLi and SBLj, main bit lines MBLi and MBLj are arranged. PMOS type memory cells MC0 to MCm are connected to each of subbit lines SBLi and SBLj. Subbit lines SBLi and SBLj are electrically connected to corresponding main bit lines MBLi and MBLj through selection gates SGi and SGj formed of p channel MOS transistors, respectively. A column block selection signal SGL is applied to the gates of selection gates SGi and SGj. Source regions of memory cells MC0 to MCm are commonly connected to a source line SL. To the control gates of memory cells MCi arranged in the row direction, word line WLi (i=0–m) is connected. In the present DINOR type flash memory, 64 memory cells MC are connected to one subbit line SLB. In FIG. 54, a p channel transistor is represented by a mark ○ appended on its gate.

In the PMOS type DINOR flash memory, at the time of reading, a voltage of −1V is applied to the bit line (main and subbit lines) to which a selected cell is connected. A voltage of −3.3V is applied to the word line WL (represented as word line WL0) corresponding to the selected memory cell. The source line SL is kept at the ground voltage (0V). Gate potentials of non-selected word lines WL1 to WLn are at 0V. The p channel MOS transistor turns on when its gate potential becomes lower by at least the absolute value of the threshold voltage than the source potential. When the memory cell MC0 is the programmed state, the threshold voltage thereof is higher than the potential 3.3V on the word line WL0, and therefore it conducts and a current flows to subbit line SBLi and main bit line MBLi.

Meanwhile, if the memory cell MC0 in the erase state, the threshold voltage is lower (larger in absolute value) than the potential −3.3V on the word line WL0. Therefore, in this state, memory cell MC0 is off. In this state, current does not flow from subbit line SBLi to main bit line MBLi. However, it is necessary that the sum of leakage currents in other memory cells MC1 to MCm is sufficiently smaller than the read current generated when the programmed memory cell is selected. Otherwise, a current flows to the subbit line SBLi and main bit line MBLi due to these leak currents, a memory cell MC0 which is erased is erroneously determined to be in the programmed state, and data is erroneously read.

In the p channel MOS transistor, a node having higher potential is a source. Therefore, when the source line SL is set to the ground voltage 0V and a negative voltage of −1V is applied to main bit lines MBLi and MBLj, source line provides a source potential of the memory cell transistor. In this state, if the potential of non-selected word lines WL1 to WLm is at the level of the ground voltage, the memory cell transistors MC1 to MCm are maintained off provided that the threshold voltage has a negative value. However, in this case, the memory transistors are not completely off and a leak current, so called a subthreshold current, flows. In order to prevent such a leak current, in the PMOS type DINOR flash memory, the threshold voltage Vth after programming must be a value lower (larger in absolute value) than about −1V (which value changes dependent on the characteristics of the memory cell transistor). The same problem is experienced in a flash memory using an n channel MOS transistor, except that the voltages applied to the bit lines and word lines as well as the threshold voltage have different signs (the problem of over erasure).

Here, in a common NOR type flash memory, memory cells MC0 to MCm are directly connected to the main bit line in FIG. 54, and selection gates SGi and SGj are not provided. In such NOR type flash memory, the number of memory cells connected to the bit line of one column is larger than that in DINOR type flash memory, and therefore the influence of leak current is more significant.

As described above, if the absolute value of the threshold voltage is made smaller than is needed at the time of programming, a large leak current flows when non-selected, and data of the selected memory cell is erroneously read. This is referred to as "over-programming defect."

Therefore, when a low voltage of −3.3V is to be used as reading voltage, the threshold voltage Vth of the memory cell transistor after programming should be within the range of −1V to −3.3V, as shown in FIG. 55. As described above, bit by bit verifying method can be used at the time of programming of DINOR flash memory, and if the absolute value of the threshold voltage of a memory cell transistor becomes a prescribed value or lower, programming is automatically completed internally. Accordingly, distribution of the threshold voltages of the memory cell transistors after programming (Vth distribution after programming) can be made narrow in width, and accordingly, read voltage can be lowered to −3.3V (in case of an NMOS type DINOR flash memory, +3.3V).

Meanwhile, in the NOR type flash memory, injection of electrons to the floating gate is performed at the time of erasure, and the problem is the value of the threshold voltage Vth of the memory cell after erasure. However, in NOR type flash memory, all the bits are erased at one time or erased block by block. Therefore, bit by bit verifying method cannot be applied and hence it is difficult to make narrow the width of distribution of the threshold voltages Vth. Accordingly, it is very difficult to make smaller the absolute value of the read voltage.

Here, when the absolute value of the read voltage is made smaller, and potential amplitude of the word line becomes smaller, the voltage amplitude of the word line becomes smaller resulting in high speed operation, and charging/discharging current becomes smaller accordingly, and current consumption is reduced.

Even in the DINOR flash memory in which the width of the Vth distribution after programming can be made narrow by the bit by bit verifying method, it is still necessary to make narrower the width of the Vth distribution after programming to prevent over programming defect if the external power supply voltage is lowered to 3.3V or lower.

Therefore, it is expected that the number of times of bit by bit verifying is increased by making shorter the programming pulse width at the time of programming and making smaller the amount of change in threshold voltage per one programming. However, when programming is performed at such a high speed as 4 μsec as in the PMOS type DINOR flash memory and the time necessary for one verifying operation is approximately the conventional value of a little under about 1 μsec, increase in the number of times of verifying leads to lowering of a data transfer rate of high speed writing of the PMOS type DINOR flash memory.

Therefore, in order to realize operation at a low power supply voltage of 3.3V or lower in the future while maintaining the high speed write data transfer rate, a method of high speed verifying is indispensable.

SUMMARY OF THE INVENTION

An object of the present invention is to provide a non-volatile semiconductor memory device in which width of threshold value distribution of memory cell transistors after injection of electrons to the floating gate can be reduced and electrons can be injected to the floating gate at high speed.

Another object of the present invention is to provide a non-volatile semiconductor memory device in which verifying operation at the time of electron injection to the floating gate can be performed at high speed.

The non-volatile semiconductor memory device according to the present invention includes a plurality of memory cells arranged in rows and columns and each storing information; a plurality of column lines arranged corresponding to the columns of memory cells respectively, to each of which a prescribed number of memory cells are connected; and a plurality of row lines provided corresponding to rows of memory cells respectively and to each of which control gates of memory cells of the corresponding row are connected. Each of the memory cells consists of a stacked gate type transistor having a floating gate for accumulating charges, and a control gate formed at an upper layer of the floating gate.

The non-volatile semiconductor memory device according to the present invention further includes bias voltage transmitting means for transmitting, in a specific operation mode in which absolute value of a threshold voltage of a selected memory cell is made smaller, a prescribed bias voltage to the column line to which the selected memory cell is connected. The current supplying capability of the bias voltage transmitting means is made smaller than current drivability of a memory cell at the time when absolute value of the threshold voltage of the selected memory cell is made smaller than a prescribed value, in the specific operation mode.

The non-volatile semiconductor memory device in accordance with the present invention further includes row driving means for applying a prescribed potential to one of the plurality of row lines to which the selected memory cell is connected.

In the operation mode in which the absolute value of the threshold voltage of the memory cell transistor is made smaller, a constant bias voltage is transmitted with a relatively small current supplying capability to the column line to which the selected memory cell is connected. When the absolute value of the threshold voltage of the memory cell transistor attains a prescribed value or lower, a large channel current flows in the memory cell transistor, and the absolute value of the bias voltage transmitted to the memory cell transistor becomes smaller. Consequently, since a bias voltage of necessary magnitude is not transmitted to the memory cell transistor, the operation of making smaller the absolute value of the threshold value is stopped automatically. As a result, in the memory cell transistor, when the absolute value of the threshold voltage attains to a prescribed value or lower, the operation of adjusting the threshold value is stopped automatically, and hence width of distribution of the absolute values of the threshold voltages can be made narrow.

Further, in this specific operation mode, by supplying a bias voltage to the selected column with a constant current, even when memory cell transistor characteristics vary, the memory cell transistors are free from the influence of such variation, the operation for making smaller the absolute value of the threshold voltage is performed in accordance with the constant current, and hence the speed of change of the threshold voltages of the memory cells can be made constant. Accordingly, the width of distribution of the threshold voltages can be made narrow.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a diagram of waveforms representing operation in programming of the non-volatile semiconductor memory device in accordance with the first embodiment of the present invention.

DESCRIPTION OF THE PREFERRED EMBODIMENTS

[First Embodiment]

Prior to the description of the functions and effects of the present invention, operation of a conventional PMOS type DINOR flash memory will be described for comparison.

Figure 1:
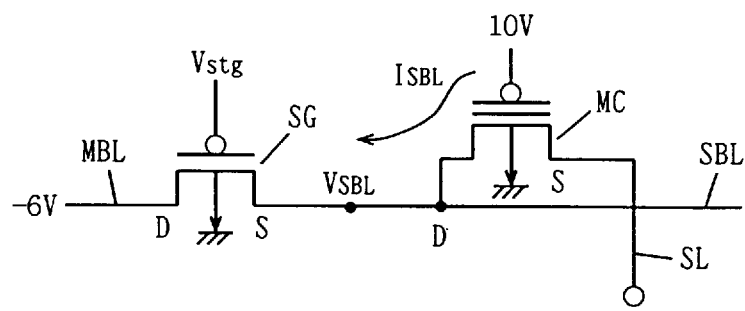
FIG. 1 is an illustration for comparing a non-volatile semiconductor memory device in accordance with a first embodiment of the present invention with a conventional non-volatile semiconductor memory device.

FIG. 1 shows a structure of a portion related to 1 bit of memory cell of a conventional PMOS type DINOR flash memory. In FIG. 1, a selection gate transistor SG is positioned between a main bit line MBL and a subbit line SBL.

A PMOS type memory cell MC is connected to the subbit line SBL. In programming operation, a negative voltage of about −6V is applied to the main bit line MBL. The source (S) of the memory cell MC is set to open state by the source line SL. Memory cell transistor MC receives at its control gate a positive voltage of about 10V, and its substrate region is held at the level of the ground voltage. The selection gate transistor SG consists of a p channel MOS transistor of which substrate region is held at the level of the ground voltage and of which gate receives a negative selection voltage Vstg. Through the selection gate transistor SG, a program voltage (−6V) applied to the main bit line MBL is transmitted to the subbit line SBL. The potential of the subbit line SBL is denoted by VSBL. In programming operation, a leak current is generated in the memory cell. The leak current includes electron-hole pairs generated by band to band tunneling phenomenon, of which electrons are those flowing to the substrate region and those injected to the floating gate.

Figure 2:
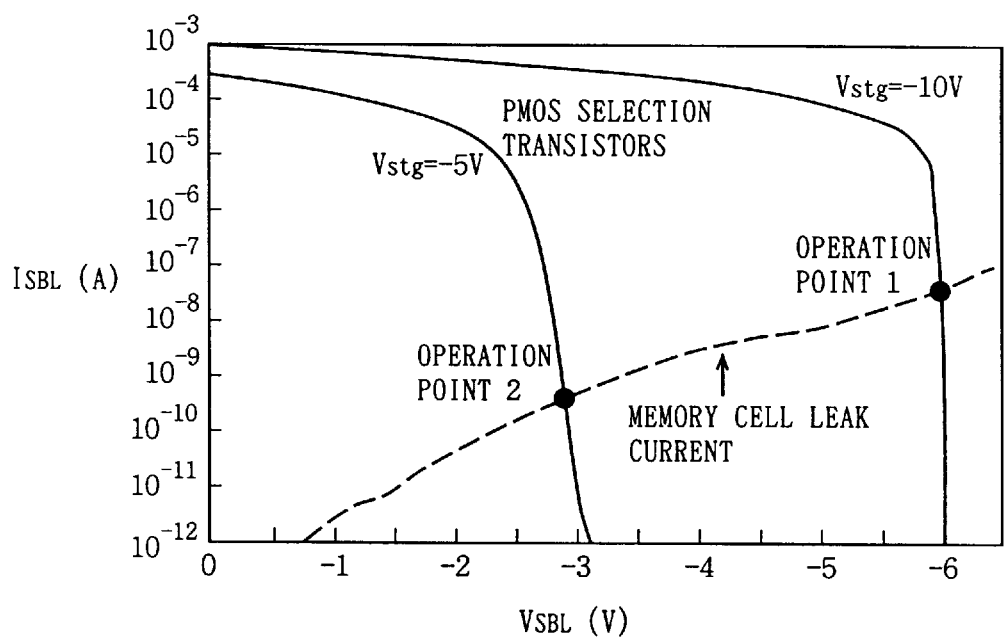
FIG. 2 is a graph showing a problem experienced in the conventional non-volatile semiconductor memory device shown in FIG. 1.

FIG. 2 shows relation between the potential VSBL of the subbit line and a current ISBL flowing through the subbit line in the PMOS type DINOR flash memory cell shown in FIG. 1. The abscissa represents the voltage VSBL of the subbit line and the ordinate represents the current ISBL flowing through the subbit line SBL.

Also shown is the driving current characteristic of the selection gate transistor when the selection voltage Vstg applied to the gate of the selection gate transistor SG is −10V and −5V. The dotted line represents leak current generated in the memory cell. When the selection voltage Vstg is −10V, the source and drain potentials of the selection gate transistor SG will be the same when the voltage VSBL on subbit line SBL is −6V, and hence a current does not flow through the selection gate transistor SG. When the voltage VBL of the subbit line becomes higher than −6V, a large current flows through selection gate transistor SG. In this state, the absolute value of the drain potential of the selection gate transistor SG (potential on the main bit line MBL) becomes larger than the difference between gate-source voltage and the threshold voltage, and it operates in a saturation region and supplies a current in accordance with a square-law characteristic.

Meanwhile, in memory cell MC, when the potential VSBL of the subbit line SGL becomes high, sufficient band to band tunneling phenomenon does not occur, and the leak current decreases. Crossing portion of the leak current of the memory cell (denoted by the dotted line in FIG. 2) and current characteristic when the selection voltage vstg is −10V is the operation point (operation point 1) for the programming operation. Therefore, the selection gate transistor SG transmits −6V which is approximately the same voltage level as the voltage on main bit line SBL, to the subbit line SBL with large current drivability, maintaining the potential of the subbit line SBL.

When the selection voltage Vstg applied to the selection gate transistor SG is made higher to −5V, if the voltage VSBL on the subbit line SBL attains to about −3.2V or lower, current does not flow through the selection gate transistor SG. This is because the substrate region of selection gate transistor SG is kept at the level of the ground potential, the source node (S) thereof is connected to the subbit line SBL and the absolute value of the threshold voltage becomes larger because of the backgate effect. The backgate effect takes place even when the selection voltage Vstg is −10V. However, since the selection voltage Vstg is sufficiently low at −10V, the program bias voltage −6V applied to the main bit line MBL can be transmitted to the subbit line SBL. Therefore, when the selection voltage Vstg is made higher to −5V (when the absolute value is made smaller), the selection gate transistor SG can transmit a voltage of about −3.2V or so to the subbit line SBL. If the voltage VSBL of subbit line SBL becomes higher, the leak current is similarly lowered in the memory cell MC. Therefore, programming operation occurs at the operation point 2 which is the crossing point of the current characteristic of the selection gate transistor SG obtained when the selection voltage Vstg is −5V and the leak current of the memory cell. In this case, the voltage VSBL on the subbit line SBL is about −3.2V. Therefore, there is only a small amount of band to band tunneling current, which is the leak current of the memory cell, and as a result, speed of programming is considerably decreased. Therefore, in the PMOS type DINOR flash memory, when a p channel MOS transistor is used as the selection gate transistor SG connecting the main bit line MBL with the subbit line SBL, for high speed programming, the selection voltage Vstg must be kept at a voltage level of about −10V.

Figure 3:
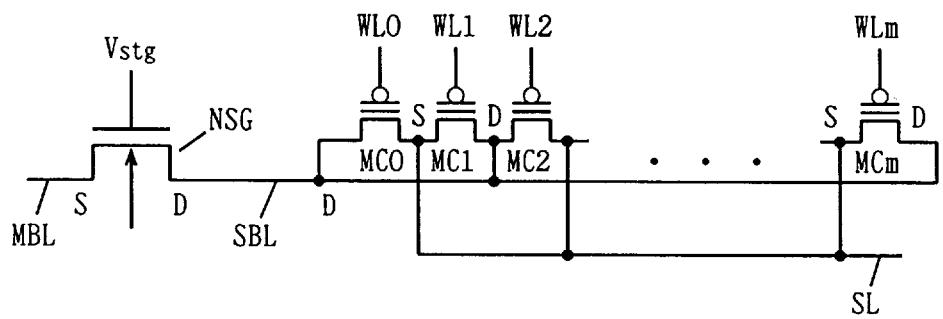
FIG. 3 schematically shows a structure of a main portion of the non-volatile semiconductor memory device in accordance with the first embodiment of the present invention.

FIG. 3 shows a structure of a main portion of the non-volatile semiconductor memory device in accordance with the first embodiment of the present invention.

FIG. 3 shows a structure of a portion related to one subbit line. Referring to FIG. 3, memory cells MC0 to MCm consisting of p channel stacked gate transistors respectively are connected to the subbit line SBL. Word lines WL0 to WLm are connected to the control gates of memory cells MC0 to MCm, respectively. Source nodes (S) of these memory cells MC0 to MCm are commonly connected to the source line SL.

Further, between the main bit line MBL and the subbit line SBL, a subbit line selection gate transistor NSG consisting of an n channel MOS transistor is connected. Selection voltage Vstg is applied to the gate of selection gate transistor NSG. Selection gate transistor NSG is formed in a substrate region different from that for transistors of the peripheral circuitry. The selection gate transistor NSG is an n channel MOS transistor, memory cells MC0 to MCm are p channel MOS transistors, and conductivity types of the substrate regions thereof are different. These are formed in different substrate regions (as will be described later). Therefore, the potentials of the substrate region for the selection gate transistor and of the substrate region for the memory cell transistors and the transistors for the peripheral circuitry can be controlled independent from each other. Further, as an n channel MOS transistor is used as the selection gate transistor, programming operation can be stopped automatically as will be described in greater detail later.

Figure 4:
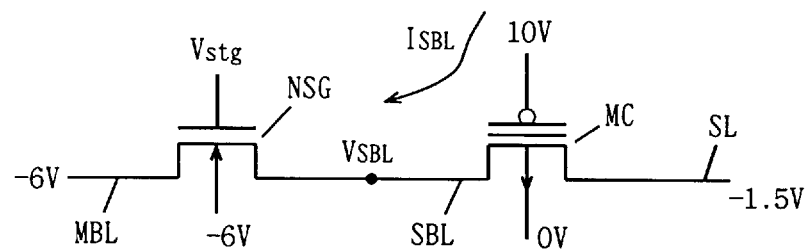
FIG. 4 shows arrangement of voltages applied at the time of programming in the non-volatile semiconductor memory device in accordance with the first embodiment of the present invention.

FIG. 4 shows a manner of voltage application at the time of programming. Referring to FIG. 4, programming to memory cell MC is performed. A negative voltage of about −6V is applied to the main bit line MBL, and a negative voltage of about −6V, which is the same as the voltage on main bit line MBL, is applied to the substrate region of selection gate transistor NSG so as to prevent forward biasing of the PN junction. Ground voltage (0V) is applied to the substrate region of memory cell MC. A bias voltage of about 1.5V is applied to the source line SL. The source line SL is set to a negative potential in order to generate bias effect to the gate voltage to reduce channel current of the memory cell transistor at the time of program verify operation, which will be described later.

In the potential arrangement shown in FIG. 4, to the gate of selection gate transistor NSG consisting of an n channel MOS transistor, a selection voltage Vstg is applied. In the n channel MOS transistor, a node of lower potential serves as the source. Therefore, in the structure shown in FIG. 4, the node connected to the main bit line MBL of the selection gate transistor NSG serves as the source. Therefore, when the selection voltage Vstg attains to a constant voltage level, the selection gate transistor NSG functions as a constant current source and supplies a constant current (the source-gate voltage is constant, and it supplies a constant current in accordance with the square-law characteristic).

Figure 5:
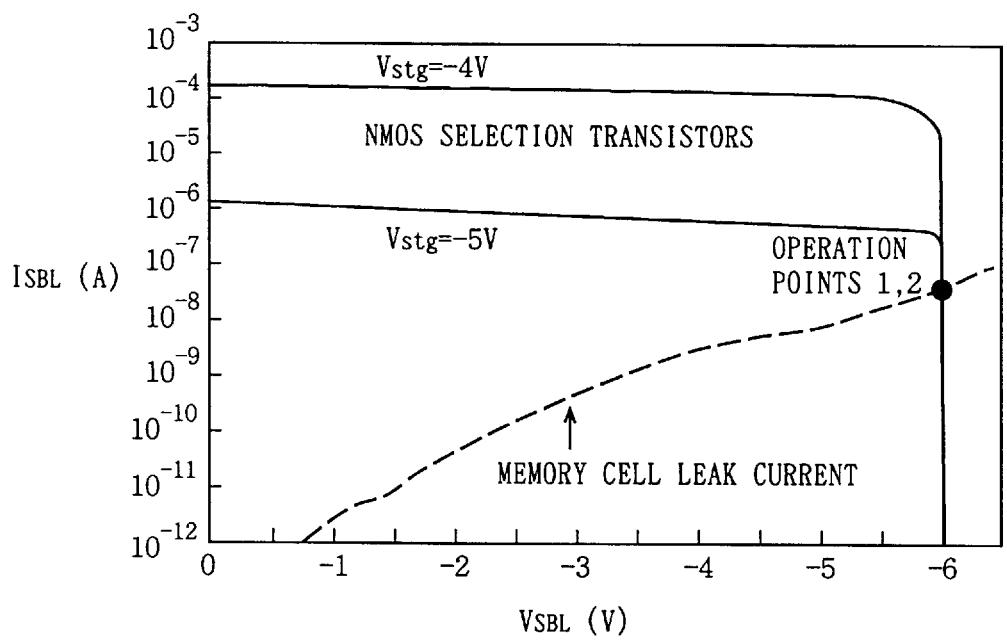
FIG. 5 shows relation between a subbit line voltage, a charging current and a memory cell leak current in the voltage arrangement shown in FIG. 4.

FIG. 5 shows relation between the voltage VSBL of the subbit line SBL and a current ISBL flowing through the subbit line SBL in the potential arrangement shown in FIG. 4. Referring to FIG. 5, the relation between the current flowing through the selection gate transistor and the voltage VSBL on the subbit line caused when the selection voltage Vstg applied to the gate of selection gate transistor is −4V and −5V, and well leak current of the memory cell are shown. When the selection voltage Vstg is −4V or −5V, the gate potential of selection gate transistor NSG is higher than the source potential thereof, and it can transmit a negative potential of the same magnitude as the negative potential −6V of the main bit line MBL to the subbit line SBL. If the voltage VSBL on the subbit line SBL becomes equal to the voltage on the main bit line MBL, current does not flow through the column selection gate transistor NSG. The leak current of the memory cell exhibits the same characteristic as the leak current of the memory cell shown in FIG. 2. Programming to the memory cell is performed at an operation point (1, 2) where the current flowing through the selection gate transistor NSG comes to have the same value as the leak current of the memory cell. More specifically, when the gate voltage of the selection gate transistor is changed to −4V through −5V, the upper limit of charging current (memory cell leak current) at the time of memory cell programming can be controlled while maintaining the transmission characteristic of the bias voltage through selection gate transistor NSG.

Generally, as charging current applied to the subbit line SBL through the selection gate transistor during programming operation, a sufficient large current of about 1 mA is supplied. The memory cell leak current generated during programming operation of the PMOS type DINOR flash memory is as small as several 10 nA per 1 cell, that is, per one subbit line SBL (see Ohnakado or Sakamoto article mentioned above). Therefore, even when the subbit line is charged with large current drivability immediately after the start of programming (when selection voltage Vstg of the gate of the selection gate transistor NSG is 0V) and then the selection voltage vstg applied to the gate is lowered so as to limit the supply current to about 1 μA, the charging current is sufficiently larger than the leak current generated at the time of programming a memory cell. Therefore, the voltage VSBL of the subbit line never increases at the time of programming due to discharge of leak current.

The selection voltage Vstg of the selection gate transistor for non-selected subbit lines is −6V. In this case, the potential of the non-selected subbit lines SBL connected to the same main bit line is kept 0V.

Figure 6A:
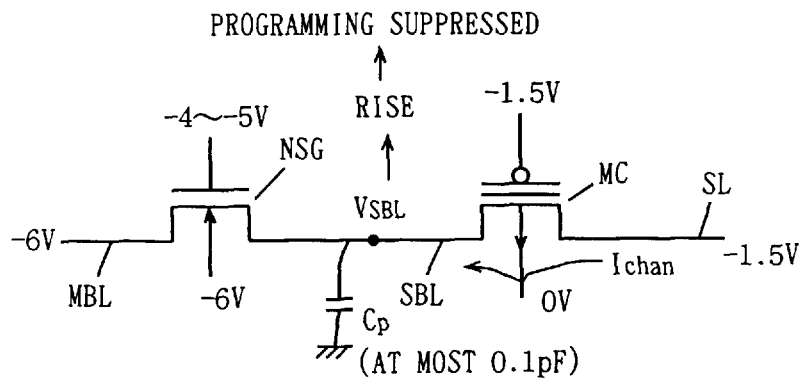
FIGS. 6A and 6B are illustrations showing suppression in programming operation of the non-volatile semiconductor memory device in accordance with the first embodiment of the present invention.
Figure 6B:
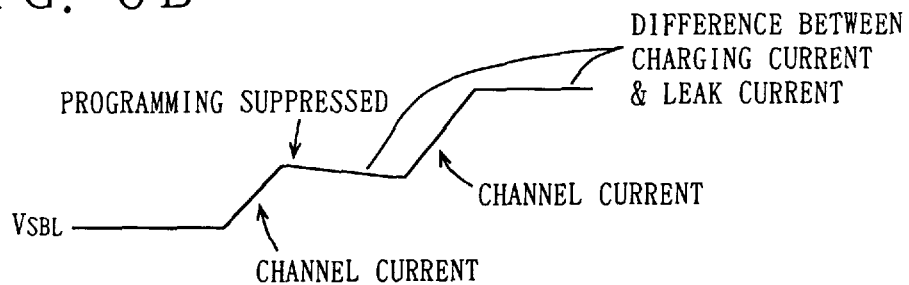
Figure 18A:
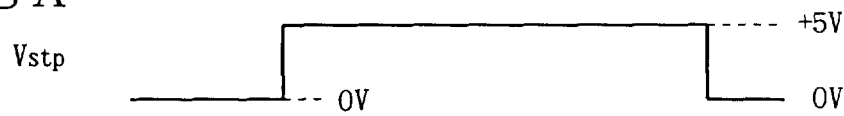
FIGS. 18A to 18D show waveforms of applied voltages at the time of programming in accordance with the second embodiment of the present invention.
Figure 18B:
Figure 18C:
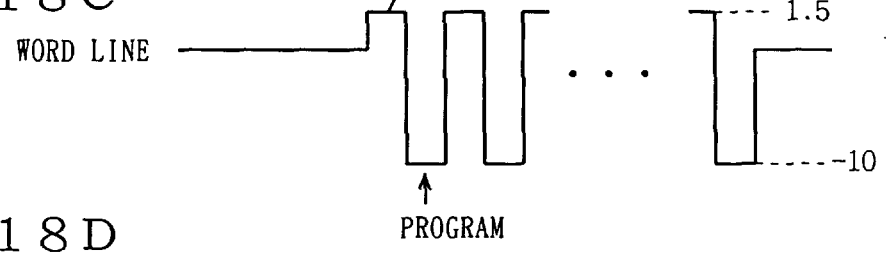
Figure 18D:

FIG. 6A shows voltages applied to the selected memory cell at the time of verifying operation. In the verifying operation, a verifying voltage of about −1.5V is applied to the selected word line. Other voltage conditions are the same. When programming of the memory cell MC proceeds and the threshold voltage Vth attains to a certain value, a channel current Ichan of a magnitude of about several μA flows to the memory cell MC, because of the verifying voltage. The channel current Ichan flows from the source line SL to the selection gate transistor NSG. By the adjustment of gate potential, the selection gate transistor NSG has driving current amount of about 1 μA, which is smaller than the value of channel current Ichan. Therefore, because of this channel current Ichan, the voltage VSBL on the subbit line SBL increases as shown in FIG. 6B. When the voltage VSBL is increased to −5V, the speed of programming to the memory cell MC is reduced by a factor of four, hindering further programming operation. Accordingly, when the threshold voltage Vth of the selected memory cell to be programmed during programming operation attains to a certain value, programming can be automatically stopped by the verifying voltage, and hence "self limit programming" in which the threshold voltage Vth after programming can be limited to the set value is realized.

To the main bit line MBL, only one subbit line SBL is connected. By the subbit line SBL, one memory cell MC is selected. Therefore, by applying the verifying voltage, increase in the voltage VSBL of the subbit line SBL occurs at every subbit line. Therefore, bit by bit verifying is possible. At this time, parasitic capacitance Cp of the subbit line SBL is about 0.1 pF which is sufficiently smaller than the parasitic capacitance (about 1 pF) of the main bit line. Therefore, the time for charging the parasitic capacitance Cp is short, and hence verifying can be done at a speed higher by more than ten times than the time for charging/discharging the main bit line required when verifying operation is done by a verifying circuit connected to an end portion of the main bit line. Even when the external power supply is set to a low voltage of 3.3V or lower and further narrowing of the width of distribution of the threshold voltages after programming becomes necessary and the number of times of verifying is increased (by making shorter the width of one program pulse and to suppress fluctuation of the threshold voltage), the very high speed write data transfer rate of the PMOS type DINOR flash memory can be maintained.

FIG. 7 shows waveforms of applied voltages during programming operation. The programming operation will be described with reference to FIG. 7 in the following.

At time t0, the source line SL is set to a prescribed voltage level of −1.5V, gate bias effect to the memory cell MC is applied and magnitude of the channel current is adjusted.

At time t1, a negative voltage of −6V, for example, is applied to the main bit line MBL and to the backgate of the selection gate transistor. Main bit lines MBL to which programming is not performed and the backgates of nonselected selection gate transistors NSG are set to the ground voltage 0V and to −6V, respectively. At this time, the gate voltage Vstg of the selection gate transistor NSG is 0V. Therefore, in accordance with the negative voltage −6V applied to the main bit line MBL, the subbit line SBL is charged to the prescribed program voltage (−6V) level at high speed. At this time, the gate voltage Vstg of the selection gate transistor NSG provided for the nonselected subbit lines is −6V, and non-selected subbit lines are not charged.

When charging of the subbit line SBL is completed, at time t2, the gate voltage Vstg of the selection gate transistor NSG provided for the selected subbit line SBL is lowered to the voltage level of −5V, for example. Consequently, current drivability of the selection gate transistor NSG provided for the selected subbit line SBL is limited to 1 μA, for example.

In this state, at time t3, a positive voltage pulse (for example 10V) for programming and a negative voltage pulse (for example −1.5V) for verifying are alternately applied to the selected word line. Here, the pulse width of the positive voltage for programming is 0.2 μsec, and the pulse width of the negative voltage for verifying is 0.1 μsec, for example. When the width of the positive voltage pulse for programming is changed, the amount of electrons injected to the floating gate electrode changes, and therefore the amount of change in the threshold voltage can be adjusted, which means that the number of times of verifying can be changed. In accordance with the width of distribution of the threshold voltages after programming as required, the value of the pulse width of the positive voltage for programming is set.

From time t3, alternate application of the positive voltage pulse for programming and negative voltage pulse for verifying is performed for a prescribed time period. In accordance with the characteristics of the memory cell transistor, there are memory cells for which programming takes shorter time and memory cells for which programming takes much time. Namely, the speed of programming differ. Therefore, the period of alternate application of the pulses is set appropriately, taking into account a margin for such difference. To the memory cells for which programming is completed, further programming is automatically stopped.

After the lapse of a prescribed time period, at time t4, the potential of the selected word line is driven to the level of the ground voltage. Thus, programming operation is completed. At time points t5, t6 and t7, the selection voltage Vstg, the main bit line MBL and the backgate of the selection gate transistor NSG, as well as the source line SL return to the level of the ground voltage of the initial state, respectively.

Figure 8:
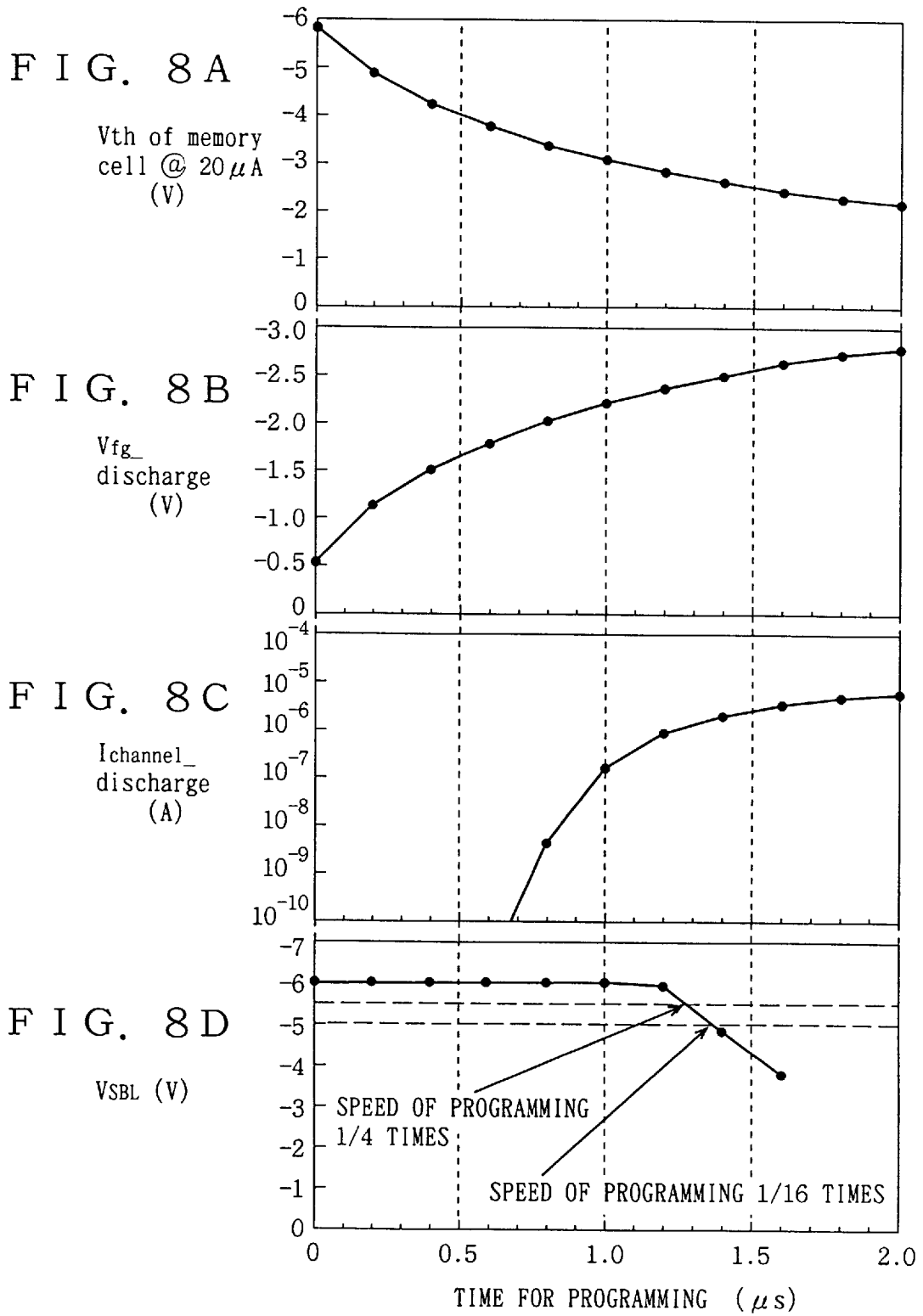
FIGS. 8A to 8D show relation between time for programming and the threshold voltage, floating gate voltage, channel current and subbit line voltage in accordance with the first embodiment of the present invention calculated by simulation, respectively.

FIGS. 8A to 8D show results of simulation analysis of various characteristic values at the time of programming. FIG. 8A shows programming characteristic of the memory cell, in which the abscissa represents time for programming (unit:μs) and the ordinate represents the threshold voltage Vth defined as a voltage supplying 20 μA. FIG. 8B shows time dependent change of the floating gate voltage Vfg when programming to the memory cell proceeds and the threshold voltage Vth changes as shown in FIG. 8A. FIG. 8C shows a channel current Ichannel flowing through the memory cell when the floating gate voltage Vfg shown in FIG. 8B is applied.

FIG. 8D shows change in the potential VSBL of the subbit line from the initial value of −6V, caused when the channel current Ichannel shown in FIG. 8C flows to the corresponding subbit line. In FIG. 8D, calculation is performed assuming that the value of parasitic capacitance Cp of the subbit line is 0.1 pF. In FIGS. 8A to 8D, the abscissa represents time for programming, and time axis is common to all these figures.

The condition of voltage application used for this simulation is the same as that shown in FIG. 7.

Referring to FIG. 8A, as time for programming passes, the amount of electrons injected to the floating gate increases, and the absolute value of the threshold voltage Vth becomes smaller. As electrons are accumulated in the floating gate electrode, the floating gate potential Vfg becomes more negative. When the floating gate potential Vfg attains to a certain level or lower, a channel region of holes is formed in the memory cell transistor, and a channel current Ichannel starts to flow. When the channel current exceeds 1 μA, the voltage VSBL on the subbit line increases (absolute value thereof becomes smaller), and when the threshold voltage Vth attains to a prescribed value or higher, the potential VSBL on the subbit line increases in accordance with the channel current Ichannel of about 10 μA. By the increase of only 0.5V of the potential VSBL of the subbit line from −6V to −5.5V, the speed of programming of the memory cell is lowered by a factor of about 4, and if it increases to −5V, the speed of programming would be ¹⁄₁₆ times that at the initial state. Therefore, it is expected that programming is quickly self-limited in accordance with the potential VSBL on the subbit line.

Figure 9:
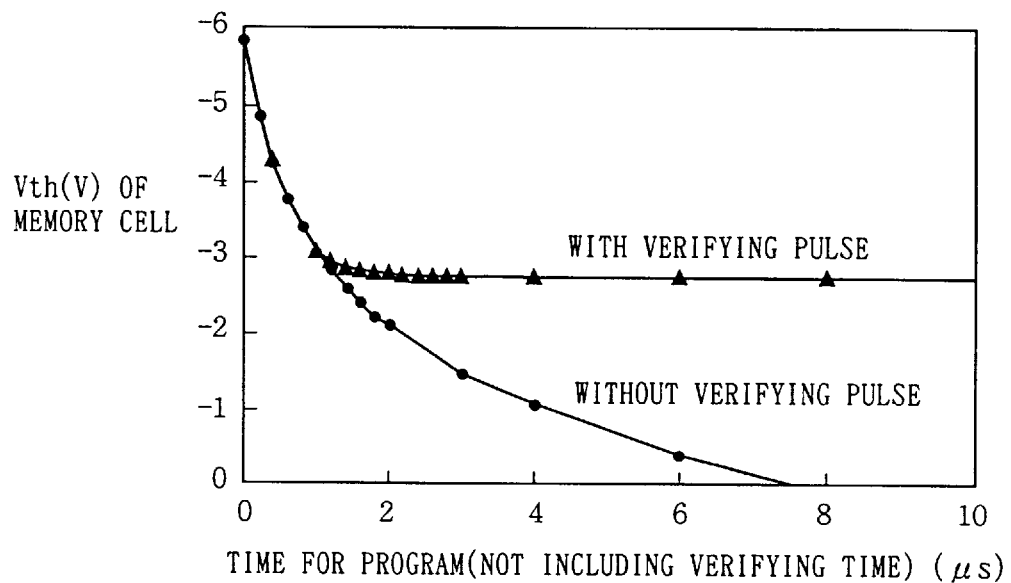
FIG. 9 shows dependency of the threshold voltage of the memory cell on time for programming obtained by experiments, in accordance with the first embodiment of the present invention.

FIG. 9 shows time dependency of the threshold voltage Vth of the memory cell in programming operation performed under the programming condition shown in FIG. 7, obtained by experiment. Referring to FIG. 9, the abscissa represents time for programming (not including verifying time; unit:μsec), and the ordinate represents the threshold voltage Vth (unit:V) of the memory cell. As is clearly shown in FIG. 9, when a high voltage for programming is applied to the selected word line continuously without applying a verifying pulse, the threshold voltage Vth of the memory cell increases as time passes, resulting in a so called over programming phenomenon. Meanwhile, when a verifying pulse is applied, the threshold voltage Vth of the memory cell changes to a certain value (for example, −2.8V) and thereafter it does not change further but is kept approximately constant. From this, it can precisely understood that by alternately applying the verifying pulse and the program pulse in accordance with the method of the first embodiment, "self limit programming" is performed and the threshold voltage Vth is maintained approximately at a constant value. Therefore, the width of distribution of the threshold voltages Vth after programming of the memory cells can be made very narrow.

Figure 10:
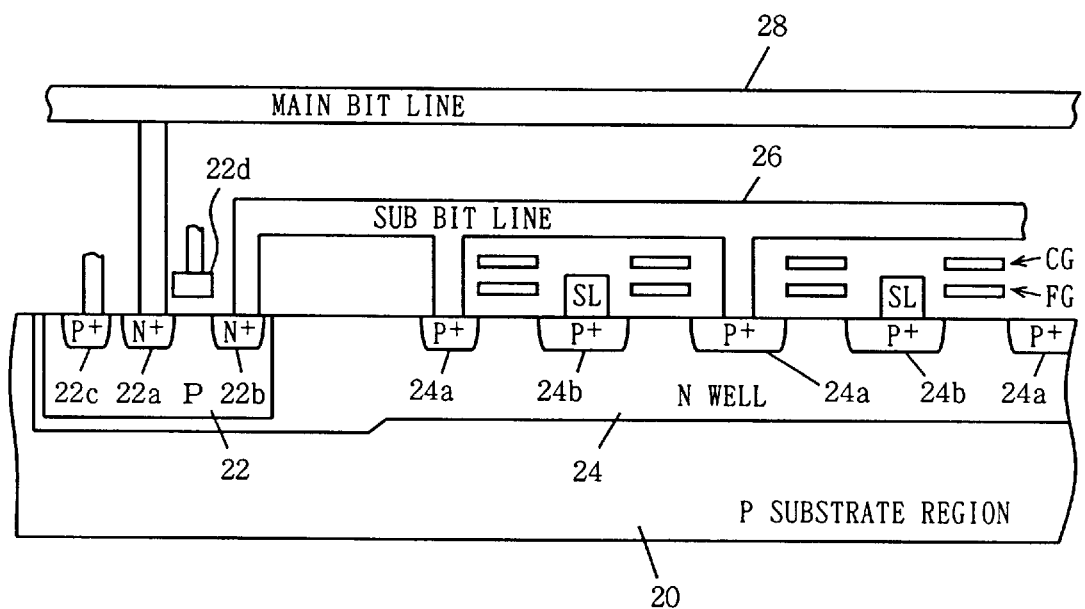
FIG. 10 schematically shows a cross sectional structure of a portion related to one subbit line of the non-volatile semiconductor memory device in accordance with the first embodiment of the present invention.

FIG. 10 schematically shows a cross sectional structure of a portion related to one subbit line of the PMOS type DINOR flash memory. Referring to FIG. 10, on a P type semiconductor substrate region 20 having low impurity concentration, an n type well 24 having relatively low concentration is formed, and a P type well 22 having higher concentration than substrate region 20 is formed in the N type well 24 having low concentration. In the P type well 22, a selection gate transistor consisting of an n channel MOS transistor is formed, and in the N well, a PMOS flash memory cell is formed.

At the surface of P type well 22 formed adjacent to the memory cell forming region, N type (N⁺) impurity regions 22a and 22b of high concentration are formed spaced from each other. Adjacent to the N type impurity region 22a of high concentration, a P type (P⁺) impurity region 22c having high concentration is formed. On a channel region between impurity regions 22a and 22b, a gate electrode layer 22d is formed with a gate insulating film, not shown, interposed. Impurity region 22a is connected to the main bit line 28, and impurity region 22b is connected to a subbit line 26. Impurity region 22c is connected to receive a well potential from a circuit not shown.

Therefore, the selection gate transistor operates using impurity region 22a as a source region, impurity region 22b as a drain region, gate electrode layer 22d as a control electrode and impurity region 22c (P type well 22) as a backgate.

At the surface of N well 24, high concentration P type (P⁺ type) impurity regions 24a and 24b are arranged alternately, spaced from each other. On a channel region between impurity regions 24a and 24b, a floating gate electrode FG and a control gate electrode CG are formed. Impurity regions 24a are commonly connected to subbit line 26, and impurity regions 24b are connected to the source line (SL). In FIG. 10, a portion for applying a substrate potential to N well 24 is not shown.

The selection gate transistor and memory cell transistors have different channel conductivity types, and therefore these are formed in separate wells. Therefore, bias voltages can be applied independently to the P type well 22 which is the substrate region for the selection gate transistor and to the N well 20 which is the substrate region for the memory cell transistors.

Especially, the P type well 22 is provided commonly to the selection gate transistor and separate from the P well for forming n channel MOS transistors of the peripheral circuitry.

Figure 11:
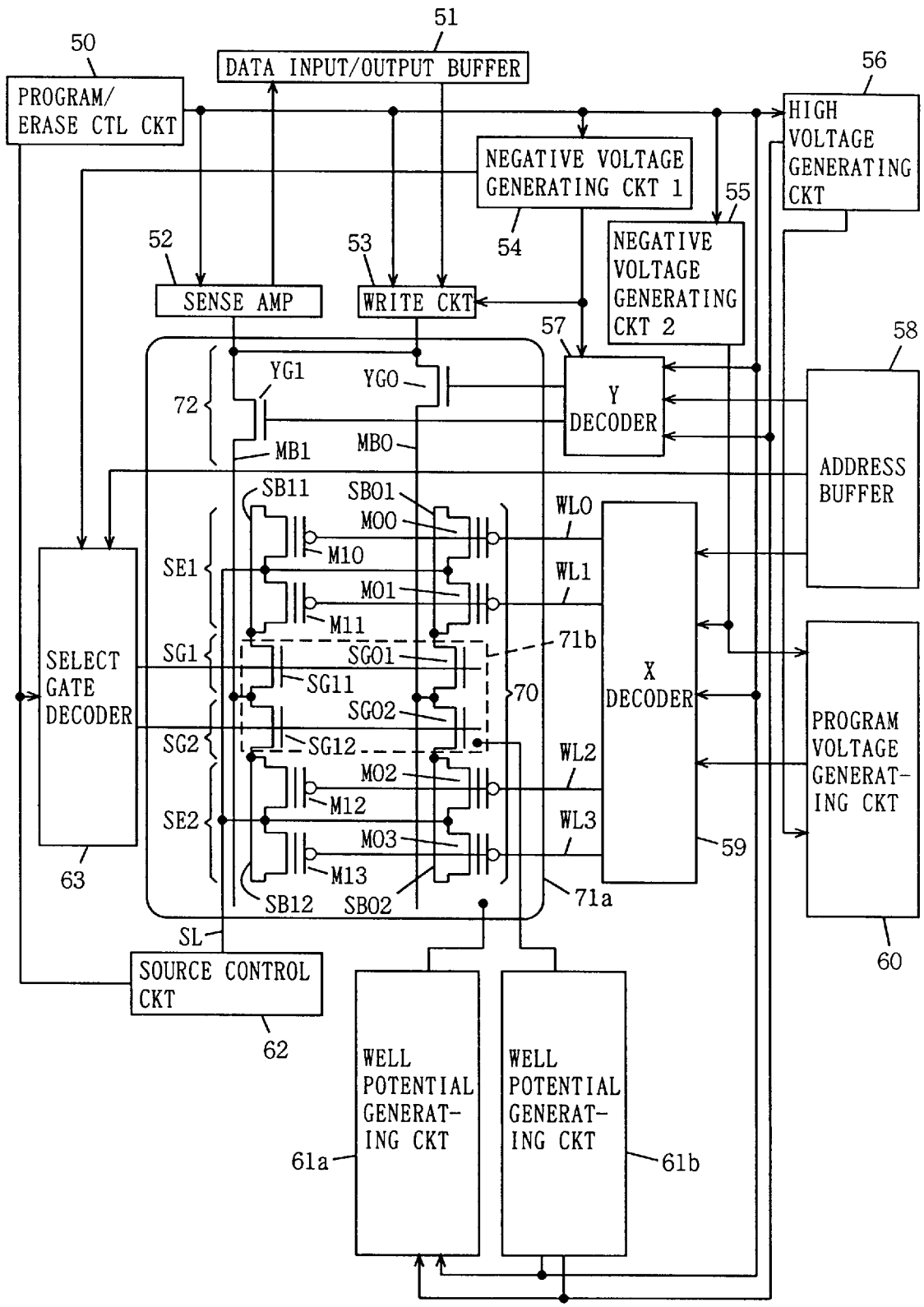
FIG. 11 schematically shows an overall structure of a non-volatile semiconductor memory device in accordance with the first embodiment of the present invention.

FIG. 11 is a block diagram showing an overall structure of the non-volatile semiconductor memory device in accordance with the first embodiment of the present invention. Referring to FIG. 11, the non-volatile semiconductor memory device includes a memory matrix 70 in which memory cells are arranged in rows and columns. The memory matrix 70 is divided into a plurality of sectors SE. In FIG. 11, two sectors SE1 and SE2 are shown as representatives. Corresponding to sectors SE1 and SE2, selection gates SG1 and SG2 for selecting the sectors are provided respectively. Memory cells of sectors SE1 and SE2 are formed in an N well 71*a*. Selection gates SG1 and SG2 are formed in a P well 71*b* formed in the N well 71*a*.

In memory matrix 70, corresponding to columns of memory cells, main bit lines are arranged commonly to the sectors SE1 and SE2. In FIG. 11, two main bit lines MB0 and MB1 are shown as representatives. The main bit lines MB0 and MB1 are connected to a sense amplifier 52 and a write circuit 53 through Y gate transistors YG0 and YG1 included in Y gate 72. Sense amplifier 52 is activated and amplifies data of the selected memory cell at the time of data reading. Write circuit 53 transmits a write voltage to the main bit line in accordance with write data at the time of writing. Though not shown in FIG. 11, a structure may be used in which a column latch is provided for each of the main bit lines which latches write data from the write circuit and a bias voltage for programming is transmitted to the main bit line in accordance with the latched write data.

Corresponding to the main bit line MB0, two subbit lines SB01 and SB02 are provided, and corresponding to the main bit line MB1, two subbit lines SB11 and SB12 are provided. Subbit lines SB01 and SB11 connect memory cells included in sector SE1, and subbit lines SB02 and SB12 connect memory cells included in sector SE2. Subbit lines SB01 and SB02 are connected to main bit line MB0 through selection gate transistors SG01 and SG02, respectively, and subbit lines SB11 and SB12 are connected to the main bit line MB1 through selection gate transistors SG11 and SG12, respectively.

Crossing main bit lines MB0 and MB1, word lines WL0, WL1, . . . , WL2 and WL3 are arranged corresponding to respective rows of memory cells. Generally, in each of the sectors SE1 and SE2, 64 word lines are arranged. In FIG. 11, for the simplicity of drawing, only two word lines are representatively shown in each of the sectors SE1 and SE2. At crossings between word lines WL0 to WL3 and subbit lines SB01, SB02, SB11 and SB12, memory cells are arranged correspondingly. Word line WL0 is connected to the control gates of memory cells M00 and M10, and word line WL1 is connected to the control gates of memory cells M01 and M11. Word line WL2 is connected to the control gates of memory cells M02 and M12, and word line WL3 is connected to the control gates of memory cells M03 and M13. Memory cells M00 and M01 are connected to subbit line SB01, and memory cells M10 and M11 are connected to subbit line SB11. Memory cells M02 and M03 are connected to subbit line SB02 and memory cells M12 and M13 are connected to subbit line SB12.

The source regions of these memory cells are commonly connected to the source line SL.

The non-volatile semiconductor memory device further includes an address buffer 58 receiving an externally applied address signal for applying an X address signal for selecting a word line and an Y address signal for designating a main bit line to a X decoder 59 and a Y decoder 57, respectively. X decoder 59 decodes the applied X address signal and drives anyone of the plurality of word lines WL0 to WL3 to the selected state. Y decoder 57 decodes the applied Y address signal, generates a column selection signal for selecting the addressed main bit line and applies it to Y gate 72. In accordance with the column selection signal from Y decoder 57, Y gate transistors YG0 and YG1 in Y gate 72 connect the addressed main bit line MB0 or MB1 to sense amplifier 52 and write circuit 53. At the time of reading, sense amplifier 52 is activated, senses data transmitted from the selected main bit line MB0 or MB1, and externally output the detected data through data input/output buffer 51.

A structure may be used in which in writing operation, an externally applied write data is applied to write circuit 53 through data input/output buffer 51, and write circuit 53 applies a program voltage to main bit line MB0 or MB1 in accordance with the write data.

The non-volatile semiconductor memory device further includes negative voltage generating circuits 54 and 55 each generating a negative voltage of a prescribed voltage level upon reception of an external power supply voltage Vcc, a high voltage generating circuit 56 for generating a high voltage required at the time of programming/erasure in accordance with an external power supply voltage Vcc; and a program voltage generating circuit 60 for generating a program voltage and a verifying voltage at the time of programming in accordance with voltages from high voltage generating circuit 56 and negative voltage generating circuit 55.

The non-volatile semiconductor memory device further includes a program/erase control circuit 50 formed of a sequence controller controlling operations of various circuits in accordance with an externally applied control signal, and well potential generating circuits 61*a* and 61*b* for supplying potentials to N well 71*a* and P well 71*b*, respectively, under the control by program/erase control circuit 50. Well potential generating circuit 61*a* applies a positive voltage to N well region 71*a* at the time of erasure and supplies the ground potential at the time of programming and reading. Well potential generating circuit 61*b* supplies a potential at the level of the ground potential at the time of erasure and reading, and supplies a negative voltage of approximately the same magnitude as the program bias voltage at the time of programming, to P well 71*b*.

The non-volatile semiconductor memory device further includes a source control circuit 62 for controlling potentials of the source line SL, and a select gate decoder 63 for controlling selection of sector selectors SG1 and SG2 as selection gate transistors. Source control circuit 62 applies a high voltage to source line SL at the time of erasure, maintains the source line SL at the level of the ground potential at the time of reading, and supplies a negative voltage of −1.5V, for example at the time of programming, under the control of program/erase control circuit 50. Select gate decoder 63 decodes a sector designation address signal from address buffer 58, and supplies a negative voltage applied from the negative voltage generating circuit 54 to sector selector SG1 or SG2 provided corresponding to the selected sector. The select gate decoder 63 supplies a negative voltage of −6V, for example, to the selected gate transistor SG provided for the non-selected sector in programming operation, and supplies a negative voltage of −5V, for example, to the selection gate transistor SG provided for the selected sector, under the control of program/erase control circuit 50. By controlling the voltage level of the output signal of select gate decoder 63, the current supplied to the selected subbit line at the time of programming is limited, realizing "self limit programming". The sector erasure operation, programming operation and reading operation of the non-volatile semiconductor memory device shown in FIG. 11 will be briefly described in the following.

(i) Sector erasure operation

Now, assume that sector SE1 is erased collectively. First, a control signal designating a sector collective erasure operation is applied to program/erase control circuit 50. Consequently, negative voltage generating circuit 55 and high voltage generating circuit 56 are activated.

Negative voltage generating circuit 55 applies a negative voltage (−5V~12V) to X decoder 59. X decoder 59 applies the received negative voltage to word lines WL0 and WL1 of sector SE1, and applies the ground voltage (0V) indicative of the non-selected state to word lines WL2 and WL3 of sector SE2. High voltage generating circuit 56 generates a high voltage of 5 to 12V and applies it to well potential generating circuit 61a under the control of program/erase control circuit 50. Well potential generating circuit 61a applies this high voltage to N well region 71a. Well potential generating circuit 61b applies the ground voltage to P well region 71b.

Y decoder 57 generates a selection signal at the level of the ground voltage of the non-selected state and applies it to Y gate 72. Consequently, Y gate transistors YG0 and YG1 are turned off, and main bit lines MB0 and MB1 are set to the floating state. Source control circuit 62 applies a positive high voltage of 5 to 12V to source line SL. Sector select gates SG1 and SG2 are kept off under the control of select gate decoder 63. In this state, a negative voltage is applied to the word line only in the selected sector, and the word line potential in the non-selected sector is maintained at the level of the ground voltage. Therefore, in the selected sector, a channel is formed in the memory cell transistor, and in accordance with the difference in voltage on the word line and the channel region, FN tunneling phenomenon occurs, so that electrons are extracted from the floating gate electrode to substrate region 71a, and all the memory cells in selected sector SE1 are erased simultaneously.

(ii) Programming operation

Assume that a memory cell M00 is to be programmed. Namely, it is assumed that electrons are injected to the floating gate of memory cell M00. A state in which the absolute value of the threshold voltage is small corresponds to the state of data "0", and an initial state in which the absolute value of the threshold voltage is large corresponds to the state storing data "1".

First, a control signal designating programming operation is applied to write/erase control circuit 50, and negative voltage generating circuits 54 and 56 are activated.

High voltage generating circuit 56 is activated and generates a high voltage, and applies the high voltage to program voltage generating circuit 60. The program voltage generating circuit 60 also receives a negative voltage from negative voltage generating circuit 55.

Negative voltage generating circuit 54 applies a negative voltage to Y decoder 57, write circuit 53 and select gate decoder 63. Data "0" is externally applied through data input/output buffer 51 to write circuit 53 and latched therein. Y decoder 57 applies 0V to Y gate transistor YG0 in Y gate 72 in accordance with the Y address signal applied from address buffer 58, applies a negative voltage to Y gate transistor YG1, whereby Y gate transistor YG0 is turned on and Y gate transistor YG1 is turned off.

Write circuit 53 applies a program voltage corresponding to data "0" to main bit line MB0 through Y gate transistor YG0. Consequently, subbit lines SB01 and SB02 are charged at high speed to the level of the program voltage, through main bit line MB0.

After the completion of charging operation of the subbit lines SB01 and SB02, select gate decoder 63 applies a negative voltage to sector select gate SG1 provided for sector SE1, lowering current drivability of selected gate transistors SG01 and SG11.

Prior to the programming operation, source control circuit 62 applies a negative potential (of about −1.5V) to source line SL. Well potential generating circuit 61b generates and applies to the P well region 71b, a negative voltage of approximately the same magnitude, in synchronization with the negative voltage generating operation from select gate decoder 63. Program voltage generating circuit 60 generates a negative voltage for verifying and a high voltage for programming alternately and applies these to X decoder 59, in accordance with the high voltage from high voltage generating circuit 56 and negative voltage from negative voltage generating circuit 55. X decoder 59 applies the signal provided from program voltage generating circuit 60 to selected word line WL0. Consequently, "self limit programming" of the memory cell M00 arranged corresponding to the crossing between word line WL0 and subbit line SB01 is performed, and the threshold voltage thereof is set to a potential level of approximately constant value. After the lapse of a prescribed time period, programming operation is completed and each circuit returns to the initial state.

In the non-volatile semiconductor memory device 11, a structure may be used in which a column latch circuit is provided for each of the main bit lines MB0 and MB1, write data from the write circuit 53 is latched by the column latch circuit, and a voltage is transmitted to the corresponding main bit line in accordance with the write data latched by the column latch circuit.

In the non-volatile semiconductor memory device shown in FIG. 11, a structure may be employed in which Y gate transistors YG0 and YG1 are formed of p channel MOS transistors and a potential from well potential generating circuit 61a is applied to the substrate region for these transistors. In that case, Y decoder 57 generates a high voltage to turn off the Y gate transistor, and generates a negative voltage to turn on Y gate transistors YG0 and YG1.

(iii) Reading operation

Now, assume that data is to be read from memory cell M00. First, a control signal designating reading operation is applied to program/erase control circuit 50.

Y decoder 59 selects a word line WL0 in accordance with an X address signal applied from address buffer 58, and applies a negative voltage of about 3.3V, for example, to the selected word line WL0. Remaining non-selected word lines WL1 to WL3 are maintained at the level of the ground voltage. The memory cell transistor is a p channel MOS transistor, of which threshold voltage is negative, and the memory cell transistor is kept off when the voltage at the control gate electrode is at the level of the ground voltage.

Y decoder 57 drives the Y gate transistor YG0 to the on state in response to a Y address signal applied from address buffer 58. Source control circuit 62 keeps the source line SL at the level of the ground potential. Similarly, well potential generating circuits 61a and 61b supply voltage at the level of the ground potential to respective well potential regions. In accordance with the data stored in memory cell M00, current flows or not flows through subbit line SB01 and main bit line MB0. At this time, in order to generate a reading current, a prescribed voltage is applied to the selected main bit line. Whether a read current flows through the main bit line MB0 or not is sensed by sense amplifier 52, and data indicative of the result of sensing is externally read through data input/output buffer 51.

[Structure of X decoder]

Figure 12:
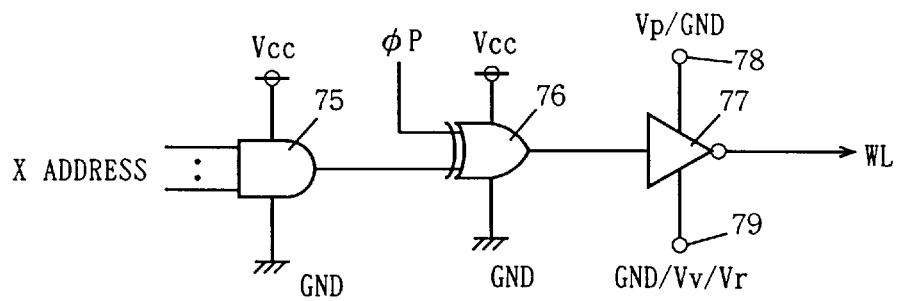
FIG. 12 schematically shows a structure of an X decoder shown in FIG. 11.

FIG. 12 schematically shows an example of the structure of X decoder 59 shown in FIG. 11. FIG. 12 shows a structure of a decode circuit for one word line WL. Referring to FIG. 12, X decoder 59 includes an AND circuit 75 receiving an internal X address signal applied from address buffer 58, a non-coincidence detection (EXOR) circuit 76 receiving an output signal from AND circuit 75 and a program designating signal φp, and an inverter circuit 76 for driving the corresponding word line WL to the selected or non-selected state in accordance with an output signal from non-coincidence detection circuit 76. AND circuit 75 and non-coincidence detection circuit 76 operate using a power supply voltage Vcc and ground voltage GND as both operational power supply voltages, respectively.

Inverter circuit 77 as a word line driving circuit operates using a voltage Vp/GND applied to one power supply node 78 and a voltage GND/Vv/Vr applied to the other power supply node 79 as both operational power supply voltages. The voltage Vp is a high voltage formed at the time of programming. The voltage Vv is a negative voltage formed at the time of verifying, and the voltage Vr is a read voltage of about −3.3V, for example, applied at the time of reading. Inverter circuit 77 also has a level converting function and has a function of converting signal amplitude of Vcc-GND level from non-coincidence detection circuit 76 to a signal amplitude of voltage levels applied to both operational power supply nodes 78 and 79. As for the structure of the level converting function, a known level converting circuit including a latch circuit can be utilized.

Program designating signal φp is set to an active state of H level at the time of programming, and in other operations modes, it is set to a non-active state of L level.

AND circuit 75 outputs a signal at the H level when the applied internal X address signal designates the corresponding word line WL, and it outputs a signal at the L level when the corresponding word line WL is not selected. Non-coincidence detection circuit 76 serves as an inverter when the program designating signal φp is at the H level, and it serve as a buffer circuit when the program designating signal φp is at the L level. Therefore, in program operation, the output signal from non-coincidence detection circuit 76 will be at L level for the selected word line WL and at H level for the non-selected word line. In the verify mode and read mode, the output signal from non-coincidence detection circuit 76 will be at H level for the selected word line and at L level for the non-selected word line. By the non-coincidence detection circuit 76, logic level of the selection signal of the word line is inverted between the program operation mode and other operation modes.

Inverter circuit 77 has a function of level conversion, and it inverts and converts the level of the signal from non-coincidence detection circuit 76 and outputs the result to the corresponding word line WL. When the output signal from non-coincidence detection circuit 76 is at the H level, inverter circuit 77 outputs the voltage applied to its power supply node 79, while it outputs the voltage applied to power supply node 78 when the output signal from non-coincidence detection circuit 76 is at the L level. Consequently, in programming operation, a high voltage Vp is applied to the selected word line and the ground voltage GND is transmitted to the non-selected word line. In the verify mode and in the normal read operation mode, logics are inverted. Therefore, the ground voltage GND is transmitted to the non-selected word line, and the voltage Vv or Vr at the power supply node 79 is transmitted to the selected word line.

By utilizing the circuit shown as an example in FIG. 12, it is possible to alternately transmit the positive high voltage Vp for programming and a negative voltage Vv for verifying having different polarities alternately to the selected word line WL.

Figure 13:
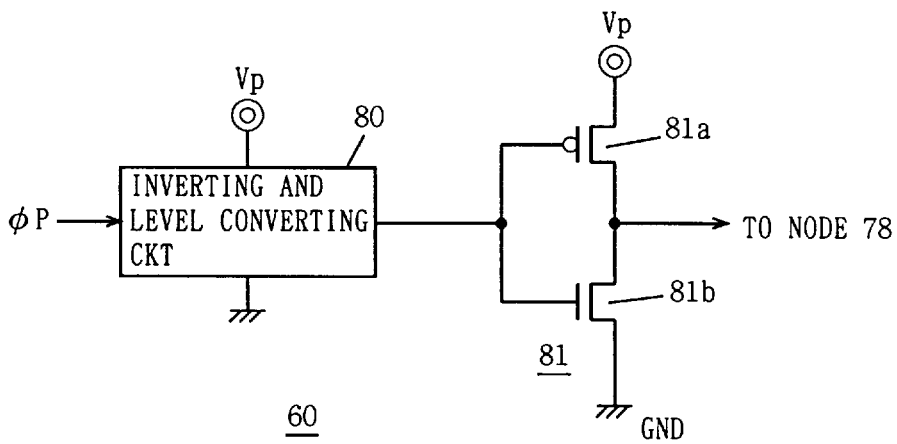
FIG. 13 schematically shows a structure of a program voltage generating circuit shown in FIG. 11.

FIG. 13 shows an example of the structure of program voltage generating circuit 60 shown in FIG. 11. Referring to FIG. 13, program voltage generating circuit 60 includes an inverting and level converting circuit 80 for inverting and converting the level of program designating signal φp, and an inverter circuit 81 for inverting and transmitting to an electrode node 78 an output signal from inverting and level converting circuit 80. Inverter circuit 81 includes a p channel MOS transistor 81a having one conduction node (source) receiving the high voltage Vp, the other conduction node (drain) connected to electrode node 78 and a gate receiving the output signal from inverting and level converting circuit 80; and an n channel MOS transistor 81b having one conduction node (source) receiving the ground voltage GND, the other conduction node (drain) connected to electrode node 78 and a gate receiving the output signal from inverting and level converting circuit 80.

Inverting and level converting circuit 80 converts the program designating signal φp to the voltage level of the high voltage Vp or the ground voltage GND. When the program designating signal φp is at the H level and program operation is designated, the output signal from inverting and level converting circuit 80 attains to L level which is the level of the ground voltage, p channel MOS transistor 81a turns on and n channel MOS transistor 81b turns off. Accordingly, the high voltage φp for programming is transmitted to electrode node 81.

When the program designating signal φp is at the inactive state of L level, the output signal from the inverting and level converting circuit 80 is at the level of the high voltage Vp, so that p channel MOS transistor 81a turns off and n channel MOS transistor 81b turns on. Accordingly, the ground voltage GND is transmitted to electrode node 78.

Figure 14:
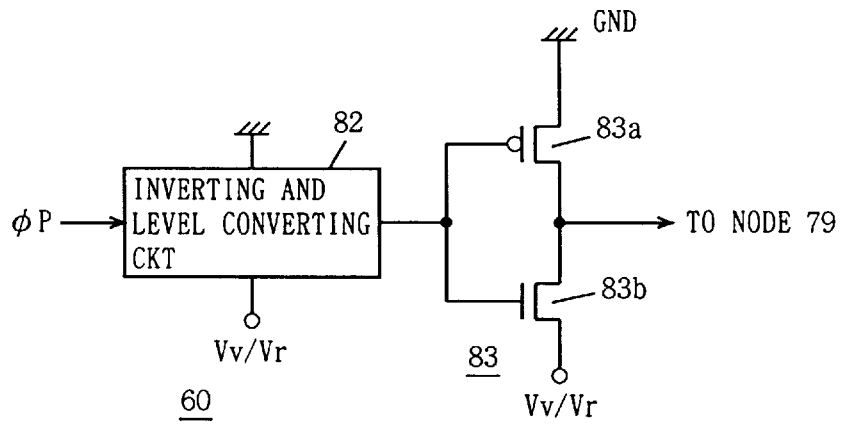
FIG. 14 schematically shows a structure of a program voltage generating circuit shown in FIG. 11.

FIG. 14 shows a structure of a portion for applying a voltage to electrode node 79 of program voltage generating circuit 60 shown in FIG. 11. Referring to FIG. 14, the program voltage generating circuit 60 includes an inverting and level converting circuit 82 receiving the program designating signal φp and converting the level thereof, and an inverter circuit 83 for inverting and transmitting to electrode node 79 an output signal from inverting and level converting circuit 82. Inverting and level converting circuit 82 converts the program designating signal φp to a signal at the voltage level of the ground voltage GND or the negative voltage Vv/Vr. Inverter circuit 83 includes a p channel MOS transistor 83a having one conduction node (source) receiving the ground voltage GND, the other conduction node (drain) coupled to electrode node 79, and a gate receiving an output signal from inverting and level converting circuit 82; and an n channel MOS transistor 83b having one conduction node (source) receiving the negative voltage Vv/Vr, the other conduction node (drain) coupled to electrode node 79 and a gate receiving the output signal from inverting and level converting circuit 82.

When the program designating signal φp is at the active state of H level, the output signal of inverting and level converting circuit 82 is set to the voltage level of the negative voltage Vv/Vr, p channel MOS transistor 83a turns on, n channel MOS transistor 83b turns off, and the ground voltage GND is transmitted to electrode node 79. Meanwhile, if the program designating signal φp is at the inactive state of L level, the output signal from inverting and level converting circuit 82 attains to the level of the ground voltage GND, p channel MOS transistor 83a turns off, n channel MOS transistor 83b turns on and the negative voltage Vv/Vr is transmitted to electrode node 79.

By utilizing the program voltage generating circuit as shown in FIGS. 13 and 14, it becomes possible to change the voltage level of the operational power supply of the word line driver included in the X decoder in accordance with the program designating signal φp, and accordingly, programming and verifying operations can be performed alternately.

The program designating signal φp is output at a prescribed period from program/erase control circuit 50 shown in FIG. 11.

Figure 15:
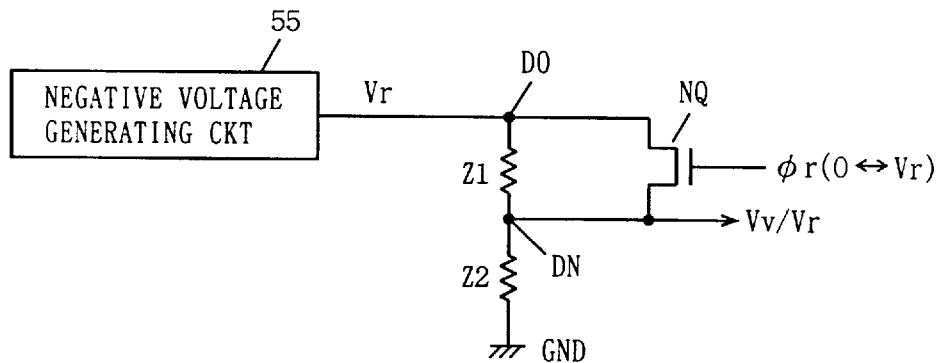
FIG. 15 schematically shows a structure of a read voltage/verifying voltage generating portion in accordance with the first embodiment of the present invention.

FIG. 15 shows a structure of the negative voltage Vv/Vr generating portion. The structure shown in FIG. 15 is included in program voltage generating circuit 60 shown in FIG. 11.

Referring to FIG. 15, the negative voltage generating portion includes resistance elements Z1 and Z2 of high resistance connected in series between a negative voltage Vr output node D0 from negative voltage generating circuit 55 and the ground node receiving the ground voltage GND, and an n channel MOS transistor NQ connected between output node D0 and a node DN and receiving a read designating signal φr at its gate. The read designating signal φr changes between the ground voltage GND (0V) and the negative voltage Vr. The negative voltage Vv/Vr is output from node DN. Resistance elements Z1 and Z2 consist of, for example, resistance-connected MOS transistors, and a current flowing through this path is made sufficiently small. In this manner, current consumption of the negative voltage generating circuit 55 is reduced. In accordance with the resistance ratio of resistance elements Z1 and Z2, a voltage Vv higher than the negative voltage Vr is generated. When the read operation designating signal φr is at the ground voltage level of 0V, MOS transistor NQ is on, short-circuiting nodes D0 and DN, and negative voltage Vr for reading is generated from node DN. Meanwhile, if the read operation designating signal φr is at the level of the negative voltage Vr, MOS transistor NQ is off, and a negative voltage Vv for verifying which is resistance-divided by the resistance elements Z1 and Z2 is output at node DN.

In the structure shown in FIG. 15, a structure may be used in which the output voltage from negative voltage generating circuit 55 is compared with a prescribed reference voltage, the operation of the negative voltage generating circuit 55 is controlled in accordance with the result of comparison and the reference voltage may be switched in accordance with the operation mode.

In FIGS. 13 to 15, the voltage generating portion of the last stage has been described as included in the program voltage generating circuit 60. However, the circuits in the last stage (inverters 81, 83, resistance elements Z1, Z2 and MOS transistor NQ) may be provided in X decoder 59.

As described above, according to the first embodiment of the present invention, in a PMOS type DINOR flash memory, a selection gate transistor consisting of an n channel MOS transistor is used and the selection gate transistor is formed in a substrate region different from the substrate region for the memory cell array and the peripheral circuitry. Therefore, it becomes possible to provide the selection gate transistor with the function of limiting current while maintaining bias voltage transmitting characteristic.

Further, by alternately applying a high voltage for programming and a voltage for verifying to the selected word line, the potential of the selected subbit line increases at the time of verifying because of the current limiting function of the selection gate transistor, and hence program operation is automatically stopped. Accordingly, the width of distribution of the threshold voltages of the selected memory cells can be made narrow, and hence a PMOS type DINOR flash memory which operates stably even under low power supply voltage can be realized.

Further, since programming operation stops automatically, a verifying circuit for verifying operation is unnecessary and a circuit determining the result of verifying is unnecessary. Therefore, circuit structure can be simplified and high speed programming becomes possible as the conventional verifying operation becomes unnecessary.

[Second Embodiment]

Figure 16:
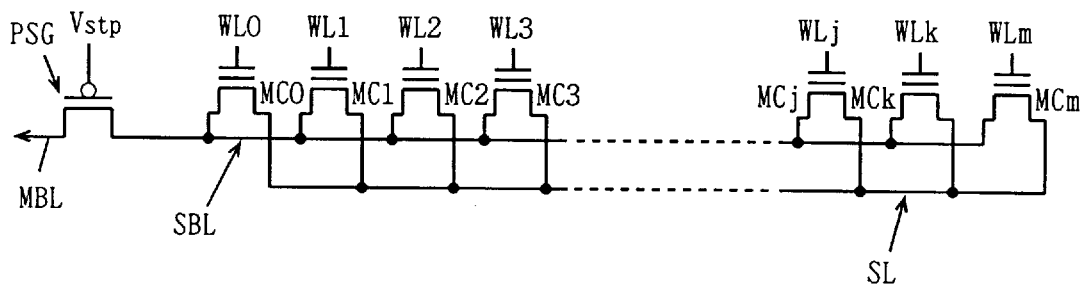
FIG. 16 schematically shows a structure of a main portion of a non-volatile semiconductor memory device in accordance with a second embodiment of the present invention.

FIG. 16 shows a structure of a main portion of the non-volatile semiconductor memory device in accordance with the second embodiment of the present invention. In FIG. 16, a structure of a portion related to one subbit line SBL is shown. Referring to FIG. 16, memory cells MC0 to MCm constituted by n channel stacked gate type transistors are connected to the subbit line SBL. Word lines WL0 to WLm are connected to the respective control gates of these memory cells MC0 to MCm. Subbit line SBL is connected to the main bit line MBL through a selection gate transistor PSG receiving at its gate a selection voltage Vstp. The selection gate transistor PSG consists of a p channel MOS transistor. Therefore, in this structure also, the selection gate transistor PSG has different conductivity type from memory cells MC0 to MCm, and these are formed in separate well regions (or semiconductor substrate regions). Therefore, it is possible to apply bias voltages independent from each other to respective substrate regions. Further, the selection gate transistor PSG is formed in a well region independent from the p channel MOS transistors of the peripheral circuitry.

Figure 47:
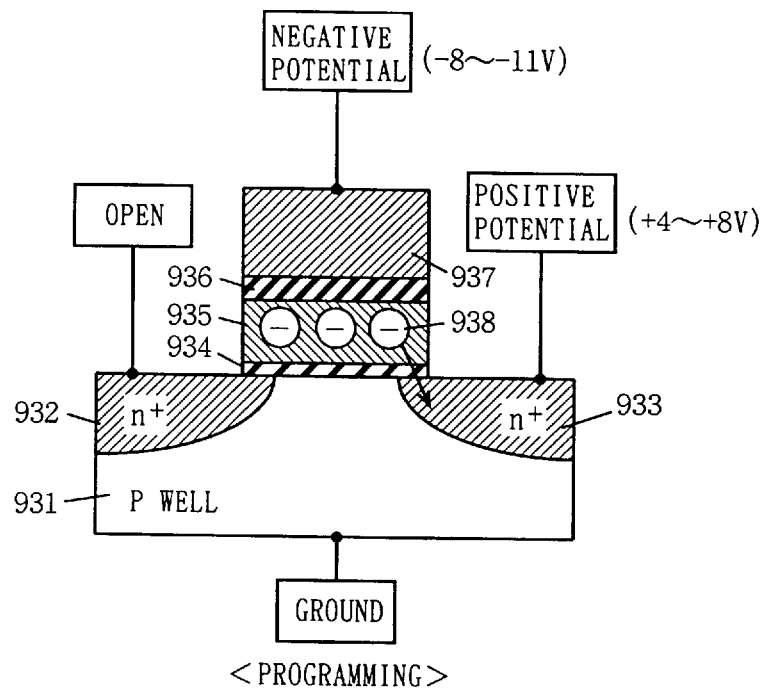
FIG. 47 shows a cross sectional structure and programming operation of a conventional DINOR type flash memory cell.
Figure 48:
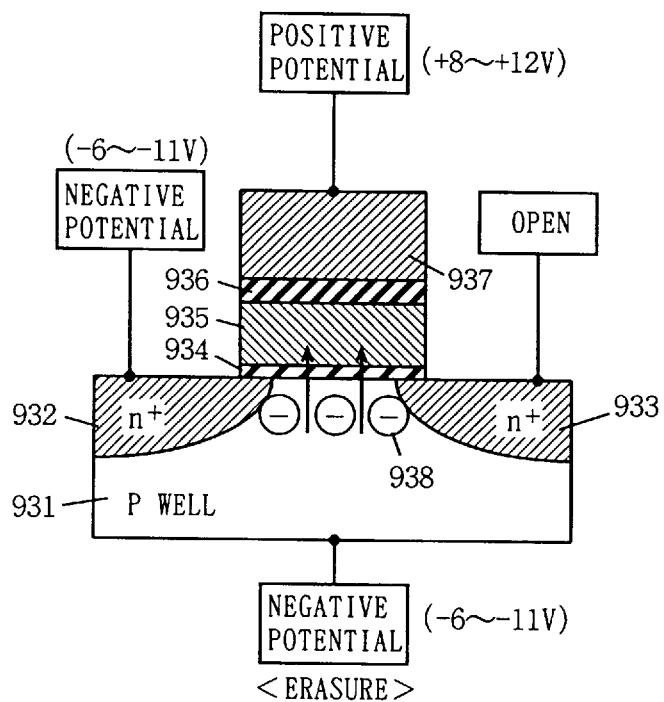
FIG. 48 represents erasure operation of the conventional DINOR type flash memory cell.
Figure 49A:
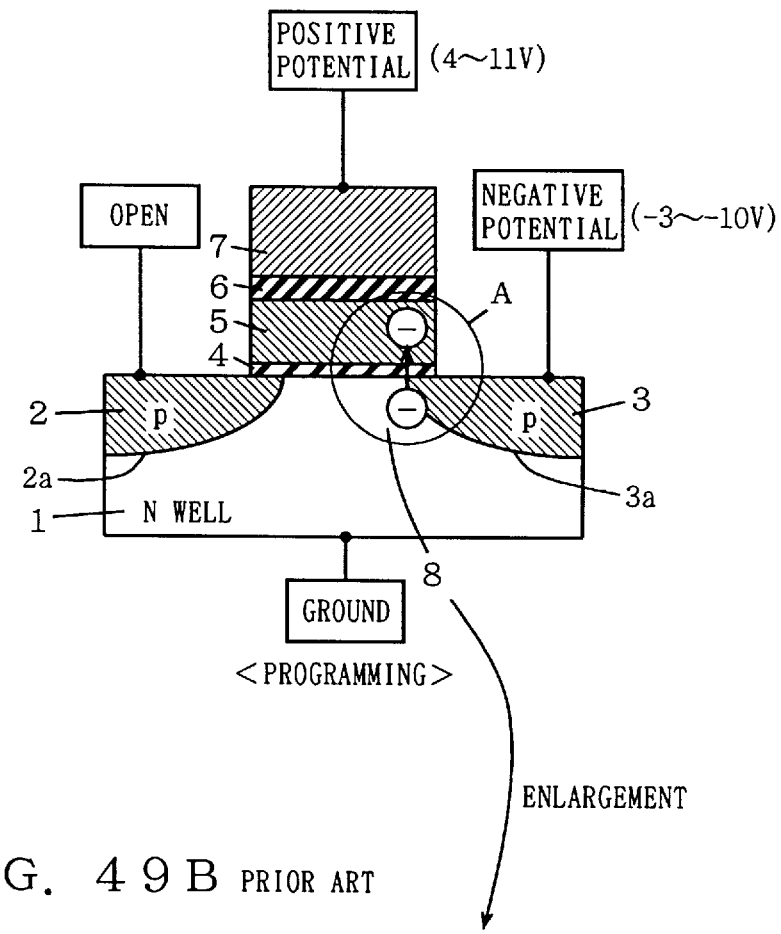
FIGS. 49A and 49B show a cross sectional structure and programming operation of a conventional PMOS type flash memory cell.
Figure 49B:
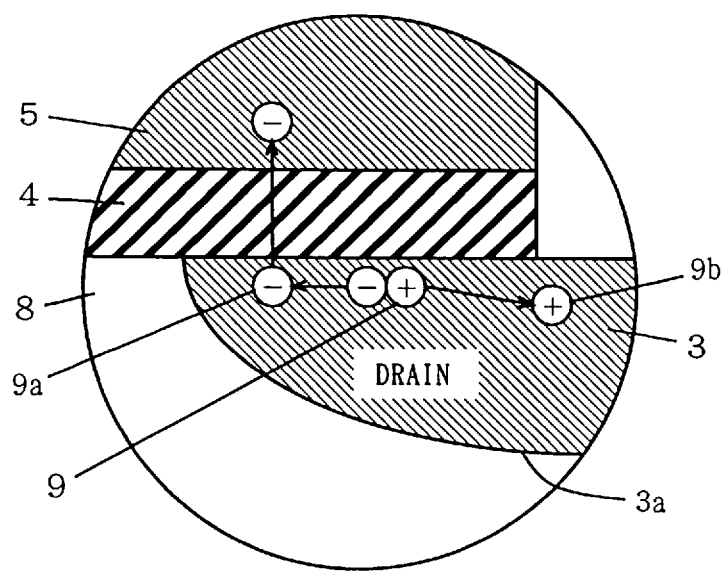
Figure 50:
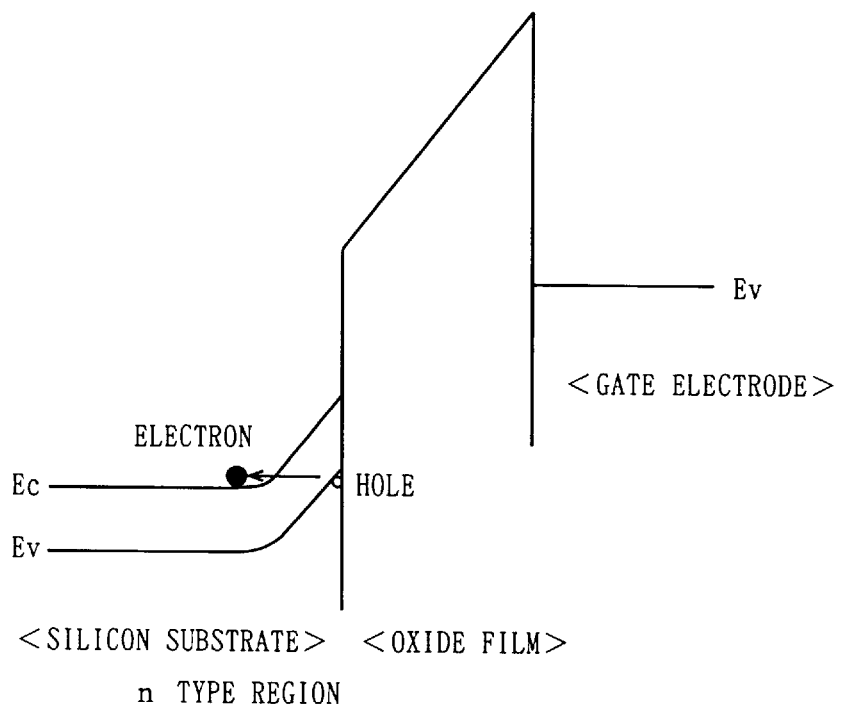
FIG. 50 illustrates a band to band tunneling phenomenon.
Figure 51:
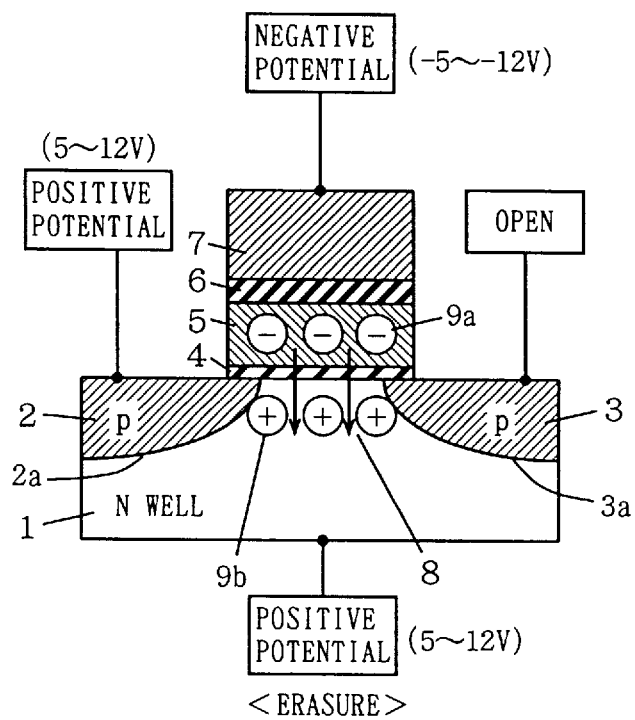
FIG. 51 represents erasing operation of a conventional PMOS type flash memory cell.
Figure 52:
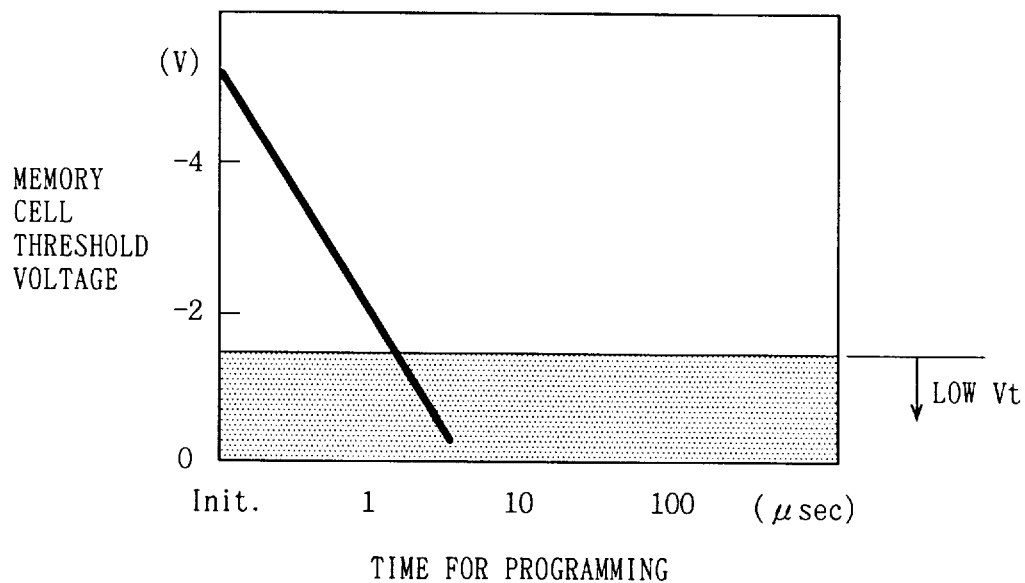
FIG. 52 shows relation between time of programming and threshold voltage of a conventional PMOS type flash memory cell.
Figure 53:
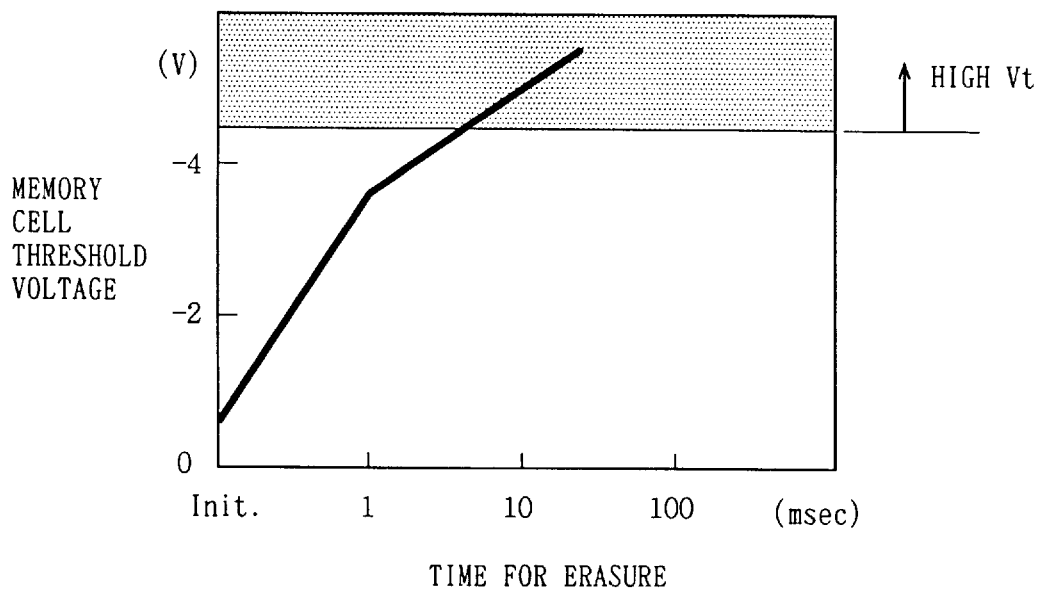
FIG. 53 shows relation between time of erasure and threshold voltage of a conventional PMOS type flash memory cell.
Figure 54:
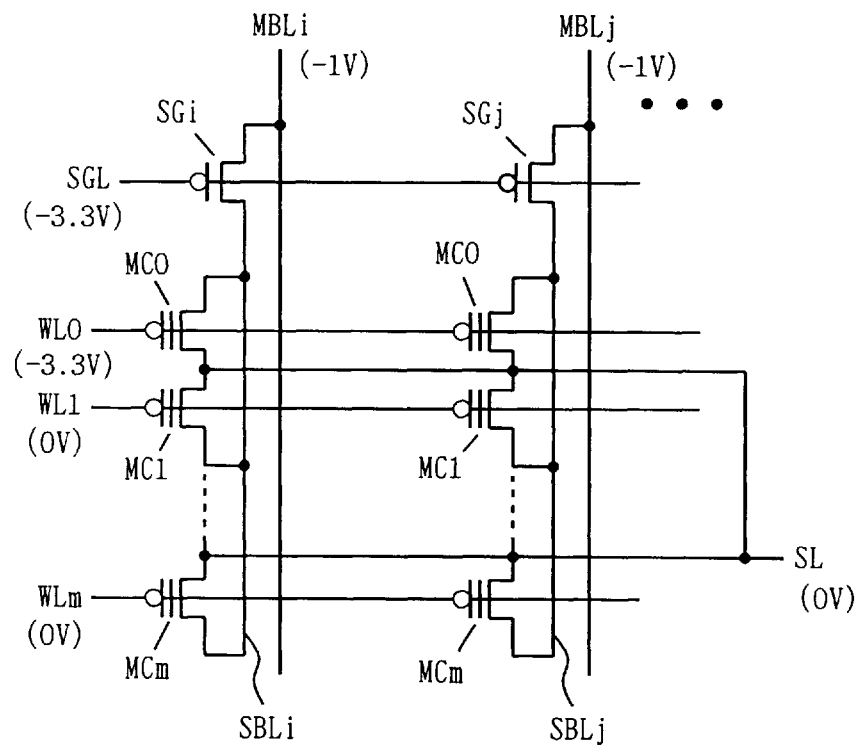
FIG. 54 schematically shows a structure of a main portion of a conventional DINOR type flash memory cell.
Figure 55:
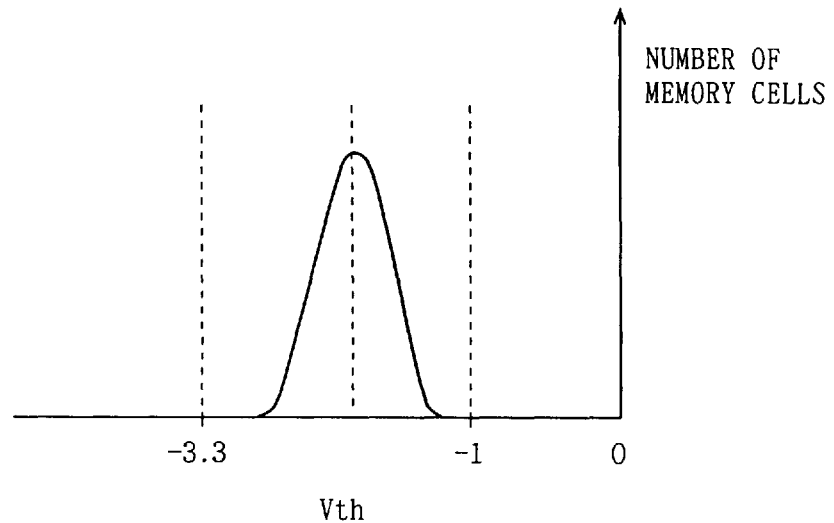
FIG. 55 shows an example of distribution of the threshold voltages after programming of the flash memory cell.

In such a case in that the memory cells are formed by n channel stacked gate transistors also, in programming operation, electrons are extracted from the floating gate and the threshold voltage becomes smaller, as described with reference to FIG. 47 previously, (in case of an n channel stacked gate transistor, the threshold voltage is positive, and the absolute value becomes smaller).

In this programming operation, a current flows from the main bit line MBL to the subbit line SBL through selection gate transistor PSG. Therefore, in the selection gate transistor PSG, the node connected to the main bit line MBL serves as the source at the time of programming. Therefore, when the voltage VSBL of the subbit line in the current characteristic of the selection transistor shown in FIG. 5 is represented in positive value, the same operation curve is obtained.

Therefore, as shown in FIG. 16, even when the memory cells are formed by n channel stacked gate transistors, similar effects as the first embodiment can be obtained when the selection gate transistor between the main bit line MBL and the subbit line SB1 is formed by a p channel MOS transistor.

Figure 17:
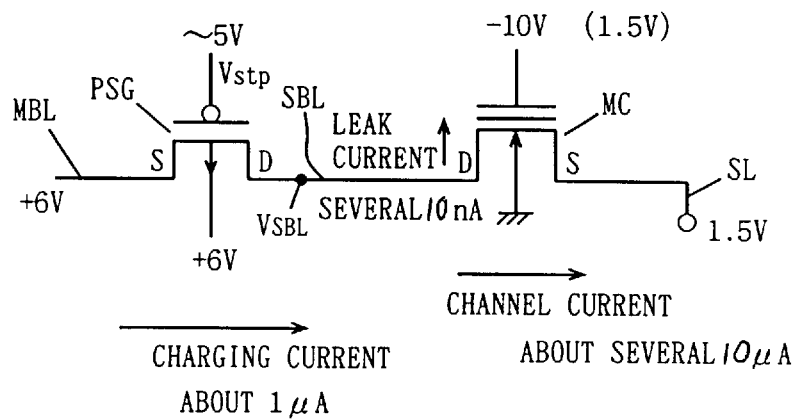
FIG. 17 shows arrangement of voltages at programming operation of the non-volatile semiconductor memory device shown in FIG. 16.

FIG. 17 shows a manner of application of voltages to the selection gate transistor and to the memory cells at the time of programming. Referring to FIG. 17, at the time of programming, a positive voltage Vstp of +5V, for example, is applied to the gate of selection gate transistor PSG, and a program voltage of +6V, for example, is applied to the main bit line MBL. A negative voltage of −10V, for example, is applied to the control gate of memory cell MC, and a positive voltage of +1.5V, for example, is applied to the source line SL. In this state of voltage application, in memory cell MC, electrons are extracted from the floating gate electrode to the drain electrode because of FN tunneling phenomenon. Accordingly, leak current of about several 10 nA flows from the subbit line SBL to the memory cell MC. At this time, the potential of the control electrode of selection gate transistor PSG is about 5V which is close to the voltage +6V of the main bit line MBL, current supplying capability thereof is limited, and it supplies a charging current of about 1 $\mu$A.

Thereafter, a positive verifying voltage pulse of about 1.5V is applied to the control gate of the memory cell MC. In a memory cell of which threshold voltage is not higher than a prescribed value, a channel current of about several 10 $\mu$A, for example, flows to the source line SL. The channel current is larger than the charging current supplied from selection gate transistor PSG, and the voltage VSBL on the subbit line lowers. Therefore, even when a negative voltage for programming is applied to the word line, programming does not take place in this memory cell (or a very slow programming takes place). Therefore, as shown in FIG. 17, even when an n channel stacked gate transistor is used for the memory cell, the programming operation can be automatically stopped by using a p channel MOS transistor as the selection gate transistor and by making higher the voltage applied to the gate electrode.

FIGS. 18A to 18D show the manner of change in voltages used at the time of programming in the non-volatile semiconductor memory device in accordance with the second embodiment of the present invention. The operational waveforms shown in FIGS. 18A to 18D are substantially the same as the operational waveforms shown in FIG. 7 except that the voltage polaritities thereof are inverted. However, as to the selection voltage Vstp applied to the gate of selection gate transistor, +5V is applied to the selected column and +6V is applied to the non-selected column.

In the second embodiment, the structure shown in FIGS. 12 to 15 may be utilized as the structure for the portion generating the necessary control voltage. In that case, only the voltage applied to the electrode node in the output stage is changed.

The overall structure of the non-volatile semiconductor memory device in accordance with the second embodiment is similar to that shown in FIG. 11, different only in that not a p channel but an n channel stacked gate transistor is used for the memory cell MC and in that the sector selection transistor receiving the sector select signal is formed by a p channel MOS transistor.

As described above, according to the second embodiment of the present invention, for a subbit line to which a memory cell consisting of an n channel stacked gate transistor is connected, a selection gate transistor consisting of a p channel MOS transistor is provided so as to connect the subbit line to the main bit line. At the time of programming, by adjusting the gate potential of the selection gate transistor, program current is limited, and when the threshold voltage of the memory cell attains to a prescribed value or lower, the subbit line potential decreases, so that programming is automatically stopped. Thus similar effects as in the first embodiment can be obtained.

[Third Embodiment]

Figure 19:
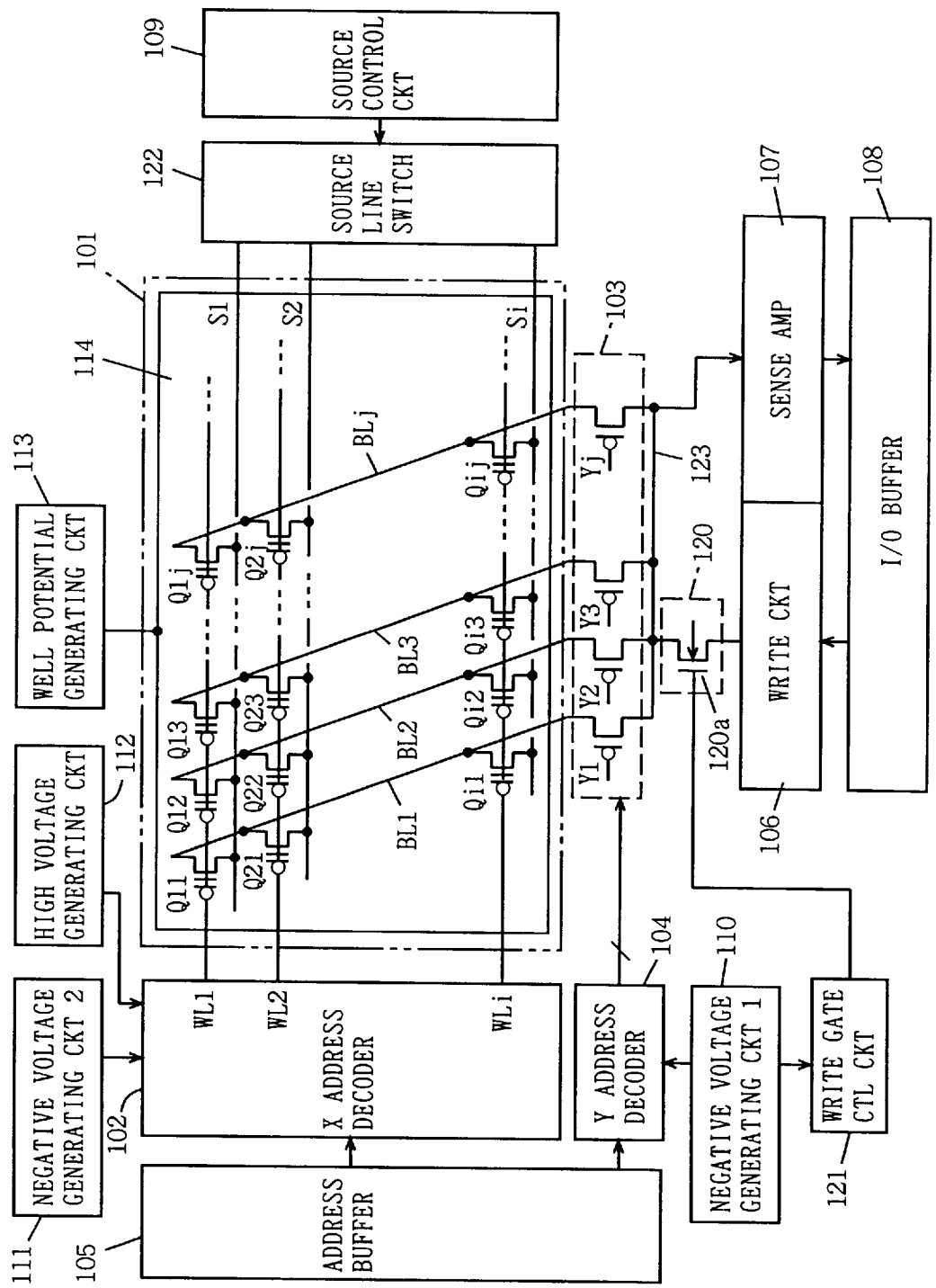
FIG. 19 schematically shows a structure of a third embodiment of the present invention.

FIG. 19 schematically shows an overall structure of a non-volatile semiconductor memory device in accordance with the third embodiment of the present invention. The non-volatile semiconductor memory device shown in FIG. 19 implements an NOR type flash memory using the p channel MOS type memory cell structure according to the first embodiment.

Referring to FIG. 19, the non-volatile semiconductor memory device in accordance with the third embodiment of the present invention includes a memory cell array 101 including a plurality of memory cells Q11 . . . Q1j . . . Qi1 . . . Qij arranged in rows and columns; an X address decoder 102 for decoding an internal X address signal applied from address buffer 105 and for driving an addressed row in memory array 101 to the selected state; a write circuit 106 latching a write data applied from an input/output buffer 108 at the time of data writing and for generating a high voltage for programming in accordance with the write data; a sense amplifier 107 for sensing and amplifying data read from the selected memory cell and reads it to the outside of the device through input/output buffer 108 at the time of data reading; a source control circuit 109 controlling potential of a source line in the memory array; a negative voltage generating circuit 110 and 111 generating a prescribed negative voltage; a high voltage generating circuit 112 for generating a high voltage required at the time of programming and erasure; and a well potential generating circuit 113 for supplying a potential to a well which is a semiconductor substrate region for the memory array 101.

Memory array 101 is formed in an n well region 114, and a potential from well potential generating circuit 113 is supplied to N well region 114. Memory array 101 includes word lines WL1–WLi arranged corresponding to respective rows of memory cells, and bit lines BL1–BLi arranged corresponding to respective columns of memory cells. Memory cells Q11–Qij are arranged corresponding to crossing portions between word lines WL1–WLi and bit lines BL1–BLj. Control gates of rows of memory cells are connected to respective word lines WL1–WLi. Drains of memory cells of respective columns are connected to corresponding bit lines BLi–BLj. Source lines S1–Si are arranged corresponding to respective rows of memory cells, and sources of memory cells of the corresponding row are connected thereto. Source lines S1–Si are connected to source control circuit 109 through a source line switch 122.

The non-volatile semiconductor memory device in accordance with the third embodiment further includes a Y address decoder 104 for decoding a Y address signal from address buffer 105 to generate a column selection signal for selecting a corresponding column; a Y gate 103 for connecting, in accordance with the column selection signal from Y address decoder 104, a corresponding bit line of memory array 101 to an internal data line 123; a write gate 120 connected between write circuit 106 and internal data line 123; and a write gate control circuit 121 for controlling operation at the time of data writing of write gate 120.

Y gate 103 includes Y gate transistors Y1–Yj consisting of p channel MOS transistors coupled between respective ones of bit lines BL1–BLj and internal data line 123 and each receiving at its gate the column selection signal from Y address decoder 104.

Write gate 120 includes an n channel MOS transistor 120a, of which gate potential and well potential are controlled by write gate control circuit 121. Write gate control circuit 121 receives a negative voltage from negative voltage generating circuit 110, and adjusts current supplying capability of the write gate 120 at the time of programming. Source control circuit 109 applies a high voltage for erasure to source lines S1–Si at the time of erasure, and at the time of programming, applies a negative bias voltage to the source line provided corresponding to the row in which the selected memory cell exists, through source line switch 122. Each of the circuits operate under the control of a write/read control circuit, not shown. The operation of the non-volatile semiconductor memory device shown in FIG. 19 will be described briefly.

(i) Erasing operation

Negative voltage generating circuit 111 applies a negative voltage (of –10V, for example) to X address decoder 102. X address decoder 102 applies a negative voltage (of –10V, for example) to all the word lines WL1–WLi. Well potential generating circuit 113 applies a high voltage (for example, 8V) to N well region 114. Source control circuit 109 applies a high voltage (for example, 8V) to source lines S1–Si through source line switch 122. Y address decoder 104 turns off all the Y gate transistors Y1–Yj in Y gate 103, and sets bit lines BL1–BLi all to the floating state. In these states, voltages of –10V, 8V and 8V are applied to the word line, the source line and N well region 114 for the memory cells in memory array 101, respectively, all the memory cells Q11–Qij in memory array 101 are erased (electrons are extracted from the floating gate electrodes to the substrate region), and the absolute values of the threshold voltages of memory cells Q11–Qij are increased.

(ii) Programming operation

Assume that programming is performed to memory cell Q11. More specifically, electrons are to be injected to the floating gate of memory cell Q11 and absolute value of the threshold voltage is to be made small.

High voltage generating circuit 112 applies a high voltage of about 8V, for example, to X address decoder 102. X address decoder 102 selects word line WL1 in response to an X address signal applied from address buffer 105. Consequently, a high voltage (for example, 8V) is applied to the selected word line WL1, and non-selected word lines WL2–WLi are maintained at the level of the ground potential.

A negative voltage generating circuit 110 applies a negative voltage to Y address decoder 104. Further, data "0" (data corresponding to the state in which the absolute value of the threshold voltage is small) is externally applied through data input/output buffer 108 to write circuit 106 and latched therein. Y address decoder 104 decodes the Y address signal applied from address buffer 105 and transmits a column selection signal to Y gate 103. Y gate 103 selects bit line BL1 in accordance with the column selection signal, and connects the selected bit line BL1 to internal data line 123. In this state, in the write gate 120, under the control of write gate control circuit 121, the gate potential and well potential are set to 0V and –6V, respectively, and a program voltage of about –6V, for example is transmitted from write circuit 106 to selected bit line BL1.

Source control circuit 109 supplies a bias voltage of –1.5V, for example, to selected source line S1 through source line switch 122. The bias voltage may be commonly applied to all the source lines S1–Si. When the bit line BL1 is charged to a prescribed program voltage (of about –6V), write gate control circuit 122 lowers the gate potential of write gate transistor 120a to about –5V. Consequently, current drivability of write gate transistor 120a is adjusted. The ground voltage (0V) is applied from well potential generating circuit 113 to N well region 114.

When a prescribed period (width of a program pulse) passes, X address decoder 102 applies a negative voltage for verifying applied from negative voltage generating circuit 111, for a prescribed time period, to selected word line W1. X address decoder 102 applies the high voltage for programming and the negative voltage for verifying alternately and repeatedly. In this programming operation, as in the first embodiment above, when the threshold voltage becomes high (the absolute value becomes small), a channel current flows, potential of the bit line BL1 becomes high (absolute value becomes small), band to band tunneling phenomenon in memory cell Q11 is suppressed and programming to the memory cell Q11 is stopped. In this manner, programming to the memory cell Q11 is performed. At this time, since the current supplying capability of write gate transistor 120a of write gate 120 is limited, when the threshold voltage of memory cell Q11 attains to a prescribed value or lower, programming is automatically stopped, and therefore the width of distribution of the threshold voltages after programming can be made narrow.

The manner of generating various voltages necessary for writing are similar to those of the first embodiments, and similar structures may be utilized.

(iii) Reading operation

Now, assume that data is read from memory cell Q11. X address decoder 102 selects word line WL1 in response to an X address signal applied from address buffer 105, and applies a negative voltage of –3.3V, for example, to the selected word line. Ground voltage (0V) is applied to non-selected word lines WL2 to WLi. Y address decoder 104 applies a column selection signal to Y gate 103 in response to a Y address signal applied from address buffer 105. In Y gate 103, Y gate transistor Y1 is rendered conductive, and bit line BL1 is selected and connected to internal data line 123. At this time, the source line is maintained at the level of the ground voltage under the control of source control circuit 109.

Well region 114 receives the ground voltage from well potential generating circuit 113. To the selected bit line, a voltage of about 2V, for example, is applied from sense amplifier 107. When memory cell Q11 is in a programmed state and the absolute value of the threshold voltage thereof is small, a current flows to bit line BL1. When the absolute value of the threshold voltage of memory cell Q1 is large, current does not flow to bit line BL1. Whether there is the read current or not is sensed by sense amplifier 107, and data indicative of the result of sensing is externally output through input/output buffer 109.

In erasing operation, erasure may be performed block by block (source line by source line), or alternatively, all the bits may be erased collectively.

In the non-volatile semiconductor memory device shown in FIG. 19, collective erasure is performed. However, in this erasing operation, the absolute value of the threshold voltage is shifted to larger side, and by the programming operation, the absolute value of the threshold voltage is shifted to smaller side. Therefore, even when collective erasure is performed, the problem of so-called "over erasure" is not experienced. Further, in programming operation, the program current is limited by write gate 120 and programming stops automatically. Therefore, the width of distribution of Vth after programming can be made narrow.

As described above, even in the NOR type flash memory using a p channel stacked gate transistor as a memory cell as shown in FIG. 19, similar effects as in the first embodiment can be obtained.

[First Modification]

Figure 20:
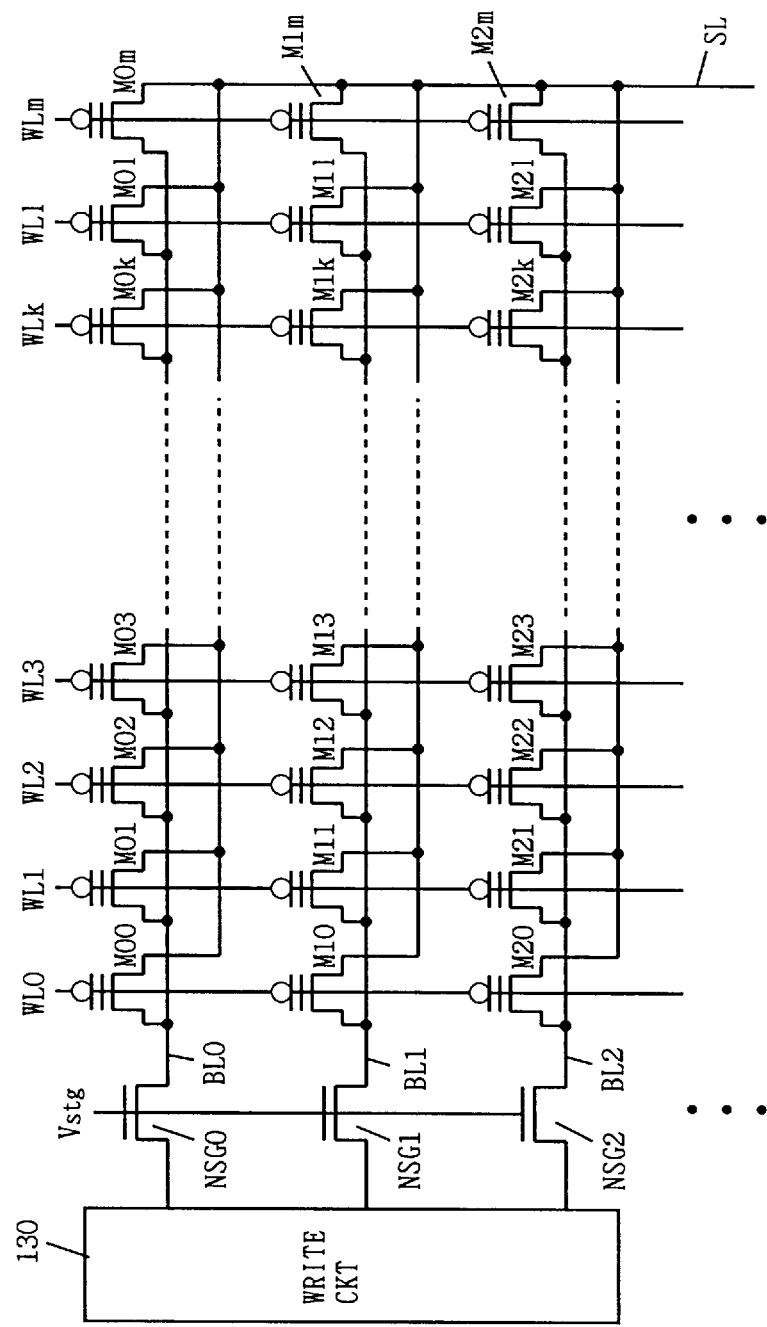
FIG. 20 schematically shows a structure of a main portion of a first modification of the third embodiment of the present invention.

FIG. 20 shows a structure of a main portion of a first modification of the non-volatile semiconductor memory device in accordance with the third embodiment of the present invention. In FIG. 20, only the structure of the memory array and the data writing portion is shown. In FIG. 20, the memory cell array includes a plurality of word lines WL0–WLm, a plurality of bit lines BL0–BL2, . . . and memory cells M01–M0m . . . , M21–M2m . . . arranged corresponding to crossing portions between word lines WL0–WLm and bit lines BL0–BL2 . . . Memory cells M01–M0m . . . M21–M2m each consist of a p channel transistor. Bit lines BL0–BL2 . . . are connected to write circuit 130 through selection control transistors NSG0–NSG2 . . . receiving at their gates the selection control voltage Vstg commonly, respectively. Write circuit 130 may be any circuit which writes a plurality of bits simultaneously. It may be latch circuit 106 shown in FIG. 9, or it may be a "column latch" provided corresponding to each bit line for latching write data. Write circuit 130 generates a negative voltage for programming in accordance with the latched write data at the time of programming. Selection gate transistors NSG0–NSG2 may be included in Y gate when the write circuit 130 corresponds to the write circuit 106 shown in FIG. 19 and these may be connection switches for connecting bit lines BL0–BL2 to the column latches, provided separate from Y gate, when write circuit 130 corresponds to the column latch.

In the structure of the non-volatile semiconductor memory device shown in FIG. 20, selection gate transistors NSG0–NSG2 are rendered conductive simultaneously, and programming operation to bit lines BL0–BL2 . . . is performed simultaneously. In this case also, by making closer the selection voltage Vstg to the level of program bias voltage, applying a source bias voltage to the source line SL and by alternately applying the negative voltage for verifying and the high voltage for programming to the selected word line, programming to bit lines BL0, BL1 and BL2 is automatically stopped independent from each other. At this time, the charging current for bit lines BL1–BL2 may be of a current level of at most 100 μA and it is not necessary to limit the charging current to about 1 μA. The value of bit line charging current at the time of programming may be appropriately determined in accordance with the magnitude of the value of the threshold voltage (or channel current) required for the programmed state.

In FIG. 20, structure of a portion controlling the potential of the substrate region (well) for selection gate transistors NSG0–NSG2 is not shown. In programming operation, a voltage in accordance with the voltage level for programming from write circuit 130 is applied to the substrate region for the selection gate transistors NSG0–NSG2.

[Second Modification]

Figure 21:
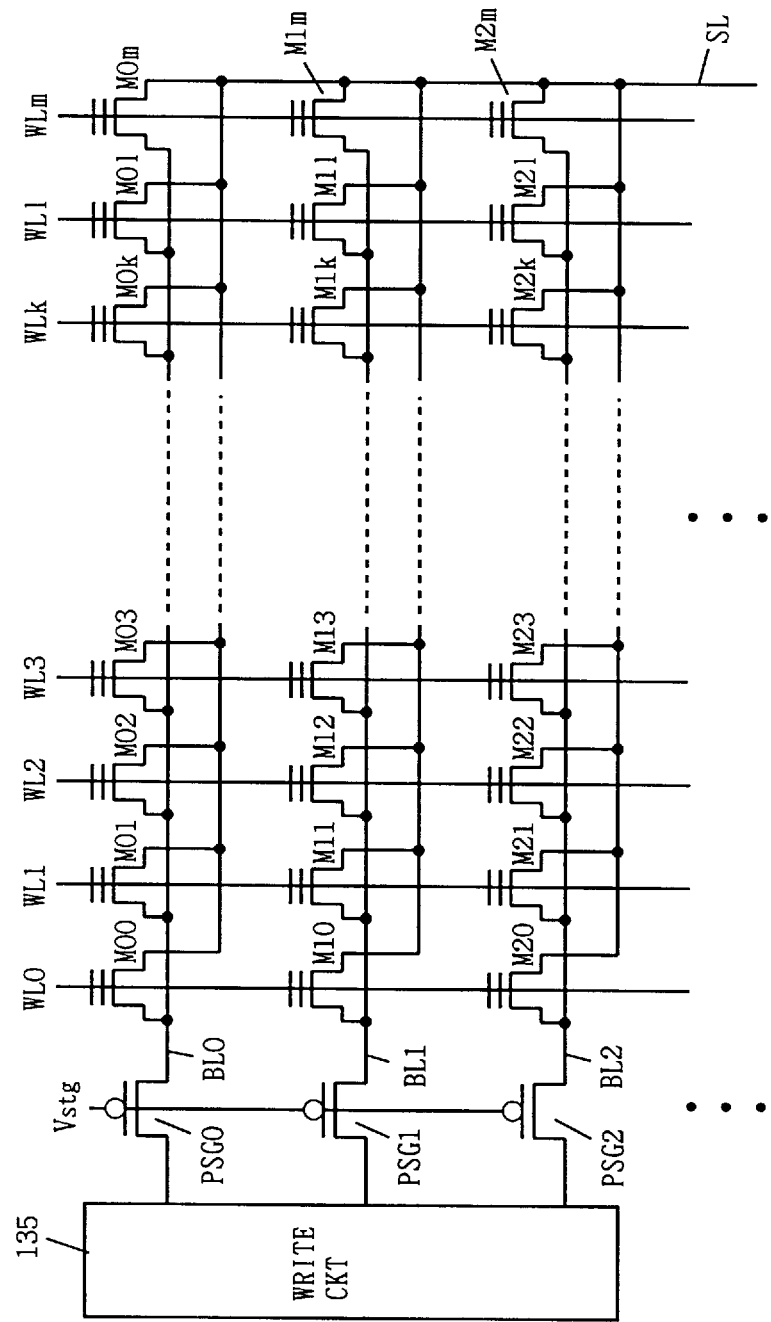
FIG. 21 schematically shows a structure of a main portion of a second modification of the third embodiment of the present invention.

FIG. 21 shows a structure of a second modification of the third embodiment of the present invention. In the structure shown in FIG. 21, different from the structure shown in FIG. 20, memory cells M00–M2m each consist of an n channel stacked gate transistor, and selection gate transistors PSG0–PSG2 provided corresponding to bit lines BL0–BL2, respectively, each consist of a p channel MOS transistor. Therefore, the high voltage for programming from write circuit 135 has a positive voltage level, and a voltage in accordance with the positive high voltage for programming is also applied to the substrate region for the selection gate transistors PSG0–PSG. Except this point, the structure is similar to that shown in FIG. 20. However, the selection gate transistors PSG0–PSG2 are p channel MOS transistors, and the selection voltage Vstp has a positive voltage level. Further, to the source line SL, a positive voltage is applied as the source bias voltage.

In the structure of the non-volatile semiconductor memory device shown in FIG. 21, a voltage for verifying at the level of a positive voltage is applied to selected word line WL. Thereafter, a negative voltage for programming is applied. The positive voltage for verifying and negative voltage for programming are alternately applied for a prescribed number of times or for a prescribed period.

In the structure of FIG. 21 also, when a plurality of bits are to be written in parallel, leak currents on bit lines BL0–BL2 are adjusted independent from each other. Therefore, adjustment of threshold voltages of memory cells is performed for bit lines BL0–BL2 independent from each other.

Therefore, in an NOR type flash memory in which a plurality of bits are written in parallel using n channel stacked gate transistors as memory cells as shown in FIG. 21, programming operation can be controlled automatically, bit by bit.

[Third Modification]

Figure 22:
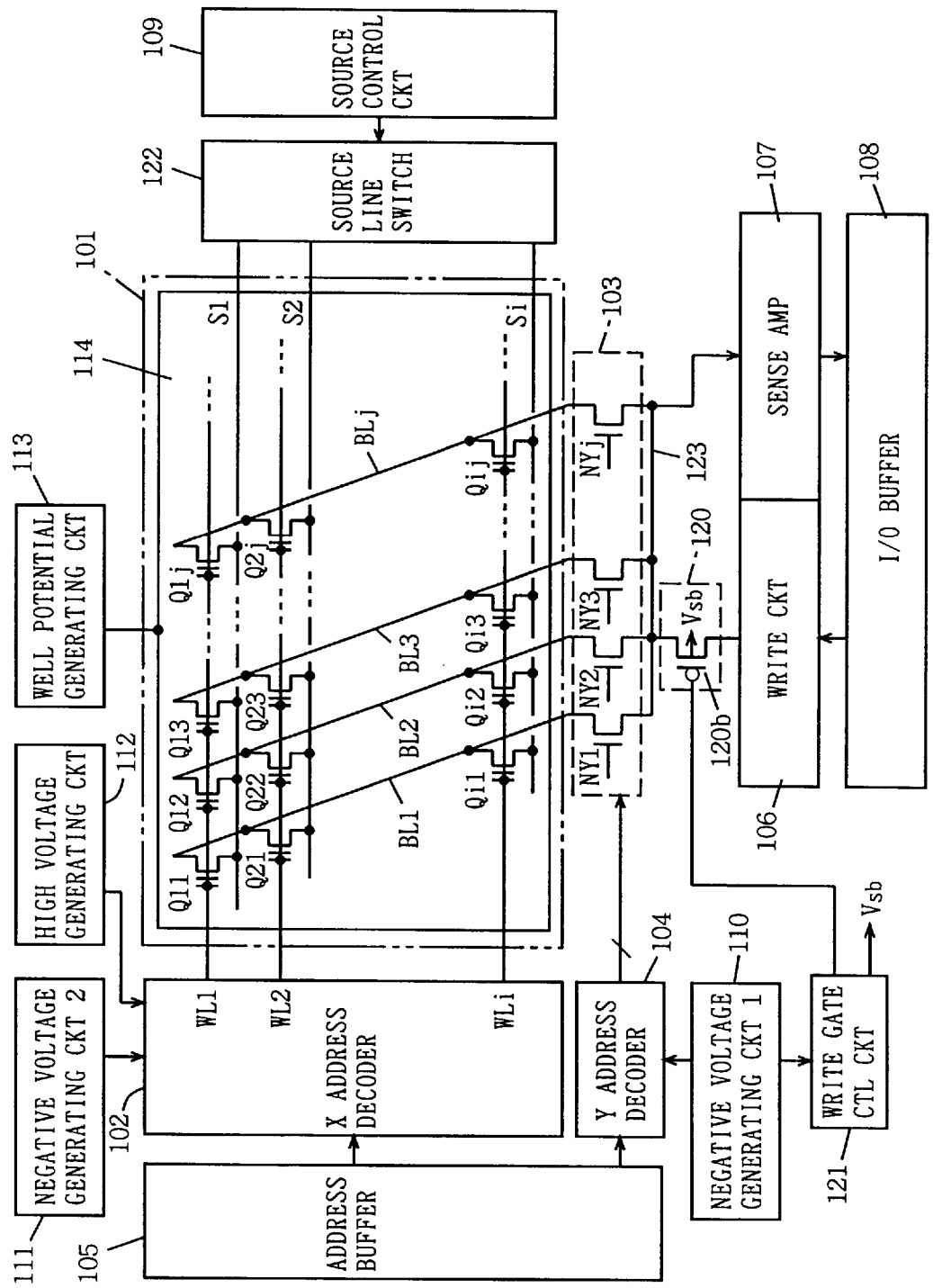
FIG. 22 schematically shows an overall structure of a third modification of the third embodiment of the present invention.

FIG. 22 shows a structure of a third modification of the non-volatile semiconductor memory device in accordance with the third embodiment of the present invention.

Similar to the structure shown in FIG. 19, the non-volatile semiconductor memory device shown in FIG. 22 has a structure of an NOR type flash memory. The NOR type flash memory shown in FIG. 22 differs from the NOR type flash memory shown in FIG. 19 in the following points. First, in memory array 101, memory cells Q11–Qij each consist of an n channel stacked gate transistor. In Y gate 103, column selection gate transistors NY1–NYj provided corresponding to bit lines BL1–BLa, respectively, each consist of an n channel MOS transistor, similar to memory cells of memory cell array 101.

Write gate 120 includes a write gate transistor 120b which is formed of a p channel MOS transistor receiving a voltage Vsb at its backgate. The potentials of the gate of write gate transistor 120b and of the substrate region are controlled by write gate control circuit 121. In the structure shown in FIG. 22, data writing is performed bit by bit. The programming operation is similar to that performed in the structure of FIG. 19, except the polarities of the voltages applied. Therefore, detailed description of the operation is not repeated. In the structure shown in FIG. 22 also, the current flowing through the selected bit line at the time of programming is limited by using the p channel MOS transistor, and therefore by the function of "self limit programming" operation of the selected memory cell is automatically stopped.

When bit by bit programming operation is to be performed, the current drivability of write gate transistor 120b may be an appropriate value of at most 100 μA. What is necessary is that the current drivability of write gate transistor 120b is smaller than the channel current generated when the selected memory cell is programmed and the prescribed threshold voltage is attained.

As described above, in this embodiment of the present invention, the bit line charging current at the time of programming to a selected bit line is adjusted to be smaller than the channel current, and therefore programming operation of the memory cell can be completed at every selected bit line. Therefore, the width of distribution of the threshold voltages after programming can be made narrow.

[Fourth Embodiment]

Figure 23:
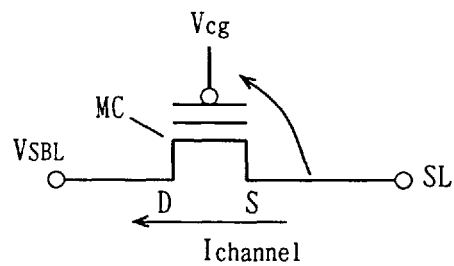
FIG. 23 shows arrangement of voltages at the time of programming of a memory cell in accordance with a fourth embodiment of the present invention.

Referring to FIG. 23, a memory cell consisting of a p channel stacked gate transistor is shown. To the control gate of memory cell MC, a voltage Vcg is applied. Drain node (D) receives the program bias voltage VSBL, and source node (S) is connected to a source line SL and receives a bias voltage. The voltage Vcg on the control gate is measured using the voltage on source line SL as a reference.

Figure 24:
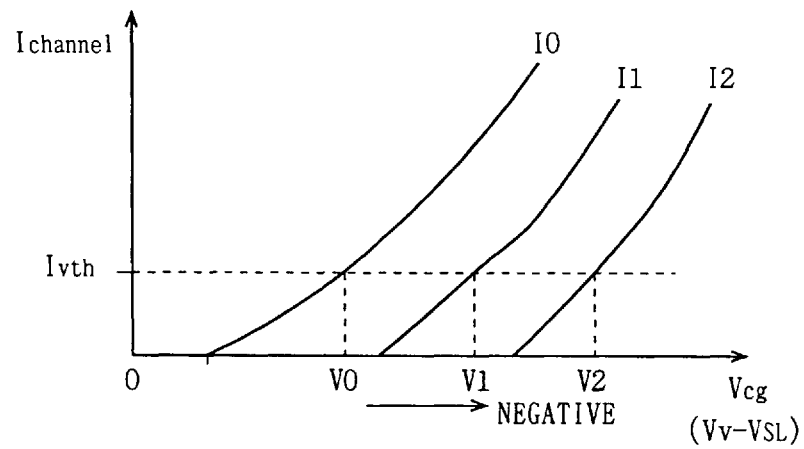
FIG. 24 shows relation between gate-source voltage and a channel current in accordance with the voltage arrangement shown in FIG. 23.

Referring to FIG. 24, when the memory cell MC consist of a p channel stacked gate transistor, a large channel current Ichannel flows in memory cell MC when the voltage vcg becomes more negative. Generally, the threshold voltage Vth is defined as the gate voltage when a prescribed current Ivth flows. Therefore, when we assume transistors having drain current characteristics represented by the curves I0, I1 and I2 as shown in FIG. 24, the transistors have threshold voltages of V0, V1 and V2, respectively.

In programming operation, the negative voltage Vb for verifying is adapted to have a constant voltage level. In programming operation, the absolute value of the threshold voltage is made small. Namely, in programming operation, the current characteristic is shifted from the curve I2 to curve I1 shown in FIG. 24. Therefore, by changing the level of the verifying voltage Vv, it becomes possible to change the time point when the channel current Ichannel starts to flow in memory cell MC, and therefore the threshold voltage vth to be set can be adjusted.

For example, when the pulse amplitude of the negative voltage pulse Vv for verifying is reduced by 1V (for example, it is changed from −1.5V to −2.5V), the potential at the floating gate electrode of the memory cell MC developed when the negative voltage pulse for verifying is applied can be lowered by 1V. This is equivalent to lowering of the threshold voltage after programming of the memory cell where the channel current Ichannel starts to flow by 1V. Therefore, the threshold voltage of the memory cell at which programming operation is stopped automatically is reduced by 1V. Therefore, by changing the pulse amplitude of the negative voltage pulse Vv for verifying, it is possible to control the set value of the threshold voltage of the memory cell at which programming is automatically self-stopped. The same applies when a n channel stacked gate transistor is used as a memory cell (except that the verifying voltage has a positive voltage level).

Figure 25:
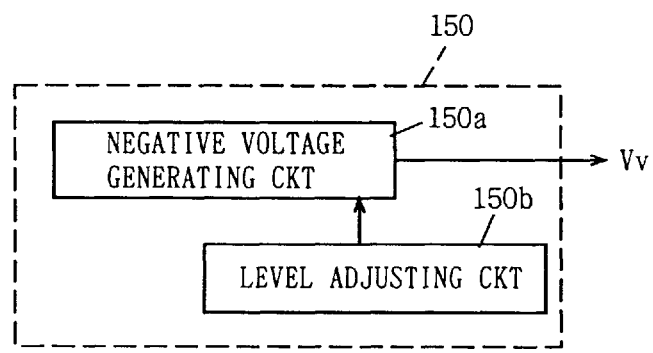
FIG. 25 schematically shows a structure of a main portion of a non-volatile semiconductor memory device in accordance with a fourth embodiment of the present invention.

FIG. 25 shows a structure of the verifying pulse voltage generating portion in accordance with the fourth embodiment of the present invention. FIG. 25 shows the structure of a portion for generating a negative voltage for verifying. Referring to FIG. 25, the circuit 150 for generating the negative voltage for verifying includes a negative voltage generating circuit 150a for generating a negative voltage, and a level adjusting circuit 150b for adjusting level of the negative voltage Vv output from negative voltage generating circuit 150a. Negative voltage generating circuit 150a is formed of a charge pump circuit, for example, and the negative potential attained is adjusted. Alternatively, the circuit 150 for generating a voltage for verifying shown in FIG. 25 may be adapted to adjust resistance values of resistance elements Z1 and Z2 of FIG. 15. Further, the resistance values of resistance element Z1 and Z2 may be adjusted by using a fuse element, so that the level of the generated negative voltage for verifying is set fixedly.

When the memory cell consists of an n channel stacked gate transistor, in the structure shown in FIG. 25, positive voltage generating circuit generating a positive fixed voltage is used instead of the negative voltage generating circuit 150a. A structure generating a voltage at an intermediate potential level between the power supply voltage and the ground potential may be used as the positive voltage generating circuit.

As described above, according to the fourth embodiment of the present invention, the pulse amplitude of the verifying voltage is adjusted. Therefore, it is possible to adjust the set value of the threshold voltage after programming.

[Fifth Embodiment]

Referring to FIGS. 23 and 24, a current flowing through the channel region in the stacked gate transistor is determined by the potential of the control gate electrode with the source potential being a reference. Therefore, when the voltage Vcg of the control gate is made constant and the potential of the source line SL is increased, it is equivalent to lowering of the control gate voltage Vcg. Conversely, when the voltage of source line SL lowers, it is equivalent to the rise of the control gate voltage vcg. Accordingly, at the time of verifying operation, when the level of the negative voltage for verifying is kept constant and the bias voltage applied to the source line SL is lowered (made more negative), the level of the negative voltage for verifying increases equivalently. Therefore, when the bias voltage is applied to the source line SL, it provides the same effects as when there is an offset applied to the voltage Vcg in the characteristic curve of FIG. 24. Therefore, by adjusting the level of the source line SL, the threshold voltage after programming of memory cell MC can be adjusted.

Therefore, by adjusting the pulse amplitude of the source line, the threshold voltage after programming of the memory cell where the channel current starts to flow can be adjusted, and hence the set value of the threshold voltage of the memory cell at which programming is self-stopped can be adjusted. This also applies to an n channel memory cell transistor.

Figure 26:
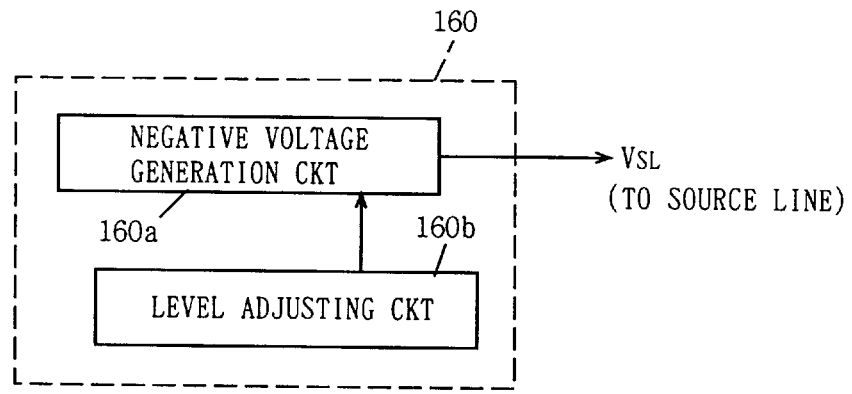
FIG. 26 schematically shows a structure of a main portion of the non-volatile semiconductor memory device in accordance with a fifth embodiment of the present invention.

FIG. 26 schematically shows a structure of the source voltage generating portion. Referring to FIG. 26, the source voltage generating portion 160 includes a negative voltage generating circuit 160a generating a source bias voltage VSL applied to the source line, and a level adjusting circuit 160b for adjusting the voltage level output from negative voltage generating circuit 160a. The structure shown in FIG. 26 is similar to the circuit for generating the negative voltage for verifying shown in FIG. 25. Therefore, the circuit may be shared (provided that the negative voltage for verifying and the source line bias voltage have the same voltage level). Therefore, the structure and operation are similar to those of the negative voltage generating portion for verifying described with reference to FIG. 25, and hence description thereof is not repeated.

Meanwhile, when the memory cell MC consist of an n channel stacked gate transistor, a positive voltage generating circuit for generating a voltage at an intermediate level between the power supply voltage Vcc and the ground is utilized instead of the negative voltage generating circuit 160a. In this case, an intermediate voltage may be generated simply by a resistance dividing circuit.

As described above, in accordance with the fifth embodiment of the present invention, pulse amplitude of the bias pulse applied to the source line at the time of programming is changed, and therefore the level of the threshold voltage after programming can be adjusted.

[Sixth Embodiment]

Figure 27:
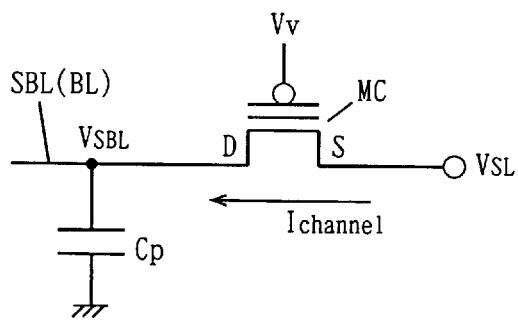
FIG. 27 is an illustration representing principal of operation of the non-volatile semiconductor memory device in accordance with a sixth embodiment of the present invention.

As shown in FIG. 27, there is a parasitic capacitance Cp on subbit line SBL (or bit line BL). The program bias voltage VSBL charges the parasitic capacitance Cp. When a channel is formed in the memory cell MC and the channel current Ichannel flows, the potential of the parasitic capacitance Cp is discharged and the level of the bias voltage VSBL rises. Assuming that the voltage level of the voltage Vv for verifying is constant, the channel current Ichannel is constant, and the amount of change in potential of parasitic capacitance Cp is in proportion to the time of application of the negative voltage Vv for verifying.

Figure 28:
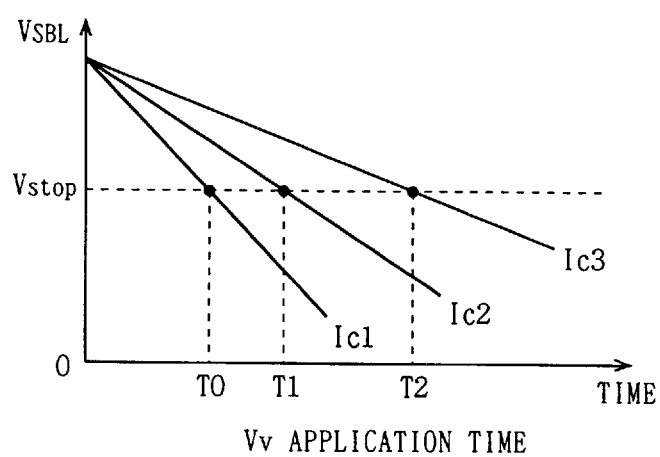
FIG. 28 shows relation between a time of verifying voltage application and a subbit line voltage in accordance with the sixth embodiment of the present invention.

FIG. 28 shows relation between the time of application of the negative voltage Vv for verifying and bias voltage VSBL. In FIG. 28, the abscissa represents time of application of the negative voltage Vv for verifying and the ordinate represents the bias voltage VSBL. Lines Ic1, Ic2 and Ic3 represent channel currents respectively. When the channel current increases, the parasitic capacitance Cp is discharged at high speed, and the bias voltage VSBL increases. Assuming that at the voltage Vstop programming stops, when the channel current is Ic1, programming stops when the time of application of the negative voltage Vv for verifying is T0. When the channel current is Ic2, the program stop voltage Vstop is attained when the time of application of the negative voltage Vv for verifying is T1, and programming is stopped. When the channel current is Ic3, the bias voltage VSBL attains to the stop voltage Vstop and programming stops when the time of application of the negative voltage Vv for verifying is T2.

Figure 29:
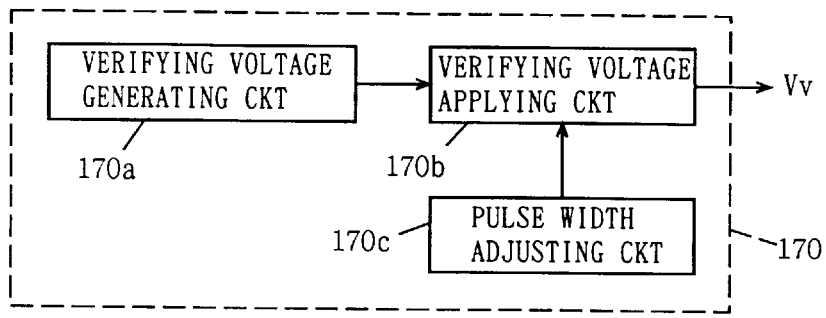
FIG. 29 schematically shows a structure of a main portion of the sixth embodiment of the present invention.

In other words, if the time of application of the negative voltage Vv for verifying is long, the bias voltage VSBL attains to the stop voltage Vstop even when the channel current is small. Therefore, by adjusting the time of application of the negative voltage Vv for verifying, the channel current, that is, the threshold voltage of the memory cell MC can be adjusted. More specifically, when the time of application of the negative voltage Vv for verifying is made longer, it is possible to stop programming with smaller amount of channel current and lower (more negative) threshold voltage Vth. Meanwhile, when the time of application of the negative voltage Vv for verifying is short, the program stop voltage Vstop is attained when much channel current flows. Therefore, the threshold voltage after programming of the memory cell can be set to a state where the threshold voltage Vth is relatively high (absolute value is small). This also applies to the case where an n channel stop gate transistor is used for the memory cell. FIG. 29 schematically shows the structure of the verifying voltage generating portion. Referring to FIG. 29, verifying voltage generating portion 170 includes a verifying voltage generating circuit 170a for generating a verifying voltage at a prescribed voltage level, a verifying voltage applying circuit 170b for selecting, for a prescribed period, a verifying voltage applied from verifying voltage generating circuit 170 and transmitting the same to a selected word line, and a pulse width adjusting circuit 170c for adjusting the period of application of the verifying voltage from applying circuit 170b. Pulse width adjusting circuit 170c includes a timer, for example, and the period of application of the verifying voltage Vv may be adjusted by adjusting the count time of the timer.

[Modification]

Figure 30:
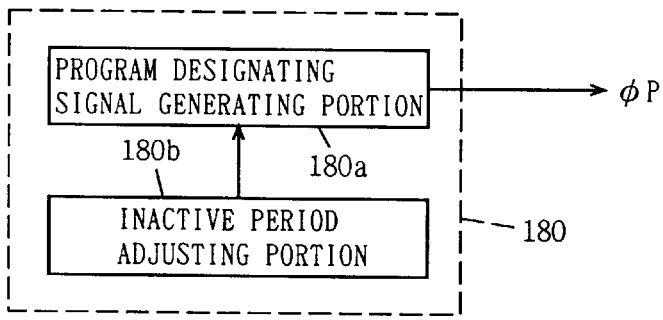
FIG. 30 schematically shows a structure of a modification of the sixth embodiment of the present invention.

FIG. 30 shows another structure of the verifying voltage generating portion. Referring to FIG. 30, the verifying voltage generating portion is provided in program/erase control circuit 180. The program/erase control circuit 180 includes a program designating signal generating portion 180a for generating a program designating signal φp in accordance with an applied command, and an inactive period adjusting portion 180b for adjusting an inactive period of the program designating signal. This is implemented by a timer, for example, and the program designating signal φp is the signal used in FIGS. 12 to 14. The width of active/inactive time of the signal φp is set by the timer. While the program designating signal φp is in the active period, a program voltage is applied to the selected word line, and when the program designating signal φp is in the inactive period, the verifying voltage is applied to the selected word line. Therefore, by adjusting the inactive period of write designating signal φp, the verifying period can be adjusted, and accordingly, the amount of channel current, that is, the threshold voltage can be adjusted. As described above, according to the sixth embodiment of the present invention, the period of application of the verifying voltage at the time of writing is adjusted. Therefore, the amount of channel current causing writing to stop can be adjusted, and therefore the set value of the threshold voltage of the memory cell can be adjusted.

[Seventh Embodiment]

Figure 31:
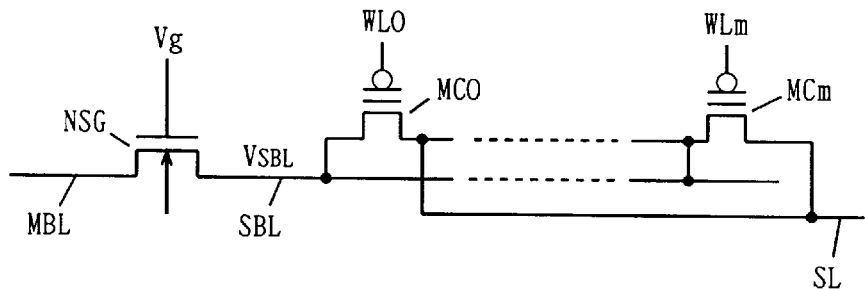
FIG. 31 schematically shows a structure of a main portion of a non-volatile semiconductor memory device in accordance with a seventh embodiment of the present invention.
Figure 32:
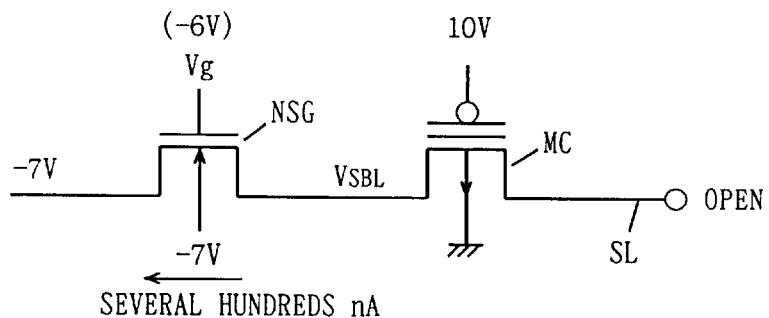
FIGS. 32 shows voltage arrangement of a selected bit line at the time of writing in accordance with the seventh embodiment of the present invention.

FIG. 31 shows a structure of a main portion of the non-volatile semiconductor memory device in accordance with the seventh embodiment of the present invention. FIG. 31 shows only the structure of a portion related to one subbit line SBL. Referring to FIG. 31, a plurality of memory cells MC0–MCm are connected to the subbit line SBL. Each of the memory cells MC0–MCm consists of a p channel stacked gate transistor. Sources of memory cells MC0 to MCm are connected to the source line SL. Between the main bit line MBL and the subbit line SBL, a selection gate transistor NSG consisting of an n channel MOS transistor is provided. This structure is substantially similar to the first embodiment. However, the voltage Vg applied to the gate of selection gate transistor NSG has different voltage level than in the first embodiment. FIG. 32 shows arrangement of voltages applied at the time of programming in accordance with the seventh embodiment of the present invention. Referring to FIG. 32, a positive high voltage of +10V, for example, is applied to the control gate of the memory cell MC, the substrate region is set to the ground voltage (0V), and the source line SL is set to an open state. A voltage of −7V is applied as a program voltage to the main bit line. The control voltage Vg of the selection gate of transistor NSG is set to a voltage level (for example −6V) sufficient to drive a constant current of several hundreds nA. In this voltage arrangement the selection gate transistor NSG is an n channel MOS transistor of which source receives −7V and which drain is connected to the subbit line. Gate voltage Vg is set higher, for example, −6V, than the source potential and the selection gate transistor NSG functions as a constant current source driving a current represented by the following equation.

$$Id = \beta(Vgs-Vth)^2$$

where Vgs represents difference between gate voltage Vg and its source voltage (−7V), and Vth represents the threshold voltage of selection gate transistor NSG. A leak current flows in memory transistor MC. At a time point where the leak current of the memory cell becomes equal to the constant current supplied by the selection gate transistor NSG, the voltage VSBL is stabilized and programming operation is performed with the voltage VSBL.

Figure 33:
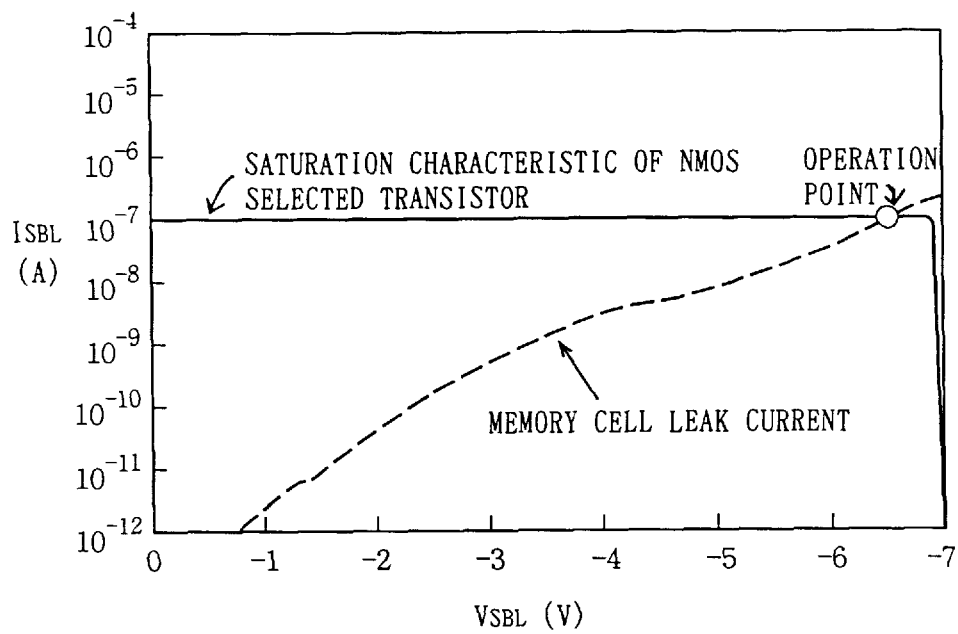
FIG. 33 represents in principal the operation of the seventh embodiment of the present invention.

FIG. 33 shows relation between the charging current of selection gate transistor NSG and the leak current of the memory cell in the voltage arrangement shown in FIG. 32. Referring to FIG. 33, the abscissa represents the voltage VSBL (unit:V) of the subbit line and the ordinate represents current (unit:A). Selection gate transistor NSG supplies a constant current of several hundreds nA in accordance with the gate voltage vg thereof. When the subbit line voltage VSBL nears to −7V, the amount of current driven thereby decreases abruptly. Meanwhile, the leak current of the memory cell increases as the voltage VSBL of the subbit line lowers. In a p channel staked gate transistor, the leak current generated at the time of programming of the memory cell is the band to band tunneling current generated in the drain region, which maintains a characteristic that the leak current increases monotonously as shown by the dotted line in FIG. 33 when the bit line voltage VSBL changes within the range of 0 to about −6.5V. Therefore, the subbit line voltage VSBL provided when the leak current at the time of programming of the memory cell becomes equal to the current value supplied by the selection gate transistor NSG is any voltage level between 0 to −6.5V. With this subbit line voltage VSBL, the leak current of the memory cell and the channel current of the selection gate transistor NSG attain to an equilibrium state. More specifically, the subbit line voltage VSBL automatically moves between 0 to −6.5V so that the leak current of the memory cell at the time of programming becomes equal to the current (for example, 100 nA) supplied by the selection gate transistor, and during programming operation, the leak current of the memory cell is always maintained at a constant value (for example, 100 nA).

Now, the current caused by hot electrons induced by band to band tunneling current injected to the floating gate electrode as the programming current in the p channel stacked gate transistor is directly related to the band to band tunneling current which is the drain leak current of the memory cell. Namely, electrons generated by band to band tunneling phenomenon are accelerated in the direction of the channel because of lateral electric field, and part of the accelerated electrons become hot electrons having high energy and injected to the floating gate. When there is a cell in which band to band tunneling current is much generated, the current injected by hot electrons induced by band to band tunneling current of that cell is also considerably large.

Meanwhile, the necessity of bit by bit verifying at the time of programming comes from the fact that threshold voltages after programming vary because of variation in programming characteristics of memory cells in a chip. Causes of variation in programming characteristics may include the following.

(1) Variation in thickness of tunnel insulating film.
(2) Variation in coupling ratio: the coupling ratio represents the ratios of transmission of the voltage by capacitive coupling in the control gate, the drain region, the source region and the n type well. When the coupling ratio varies, the floating gate potential Vfg also varies.
(3) Variation in neutral threshold voltage; this refers to variation of the threshold voltages of memory cells before erasure and before programming. The threshold voltage as a starting point varies.
(4) Variation in drain edge shape; drain edge influences the drain electric field. If the shape of the drain edge is steeped, a large drain electric field would be generated, and band to band tunneling phenomenon and hot electrons are likely to occur.
(5) Variation in drain impurity distribution: variation in impurity concentration in the drain region causes variation in the width of drain depletion layer and variation in an electric field accelerating electrons in the channel direction, resulting in variation of the amount of generated hot electrons. The thickness of the tunnel insulating film has an influence on the tunneling current because the electric field at an interface region in the substrate (drain region and tunnel insulating film) is in reverse proportion to the thickness of the tunnel insulating film.

The causes (1) to (4) of variation mentioned above dominate magnitude of the band to band tunneling current which will be the drain leak current, and as a result, varies the amount of current inject by band to band tunneling induced hot electrons. Only the cause (5) determines the width of the depletion layer and determines the lateral acceleration electric field for the generated electrons, which depends on the magnitude of efficiency of impurity ion implantation.

Therefore, if the drain leak current can be made constant, variation in programming characteristics caused by (1) to (4) can be eliminated. More specifically, causes of variation of the programming characteristic other than the cause (5) above can be eliminated. Therefore, by the method of programming with constant leak current using the selection gate transistor consisting of an n channel MOS transistor described above, the width of distribution of the threshold voltages after programming which presents a problem in the conventional programming method, can be made significantly narrower, and the number of times of bit by bit verifying can be significantly reduced.

Figure 34:
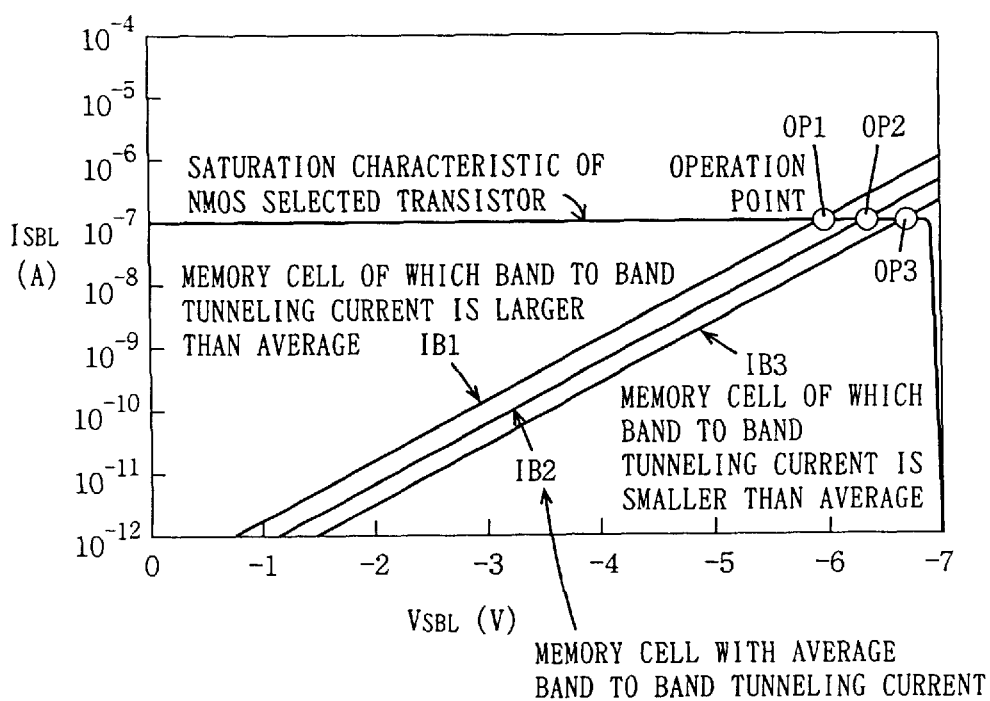
FIG. 34 represents in principal the operation of automatic adjustment of the subbit line voltage at the time of programming in accordance with the seventh embodiment of the present invention.

FIG. 34 shows a method of programming with constant leak current when the drain leak current (leak current of the memory cell) varies because of the causes (1) to (4) described above. In FIG. 34, the abscissa represents the voltage VSBL of the subbit line (program voltage) and the ordinate represents the charging current from the selection gate transistor and the leak current of the memory cell. The line IB1 represents relation between the drain leak current of a memory cell in which the amount of band to band tunneling current is larger than average and the drain voltage (VSBL of the subbit line), the line IB2 represents the drain leak current with a memory cell which generates an average amount of band to band tunneling current, and the line IB3 represents the leak current (drain leak current) of a memory cell in which amount of band to band tunneling current is smaller than average. For the lines IB1 to IB3, respective drain voltages, that is, the voltages VSBL of the subbit line are adjusted such that the drain current becomes equal to the constant charging current (100 nA to several hundreds nA) supplied from the selection gate transistor. Namely, programming is performed with the crossing points between each of the lines IB1 to IB3 and the constant charging current supplied by the selection gate transistor as operation points OP1, OP2 and OP3.

Therefore, even when the programming characteristic of the memory cells vary because of the causes (1) to (4), the voltages of the subbit line (drain voltage VSBL of the memory cell) is adjusted such that the respective drain leak currents are determined in accordance with a constant charging current applied from the selection gate transistor NSG, and programming is performed at a constant speed. Therefore, regardless of the variation in characteristics of the memory cells, programming operation is performed with a constant speed of programming. Namely, there would not be cells in which programming takes time or programming does not take much time, and hence variation in the threshold voltages Vth after writing can be significantly reduced.

Therefore, the time of programming can be set approximately at a constant time period and verifying operation is almost unnecessary. However, by performing verifying operation of only representative memory cells, whether or not the threshold voltage of the memory cell is not lower than a prescribed threshold voltage can be determined. The verifying operation may be appropriately determined in accordance with the application. Accordingly, the verifying operation can almost be eliminated and the number of times of verifying can be significantly reduced. This means that high speed programming is possible. Further, since memory cells has uniform programming characteristic, variation in threshold voltages after programming can be significantly reduced.

Figure 35:
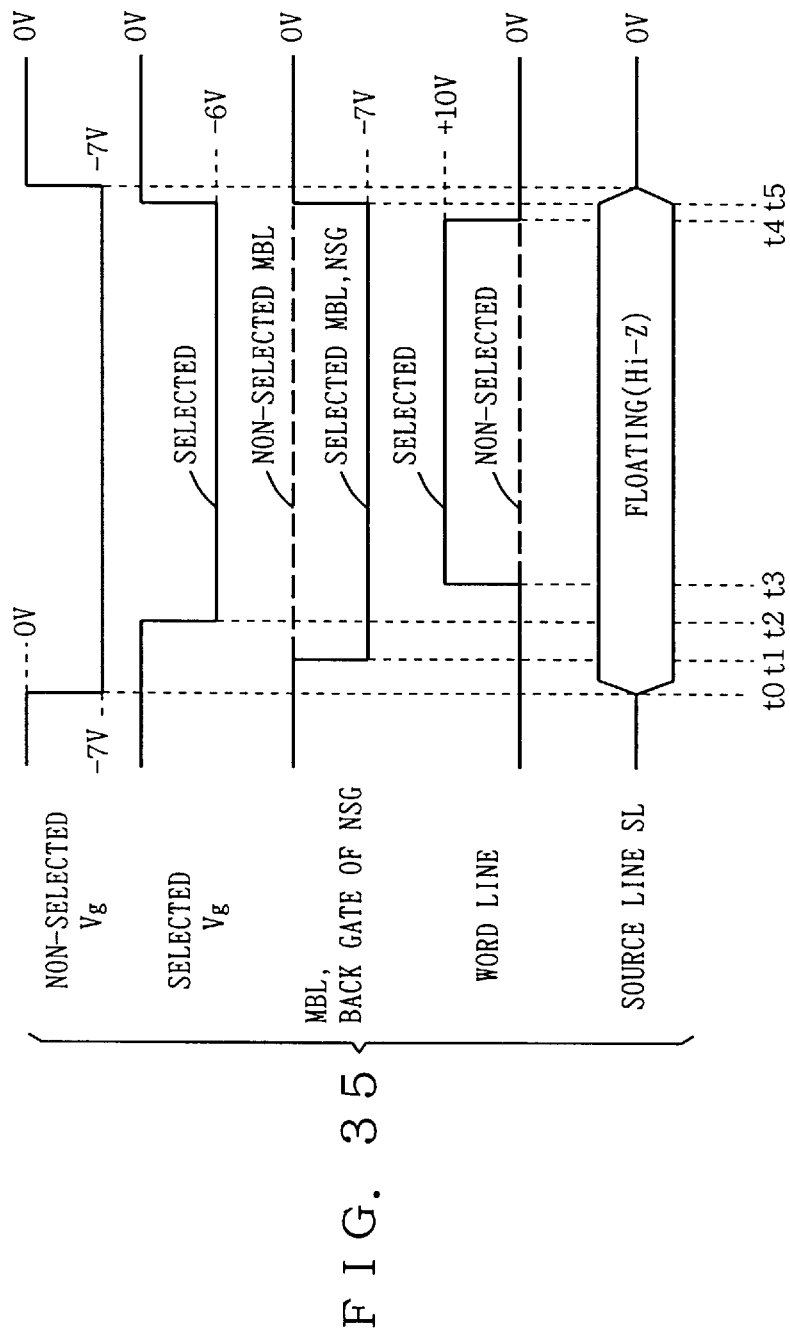
FIG. 35 shows waveforms of various voltages at the time of programming in accordance with the seventh embodiment of the present invention.

FIG. 35 shows a sequence of applying various voltages at the time of programming. The programming operation will be described with reference to FIG. 35.

At time t0, the source line S1 is set to the floating state (Hi-Z state: open state), and at time t1, a program voltage of a negative voltage of −7V, for example is applied to the backgate (substrate region) of selection gate transistor NSG and to the main bit line MBL. At this time, the gate voltage Vg of the selection gate transistor is at a voltage level of the ground voltage (0V), and the program voltage from the main bit line MBL is transmitted to the corresponding subbit line SBL.

At time t2, the gate voltage Vg of the selection gate transistor provided corresponding to the selected subbit line is set to a voltage level of −6V, for example. Consequently, the selection gate transistor operates as a constant current source, providing a current of 100 nA to several hundreds nA.

Thereafter, at time t3, the potential of the selected word line is set to a high voltage for programming, for example, the voltage level of +10V, and in the selected memory cell, electrons are injected to the floating gate by band to band tunneling current. At this time, there is a leak current flowing in the memory cell under this programming. However, the drain leak current is limited to a constant current level supplied from the selection gate transistor NSG, and the voltage VSBL on the subbit line SBL is adjusted. In accordance with the adjusted voltage level on the subbit line, programming is performed at the same speed to selected memory cells.

After the lapse of a prescribed time period, at time t4, the word line is set to a non-selected state and at time t5, all the voltages are returned to the initial state. Further, the source line SL is returned from the floating state to the level of the ground voltage.

The speed of programming of the memory cells is uniform and after the completion of programming, verifying operation may be performed only for a representative memory cell or may not be performed at all. Further, the number of times of verifying may be reduced by making longer the width of program pulse (a period in which the selected word line is in the selected state).

As for the control circuit for the programming operation shown in FIG. 35, the circuit structure shown in FIG. 11 may be utilized as the overall structure. What is necessary is to generate a program voltage as a program pulse having a prescribed time width from the program voltage generating circuit 60 of FIG. 11, and generation of the negative voltage for verifying is not necessary.

[First Modification]

Figure 36:
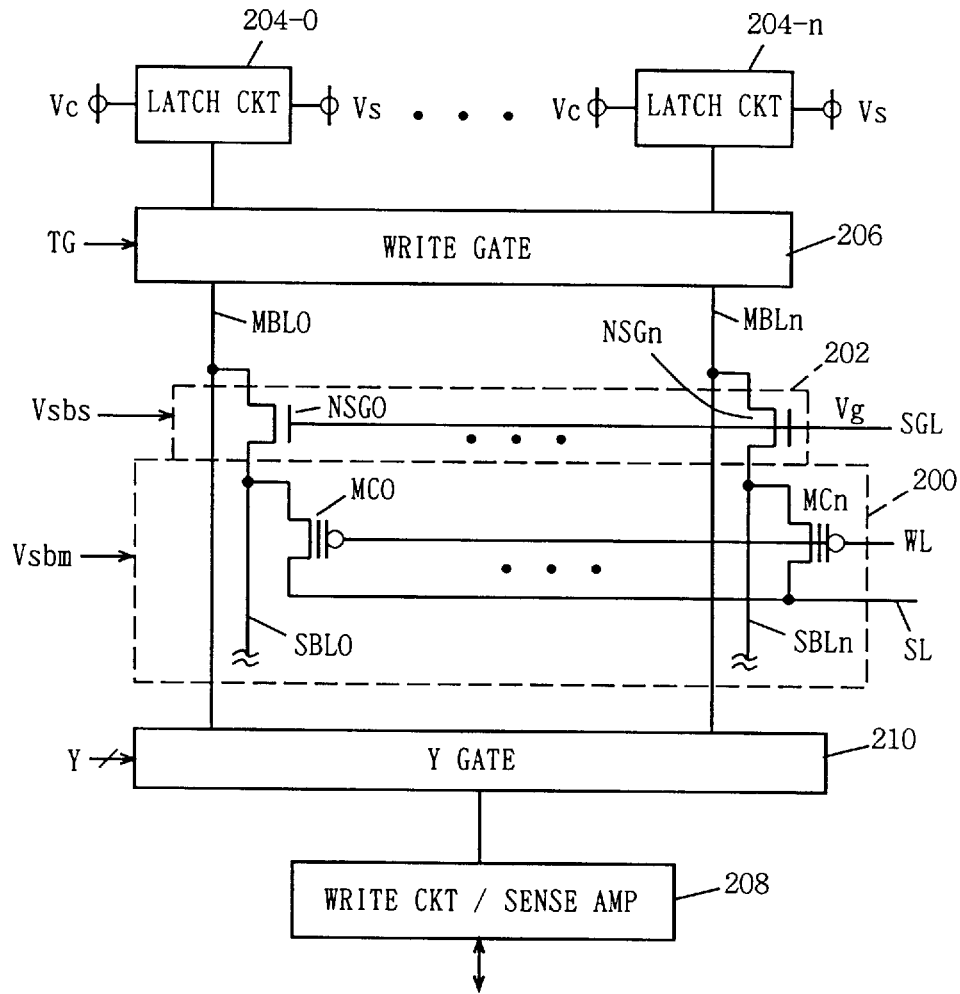
FIG. 36 schematically shows a structure of a first modification of the seventh embodiment of the present invention.

FIG. 36 schematically shows a structure of a main portion of a first modification of the non-volatile semiconductor memory device in accordance with the seventh embodiment of the present invention. In the structure shown in FIG. 36, a plurality of bits are programmed in parallel. Referring to FIG. 36, the non-volatile semiconductor memory device includes a memory cell array 200 in which memory cells consisting of p channel stacked gate transistors are arranged in rows and columns. In FIG. 36, one row of memory cells MC0 to MCn are shown as a representative.

To the control gates of memory cells MC0–MCn, a word line WL is connected, and to the word line WL, a word line selecting signal from an X decoder, not shown is transmitted. Sources of memory cells MC0–MCn are commonly connected to the source line SL. Corresponding to memory cells MC0–MCn, subbit lines SBL0–SBLn are arranged, respectively.

Corresponding to the subbit lines SBL0–SBLn, main bit lines MBL0–MBLn are arranged. A selection gate 202 is provided for connecting the main bit lines MBL0–MBLn and selected subbit lines. Selection gate 202 includes selection gate transistors NSG0–NSGn arranged between subbit lines SBL0–SBLn and main bit lines MBL0–MBLn, respectively. To the gates of selection gate transistors NSG0–NSGn, a selection gate selecting line SGL is commonly connected. A control voltage Vg is applied to the selection gate selecting line SGL. To the memory array 200 and to the backgate of selection gate 202 (substrate region), substrate potentials (well potentials) Vsbm and Vsbs are applied, respectively, from well potential generating circuits, not shown (see FIG. 11).

The non-volatile semiconductor memory device further includes latch circuits 204-0 to 204-n provided corresponding to main bit lines MBL0–MBLn, and a write gate 206 provided between bit lines MBL0–MBLn and latch circuits 204–204n. Latch circuits 204-0–204-n operate using the power supply voltages Vc and Vs as both operational power supply voltages, to latch applied data. The power supply voltages Vc and Vs are set to the levels of the power supply voltage Vcc and the ground voltage GND when write data is to be latched, and set to the levels of the ground voltage and a negative voltage at the time of programming. Write gate 206 is rendered conductive in response to the control signal TG at the time of programming and connects main bit lines MBL0–MBLn to latch circuits 204-0–204-n. The write gate 206 includes a CMOS transmission gate provided corresponding to each of the main bit lines MBL0–MBLn. The control signal TG has its voltage level also adjusted at the time of latching the write data and at the time of programming of the memory cell.

The non-volatile semiconductor memory device further includes a Y gate 210 which connects an addressed column (main bit line) to the write circuit/sense amplifier 208 in accordance with a column selection signal Y from a Y decoder, not shown.

The operation will be briefly described in the following.

In writing operation, write circuit in write circuit/sense amplifier 208 is activated, and write data in accordance with the externally applied write data is generated. Y gate 210 transmits the write data applied from the write circuit of write circuit/sense amplifier 208 in accordance with a column selection signal from the Y decoder, not shown, to the corresponding main bit line. In writing operation, write gate 206 is rendered conductive in accordance with a control signal TG, and a latch circuit (any of 204-0 to 204-n) corresponding to the selected main bit line latches the applied write data. At this time, the power supply voltages Vc and Vs are at the levels of the power supply voltage Vcc same as the level of the write data and the ground voltage GND.

In accordance with the column selection signal from the Y decoder, Y gate 210 sets the main bit lines to the selected state successively, and latches write data in the latch circuit. When all necessary write data are latched in latch circuits (204-0 to 204-n), Y gate 210 is inactivated. Consequently, main bit lines MBL0–MBLn are separated from write circuit/sense amplifier 208. Thereafter, the power supply voltages Vc and Vs of latch circuits 204-0 to 204-n are set to the levels of the ground voltage and a negative voltage, and a negative voltage for programming is transmitted to the corresponding main bit lines MBL0 to MBLn in accordance with the data latched in latch circuits 204-0 to 204-n.

The control voltage Vg of selection gate of selecting line SGL is at the level of the ground voltage, and to the subbit lines SBL0–SBLn, program voltage is transmitted in accordance with the latch data from latch circuits 204-0 to 204-n. At this time, the well potential Vsbn is set to the level of the ground voltage, and the well potential Vsbs and the control voltage Vg are respectively set to prescribed negative voltage levels. In this state, a high voltage is applied to word line WL. Consequently, of the memory cells MC0–MCn connected to the word line WL, programming is performed to that one which requires programming, at a constant speed of programming (constant memory cell drain leak current).

The current consumed in one memory cell is about 100 nA. A negative voltage generating circuit has, when it is on chip, current drivability of about 1 mA. Since 1 mA/100 nA=$10^4$, it is possible to supply the memory cell drain leak current with sufficient margin at the time of programming even when one row of memory cells are to be programmed simultaneously, whereby high speed programming is possible.

The non-volatile semiconductor memory device shown in FIG. 36 is similar to the structure of FIG. 11 in the block level, when the overall structure is considered. The voltages and control signals necessary for the programming operation may be generated under the control of program/erase control circuit 50 of FIG. 11.

The structure of parallel writing for writing one row of memory cells simultaneously is, naturally, applicable to the first embodiment and the like.

[Second Modification]

Figure 37:
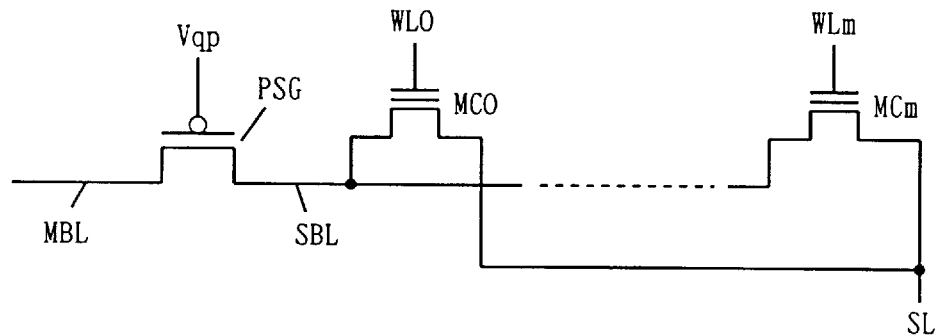
FIG. 37 schematically shows a structure of a main portion of a second modification of the seventh embodiment in accordance with the present invention.

FIG. 37 shows a structure of a second modification of the non-volatile semiconductor memory device in accordance with the seventh embodiment of the present invention. Referring to FIG. 37, only a structure of a portion related to one subbit line is shown. Referring to FIG. 37, memory cells MC0–MCm each consisting of an n channel stacked gate transistor are connected to subbit line SBL. Control gates of memory cells MC0–MCn are connected to word lines WL0 . . . , WLm, respectively. Sources of memory cells MC0–MCm are commonly connected to a source line SL.

Between subbit line SBL and main bit line MBL, a selection gate transistor PSG consisting of a p channel MOS transistor is arranged. To the control electrode of selection gate transistor PSG, a control voltage Vgp is applied. Similar to an n channel MOS transistor, the p channel MOS transistor also has such a saturation characteristic as shown in FIG. 33 (except that a positive voltage is applied in p channel MOS transistor). Therefore, by operating the selection gate transistor PSG consisting of the p channel MOS transistor as a constant current source, it becomes possible to make constant speed of programming of memory cells MC consisting of n channel stacked gate transistors.

Figure 38:
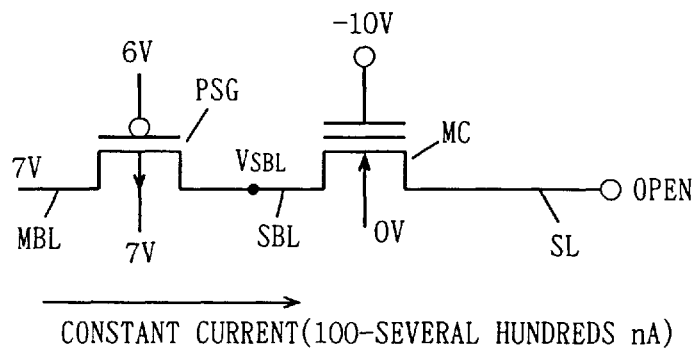
FIG. 38 shows voltage arrangement in the structure shown in FIG. 37.

FIG. 38 shows manner of application of voltages in accordance with the second modification. Referring to FIG. 38, at the time of programming, a negative voltage of about −10V, for example, is applied to the control gate of a memory cell MC, and the ground voltage (0V) is applied to the substrate region (well). The source line SL is opened. A positive voltage of about 7V, for example, is applied to main bit line MBA, and a positive voltage of about +7V, which is the same voltage level as the potential on main bit line MBA, is also applied to the substrate region (well) of the selection gate transistor PST. A voltage of about +6V, for example, is applied to the gate of selection gate transistor PSG. The voltage VSBL on subbit line SBL is automatically adjusted to such a voltage level that makes equal the constant current supplied by the selection gate transistor PSG and the drain leak current of the memory cell MC, in accordance with these currents. Programming operation (operation to make smaller the threshold voltage) is performed in the memory cell MC using the drain leak current which is equal to the charging current of constant magnitude supplied by the selection gate transistor PSG.

Therefore, even in a structure in which memory cells MC consist of n channel stacked gate transistors, it is possible to make uniform programming characteristics of memory cells MC by using a p channel MOS transistor as the selection gate transistor and by operating the p channel MOS transistor as a constant current source. Therefore, the number of times of verifying can be significantly reduced or the verifying operation can be eliminated. Since programming operation proceeds with the same speed, variation of the threshold voltages after programming can be significantly suppressed because the time of programming is constant, so that the width of distribution of Vth after programming can be made narrow, and thus a non-volatile semiconductor memory device which operates with low power supply voltage can be realized.

[Third Modification]

Figure 39:
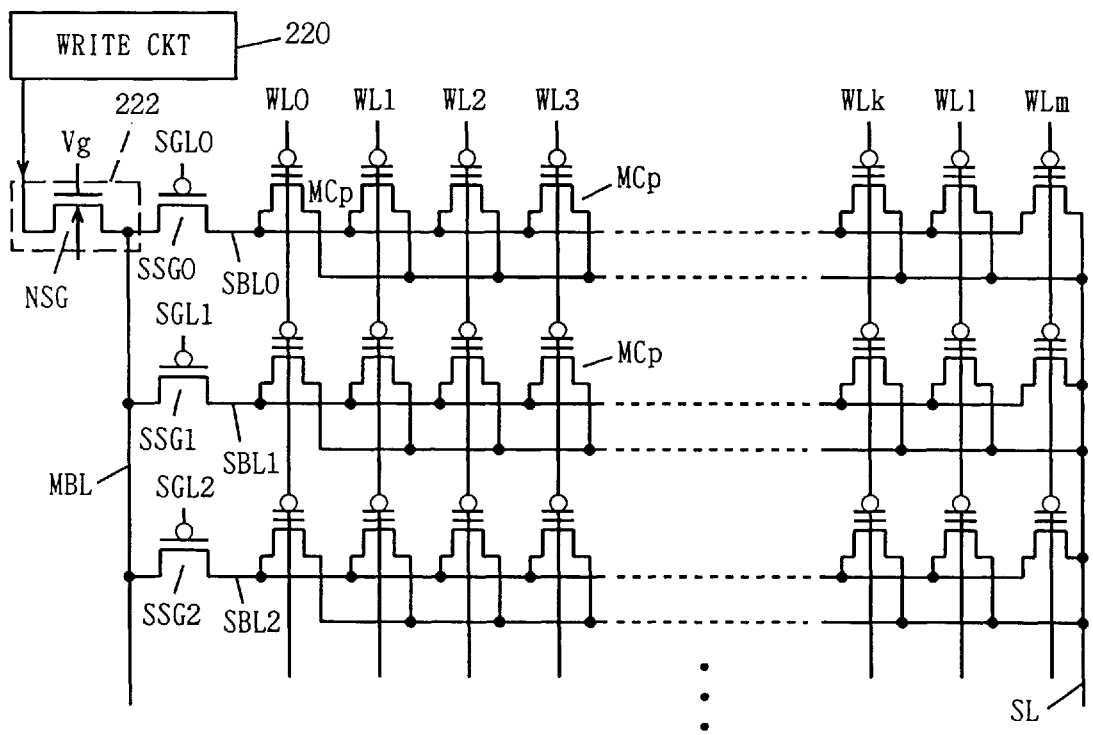
FIG. 39 schematically shows a structure of a main portion of a third modification of the seventh embodiment of the present invention.

FIG. 39 shows a structure of a third modification of the seventh embodiment of the present invention. FIG. 39 shows a structure of a main portion of the non-volatile semiconductor memory device in which bit by bit programming is performed. Parallel to the main bit line MBL, subbit lines SBL0–SBL2 . . . are connected through selection gate transistors SSG0–SSG2 . . . A prescribed number of memory cells MCp consisting of p channel staked gate transistors are connected to respective subbit lines SBL0–SBL2 . . . Sources of the memory cells MCp are commonly connected to the source line SL. Corresponding to respective rows of memory cells MCp, word lines WL0–WLm are arranged and the word lines WL0–WLm are connected to the control gates of memory cells MCp the corresponding rows. Selection gate transistors SSG0–SSG2 consist of p channel MOS transistors and to the respective gates, subbit line selection signals SGL0–SGL2 are applied.

Between write circuit 220 and main bit line MBL, a write gate 222 serving as a constant current source at the time of programming is provided. Write gate 222 includes an n channel MOS transistor NSG. The write gate transistor BSG may be a Y gate transistor which is rendered conductive in response to a column selection signal from the Y decoder, or it may be a transistor provided separate from the Y gate transistor. To the gate of write gate transistor NSG, a control voltage Vg is applied.

In programming operation, any of the subbit line selection signals SGL0–SGL2 . . . is set to a voltage level of about −8 to about −10V of the active state, and remaining subbit line selection signals are set to the level corresponding to the inactive state, for example at the ground voltage. Accordingly, only that subbit line selection gate transistor which is provided corresponding to the selected subbit line is rendered conductive and other selection gate transistors are rendered non-conductive. A negative voltage for programming of about −7V is applied from write circuit 220 to write gate transistor NSG, and a negative voltage which is at the same voltage level as the negative voltage for programming is also applied to the substrate region thereof. The control voltage Vg is set to the voltage level of about −6V, for example, so as to use the write gate transistor NSG as a constant current source.

In such a structure as shown in FIG. 39, by holding constant the current flowing through the selected subbit line by using the write gate transistor, it is possible to make constant the drain leak current of the selected memory cells and programming can be performed at a constant speed.

[Fourth Modification]

Figure 40:
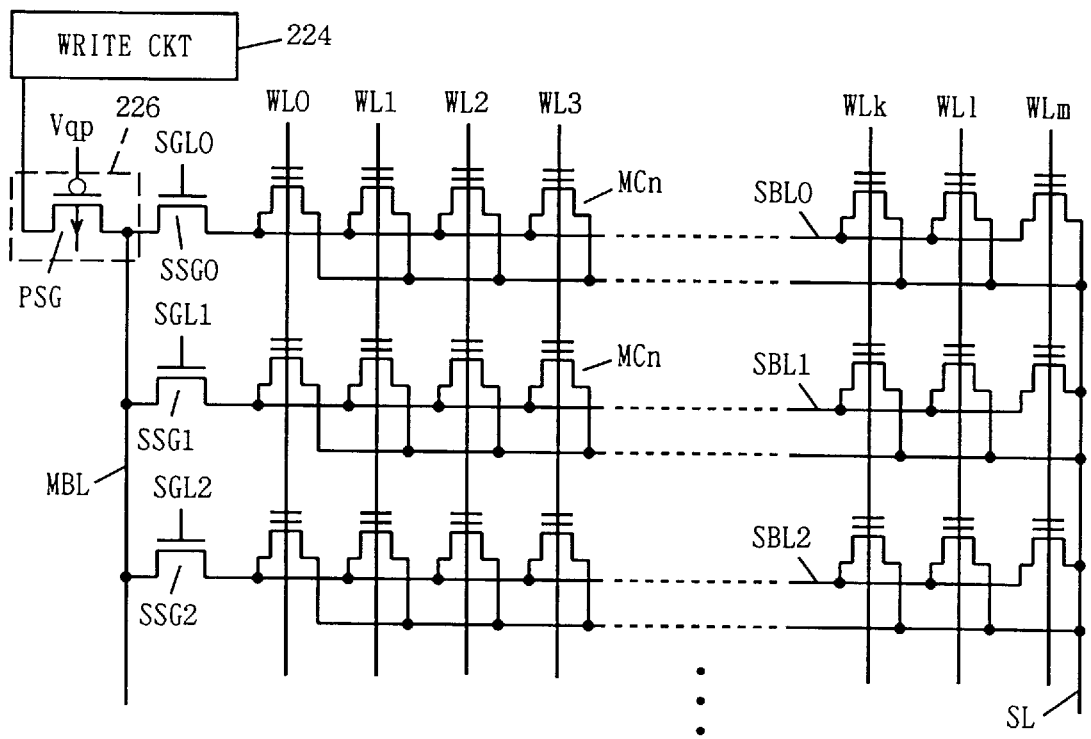
FIG. 40 schematically shows a structure of a main portion of a fourth modification of the seventh embodiment of the present invention.

FIG. 40 shows a structure of a fourth modification of the non-volatile semiconductor memory device in accordance with the seventh embodiment of the present invention. The non-volatile semiconductor memory device shown in FIG. 40 differs from the non-volatile semiconductor memory device shown in FIG. 39 in the following points. Namely, the memory cell MCn consists of an n channel stacked gate transistor, and the subbit line selection gate transistor SSG also consists of an n channel MOS transistor. Between the main bit line MBL and the write circuit 224, a write gate 226 serving as a constant current source at the time of programming is provided. The write gate 226 includes a write gate transistor TSG consisting of a p channel MOS transistor and receiving at its gate the control voltage Vgp at the time of programming. The write gate 226 may be a Y gate for selecting the main bit line, and therefore the write gate transistor PSG may be the Y gate transistor. Alternatively, it may be provided separate from the Y gate, between the write circuit and the Y gate.

In the structure shown in FIG. 40, conductivity types of the channels of transistors are all opposite to those of the structure shown in FIG. 39. Therefore, the voltages applied at the time of programming have opposite polarities. However, the operation is similar to that of the non-volatile semiconductor memory device shown in FIG. 39. Only the selection gate transistor provided corresponding to the selected subbit line is turned on and selection gate transistors provided corresponding to the non-selected subbit lines are off. To the write gate transistor PSG, a program voltage of about +7V, for example, is transmitted from write circuit 224 at the time of programming, and a voltage of about +6V, for example, is applied as control voltage Vgp to the gate. As shown in FIG. 40, in the structure utilizing the n channel stacked gate transistors as memory cells, similar effects as in the second modification can be obtained.

As for the overall structure of the non-volatile semiconductor memory device shown in FIGS. 39 and 40, the structure of FIG. 11 may be utilized, for example. What is necessary is to arrange the write gate transistor NSG or PSG between the write circuit 53 and Y gates YG1, YG0 in the structure shown in FIG. 11. Alternatively, Y decoder 57 may be modified to adjust the voltage level of the column selection signal at the selected state. In that case, the Y gate transistor functions as a constant current source.

[Fifth Modification]

Figure 41:
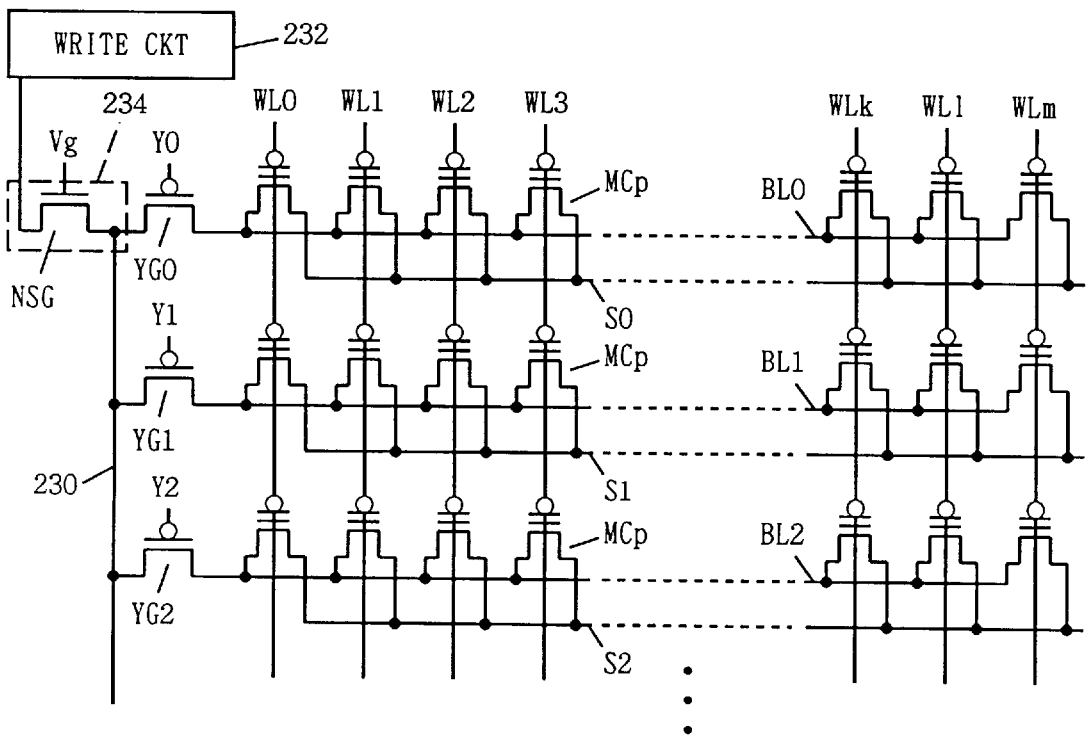
FIG. 41 schematically shows a structure of a main portion of a fifth modification of the seventh embodiment of the present invention.

FIG. 41 shows a structure of a fifth modification of the seventh embodiment of the present invention. Referring to FIG. 41, the non-volatile semiconductor memory device has a structure of an NOR type flash memory. The memory cell MCp consists of a p channel stacked gate transistor and memory cells MCp are arranged in rows and columns. Corresponding to respective columns of memory cells MCp, bit lines are arranged and corresponding to respective rows of memory cells, word lines are arranged. In FIG. 41, bit lines BL0–BL2 as well as word lines WL0–WLm are shown. Corresponding to respective rows of memory cells, source lines S0, S1 and S2 are arranged, which are connected to a source line switch circuit, not shown.

Between bit lines BL0–BL2 . . . and internal data line 230, Y gate transistors YG0–YG2, . . . consisting of p channel MOS transistors receiving at their gates column selection signals Y0–Y2, . . . from a Y decoder, not shown, are arranged. Further, between internal data line 230 and write circuit 232, a write gate 234 which operates as a constant current source at the time of programming is arranged. Write gate 234 includes a write gate transistor NSG consisting of an n channel MOS transistor which receives at its gate the control voltage Vg. In programming operation, the control voltage Vg and the potential of the substrate region (well potential) are adjusted under the control of program control circuit, not shown.

In the structure of the NOR type flash memory shown in FIG. 41, only the Y gate transistor which corresponds to the addressed bit line of Y gate transistors YG0, YG2, . . . is turned on at the time of programming, and other Y gate transistors are off. A negative voltage for programming of about −7V, for example, from write circuit 232 is applied to write gate 234, and the program voltage is transmitted to the selected bit line through write gate transistor NSG and selected Y gate transistor. The potential of the selected word line is set to a high voltage of +10V, for example. In this state, the voltage levels of Y gate transistors YG0–YG2, . . . do not change during programming operation. The control voltage Vg is set to the voltage level of about −6V, for example, and at the time of programming, the write gate transistor NSG operates as a constant current source and maintains constant the drain leak current of the selected memory cell at the time of programming. Therefore, even in such an NOR type flash memory, programming is possible at a constant program speed even when electric characteristics of the memory cells vary, and hence the width of the distribution of Vth after programming can be made narrow accordingly.

[Sixth Modification]

Figure 42:
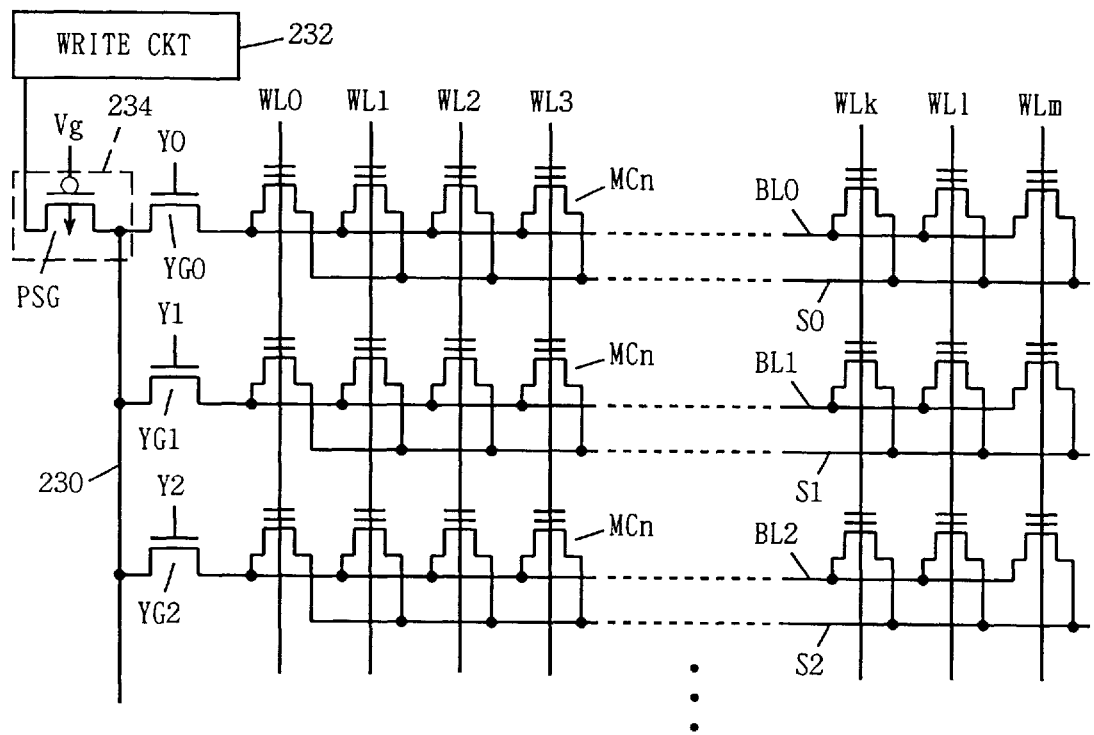
FIG. 42 schematically shows a structure of a main portion of a sixth modification of the seventh embodiment of the present invention.

FIG. 42 shows a structure of a main portion of the sixth modification in accordance with the seventh embodiment of the present invention. The non-volatile semiconductor memory device shown in FIG. 42 has, similar to the structure of FIG. 41, a structure of an NOR type flash memory. The NOR type flash memory shown in FIG. 42 has different conductivity types of channels of transistors from the NOR type flash memory shown in FIG. 41, and therefore voltages applied also have different polarities. More specifically, in the NOR type flash memory shown in FIG. 42, the memory cell MCn consists of an n channel stacked gate transistor, and Y gate transistor also consists of an n channel MOS transistor. Write gate 234 between internal data line 230 and write circuit 232 includes a p channel MOS transistor PSG. At the time of programming, the write gate transistor PSG including the p channel MOS transistor is operated as a constant current source. The NOR type flash memory shown in FIG. 42 is similar to the structure of FIG. 41 except that the polarities of the voltages applied are opposite. Therefore, similar operation as the NOR type flash memory shown in FIG. 41 is performed and similar function and effect can be obtained.

To the Y gate transistor connected to the bit line corresponding to the selected column, a voltage of about +10V which corresponds to an active state is applied, and a column selection signal at the level of the ground voltage is applied to the Y gate transistors corresponding to non-selected bit lines. To the gate of write gate transistor PSG, a voltage of about +6V, for example, is applied and a program voltage of about +7V is applied from write circuit 232. Consequently, the constant current is supplied only to the selected bit line, and a selected memory cell is programmed in accordance with the constant current.

For the non-volatile semiconductor memory devices shown in FIGS. 41 and 42, in the block level, the structure of the NOR type flash memory shown in FIG. 19 may be utilized. The structure is different from that shown in FIG. 11 only in the gate potential of the selection gate transistor and that the pulse voltage for verifying is not applied at the time of programming. Writing operation is continuously performed for a prescribed time period.

In the structure shown in FIGS. 41 and 42, a write gate is provided separate from the Y gate. However, when the Y decoder includes a level converting circuit, the Y gate transistor may be used as the write gate transistor of a constant current source by setting both operational power supply voltages of the level converting circuit to 6V and −10V or the ground voltage and +6V at the time of programming.

As described above, according to the seventh embodiment of the present invention, a constant current flows to the column line (subbit line or bit line) to which a selected memory cell is connected at the time of programming. Therefore, the drain leak current of the memory cell at the time of programming can be made constant, speed of programming of each of the memory cells can be made uniform, the number of times of verifying can be significantly reduced and the width of distribution of the threshold voltage after programming can be made narrow.

[Eighth embodiment]

Figure 43:
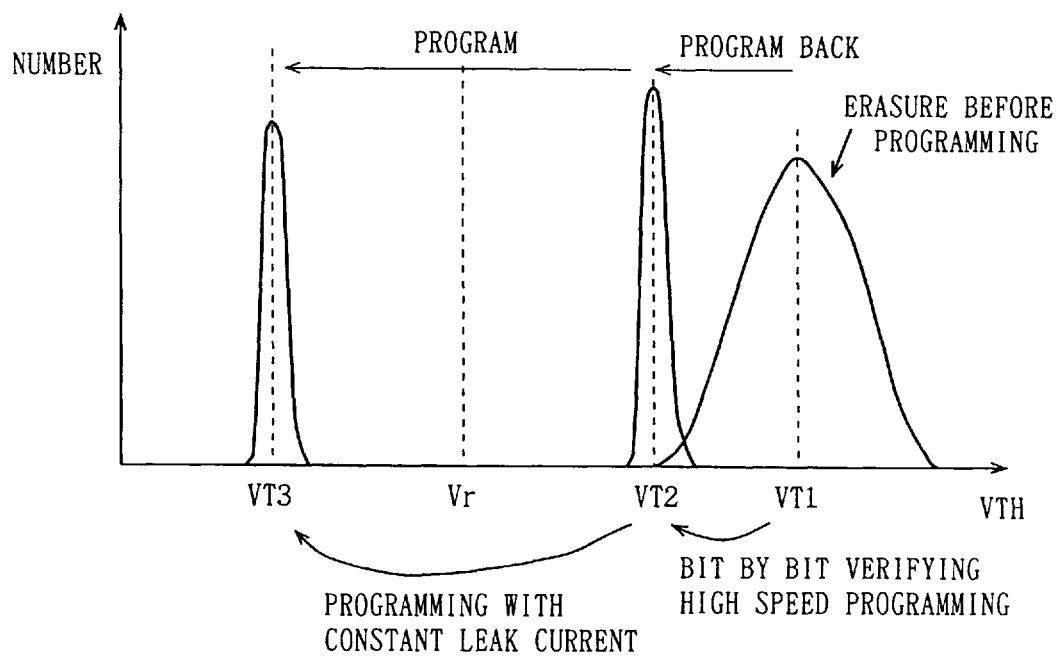
FIG. 43 shows an operation of the eighth embodiment of the present invention.
Figure 44:
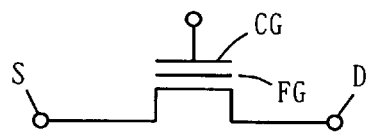
FIG. 44 shows a conventional collective erasure type EPROM cell.
Figure 45:
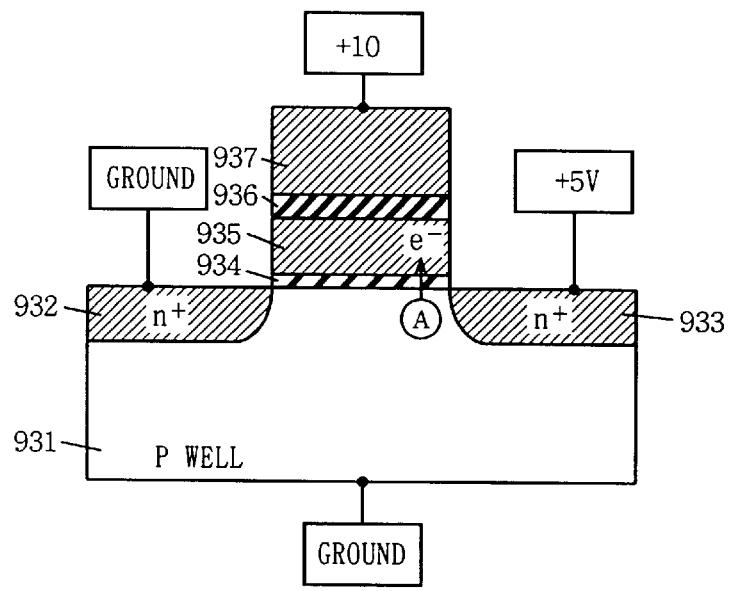
FIG. 45 shows cross sectional structure and programming operation of a memory cell of a conventional non-volatile semiconductor memory device.
Figure 46:
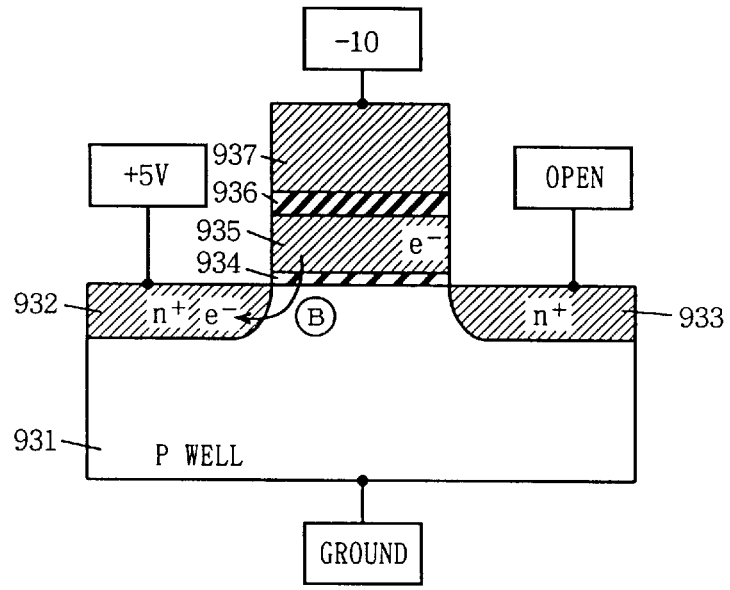
FIG. 46 represents erasing operation of a memory cell of a conventional non-volatile semiconductor memory device.

FIG. 43 is an illustration showing an operation at the time of writing in accordance with the eighth embodiment of the present invention.

Referring to FIG. 43, prior to programming, erasure is performed so that an area to be programmed (all the bits in an array or all the bits in a selector) are set to the erased state and absolute value of the threshold voltage is made large. At the time of erasure, bit by bit verifying operation is not performed. Therefore, the threshold voltages are distributed within a range of a certain width, with the threshold voltage VT1 being the center.

After this erasure prior to programming, program-back is performed by the bit by bit verifying high speed programming as described with respect to the first embodiment above. In the bit by bit verifying high speed programming operation, the absolute value of the verifying voltage at the time of verifying is made larger than that in the actual programming. The threshold voltages which have been distributed widely because of erasure prior to programming comes to have very narrow distribution with a threshold voltage VT2 being the center by the program back operation. Therefore, the initial threshold values before programming can be made approximately uniform. After this program-back, memory cells to be programmed are programmed by constant leak current method. Since the initial threshold voltages are approximately uniform for the memory cells and programming of memory cells takes place at the same speed, the threshold voltages Vth after programming are distributed within a very narrow range with the threshold voltage VT3 being the center. The read voltage Vr applied at the time of reading is between the threshold voltages VT2 and VT3.

In a flash memory, the time for erasure is, generally, at least 1msec. Even when bit by bit verifying program-back by the high speed programming method described above is performed on the flash memory, the amount of shift of the threshold voltages is small and the necessary time is very short (time for programming is generally 4 $\mu$sec and the time is shorter) which can be negligible as compared with the time for programming, and therefore increase in the time for erasure can be neglected. Therefore, it is possible to set initial threshold voltages before programming to approximately constant value without increasing the time for erasure. By performing programming with a constant leak current thereafter, it is possible to have the threshold voltages after programming distributed in very narrow range near a desired threshold voltage exactly.

As described above, according to the eighth embodiment of the present invention, erasure before programming is performed, then bit by bit verifying high speed programming is performed and initial threshold voltages are set approximately uniform. Therefore, after programming with a constant leak current, the distribution of the threshold voltages after programming can surely be made narrow.

According to the present invention, in a special operation mode in which the absolute value of the threshold voltage of a selected memory cell is made small, when a prescribed bias voltage is to be transmitted to a column line to which the selected memory cell is connected, current supplying capability for transmitting by the bias voltage is set smaller than the current drivability of the selected memory cell provided when the threshold voltage of the selected memory cell is made smaller than the prescribed absolute value. Therefore, in the special operation mode, when the threshold voltage of the selected memory cell becomes smaller than the prescribed absolute value, the bias voltage changes so as to terminate the specific operation of making smaller the absolute value of the threshold voltage of the selected memory cell. Consequently, variation in the threshold voltages of the selected memory cells can be suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device comprising:

a plurality of memory cells arranged in rows and columns and each storing information, each said memory cells including a stacked gate transistor having a floating gate for accumulating charges and a control gate formed on said floating gate with an insulating film interposed between said floating gate and said control gate;

a plurality of column lines corresponding to said columns, each of said column lines connecting a prescribed number of memory cells of a corresponding column;

a plurality of row lines corresponding to said rows, each of said row lines connecting the control gates of the memory cells of a corresponding row;

a bias voltage transmitting circuit configured to operate in a special operation mode for reducing an absolute value of a threshold voltage of a selected memory cell of said plurality of memory cells, to transmit a prescribed bias voltage to a column line of said column lines connected to said selected memory cell, said bias voltage transmitting circuit having a smaller current supplying capability than a current drivability of said selected memory cell when the threshold voltage of said selected memory cell is lower than or equal to a prescribed absolute value in said special operation mode; and a row selecting circuit for applying a prescribed potential to a row line of said plurality of row lines connected to said selected memory cell.

2. The non-volatile semiconductor memory device according to claim 1, wherein said bias voltage transmitting circuit includes:

a plurality of selection gate transistors corresponding to said plurality of column lines disposed in a substrate region formed in a region separate from a semiconductor substrate region having said plurality of memory cells formed thereon, for transmitting said prescribed bias voltage to a corresponding column line when selected; and a column selecting circuit for applying mutually different prescribed voltage to a control electrode and the substrate region of a selection gate transistor corresponding to the column line connected to said selected memory cell to select said column selection gate transistor, wherein an absolute value of difference between the voltage at the control electrode of the selection gate transistor corresponding to said selected column line and the bias voltage is larger than an absolute value of the difference between said bias voltage and the voltage of said substrate region.

3. The non-volatile semiconductor memory device according to claim 2, wherein:

said stacked gate transistor forms a channel region of a first validity type when conducted;

said column selecting circuit includes means for applying a voltage, having a same polarity as and a smaller absolute value than said bias voltage, to the control electrode of the selection gate transistor corresponding to said selected column line, and applying a voltage having substantially the same magnitude as said bias voltage to the substrate region of the selection gate transistor corresponding to said selected column line; and said selection gate transistor includes an insulated gate type field effect transistor forming a channel region of a second conductivity type when conducted.

4. The non-volatile semiconductor memory device according to claim 1, wherein all the memory cells arranged on a column are connected to a corresponding column line.

5. The non-volatile semiconductor memory device according to claim 1, wherein each of the columns of said memory cells is divided into a plurality of groups each including a prescribed number of memory cells, each of said column lines is arranged corresponding to one of said plurality of groups, and each of said selection gate transistors electrically connects a main column line arranged common with the plurality of groups of a corresponding column to a corresponding column line when selected.

6. The non-volatile semiconductor memory device according to claim 1, wherein said bias voltage transmitting circuit includes:

a bias writing gate formed of an insulated gate type field effect transistor for transmitting said prescribed bias voltage, said bias writing gate being provided common to respective columns;

means for applying a voltage smaller in absolute value than said prescribed bias voltage and a voltage of an approximately identical magnitude with said bias voltage to a control electrode and a substrate region of said bias writing gate, respectively; and a plurality of column selection gates, corresponding to respective ones of said columns, for transmitting the bias voltage from said bias write gate to the corresponding column lines, said plurality of column selection gates being rendered conductive in response to a column selection signal.

7. The non-volatile semiconductor memory device according to claim 6, wherein:

the stacked gate transistor of each of said memory cells forms a channel of a first conductivity type when conducted;

each of the column selection gates includes an insulated gate type field effect transistor forming a channel of the first conductivity type when conducted; and said bias writing gate includes an insulated gate type field effect transistor forming a channel of a second conductivity type when conducted.

8. The non-volatile semiconductor memory device according to claim 1, wherein said row selecting circuit includes means for repeatedly and alternately applying voltage of mutually different polarities having a prescribed time width to the selected row line.

9. The non-volatile semiconductor memory device according to claim 8, wherein:

one of said voltages of mutually different polarities is a voltage for driving the selected row line to a selected state in said special operation mode; and said non-volatile semiconductor memory device further includes means for adjusting at least one of a time width and a voltage level of another one of said voltages having mutually different polarities.

10. The non-volatile semiconductor memory device according to claim 1, further comprising means for applying a second bias voltage to a conduction node different from a conduction node connected to the column line of the stacked gate transistor of the selected memory cell in said special operation mode.

11. The non-volatile semiconductor memory device according to claim 8, further comprising means for applying a second bias voltage to a first conduction node of the stacked gate transistor of the selected memory cell during the application of the voltages of mutually different polarities, said first conduction node being different from a second conduction node connected to the column line of the stacked gate transistor of said selected memory cell.

12. The non-volatile semiconductor memory device according to claim 1, wherein said bias voltage transmitting circuit includes a transistor operating in a linear region to transmit said prescribed bias voltage.

13. The non-volatile semiconductor memory device according to claim 1, wherein said voltage transmitting circuit includes:

a plurality of selection gate transistors corresponding to the respective column lines said selection gate transistors being disposed in a substrate region formed in a region separate from a semiconductor substrate region having said plurality of memory cells formed thereon, for transmitting said prescribed bias voltage to a corresponding column line when selected;

column selecting circuitry for applying mutually different prescribed voltage to a control electrode and the substrate region of a selected selection gate transistor provided corresponding to the column line connected to said selected memory cell; and an absolute value of a difference between the voltage at the control electrode of the selection gate transistor corresponding to the selected column line and the bias voltage is made larger than an absolute value of a difference between said bias voltage and the voltage of a control electrode of a selection gate transistor provided for a non-selected column line having no selected memory cell connected thereto.

14. A non-volatile semiconductor memory device, comprising:

a plurality of memory cells arranged in rows and columns, each storing information, each said memory cells including a stacked gate transistor having a floating gate for accumulating charges and a control gate formed on said floating gate with an insulating film interposed between said floating gate and said control gate;

a plurality of column lines corresponding to said columns, each of said column lines connecting a prescribed number of memory cells of a corresponding column;

a plurality of row lines corresponding to said rows, each of said row lines connecting a prescribed number of memory cells of the corresponding column;

a bias voltage transmitting circuit configured to operate in a special operation mode for reducing an absolute value of a threshold voltage of a selected memory cell, to transmit a prescribed bias voltage to selected column lines connecting the selected memory cell, said bias voltage transmitting circuit including means for supplying a constant current to said selected column line; and a row driving circuit for applying a prescribed voltage to a selected row line connecting said selected memory cell.

15. The non-volatile semiconductor memory device according to claim 14, wherein:

said stacked gate transistor forms a channel of a first conductivity type when conducted;

said columns are divided into a plurality of groups, each group including a plurality of memory cells;

each column line is arranged corresponding to each group; and said bias voltage transmitting circuit includes a plurality of selection gates, corresponding to said plurality of column lines, each formed of an insulated gate type field effect transistor forming a channel of a second conductivity type and operating in a saturation region to connect a corresponding main column line among main column lines arranged corresponding to respective columns when conducted.

16. The non-volatile semiconductor memory device according to claim 14, wherein:

said stacked gate transistor forms a channel of a first conductivity type when conducted, and all the memory cells of each said columns are connected to each respective column line; and said bias voltage transmitting means includes:

a write gate transistor provided common to said columns and formed of an insulated gate type field effect transistor forming a channel of a second conductivity type when conducted, and a plurality of column selection gates corresponding said column lines, each column selection gate forming a channel of the first conductivity type when conducted and transmitting a current and a bias voltage applied from said write gate transistor to a corresponding column line, wherein said write gate transistor operates in a saturation region.

17. The non-volatile semiconductor memory device according to claim 14, wherein said bias voltage transmitting means include an insulated gate type field effect transistor having a source for receiving said bias voltage, and a drain electrically coupled to the selected column line and operating in a saturation region.

18. The non-volatile semiconductor memory device according to claim 14, wherein said stacked gate transistor further includes a first conduction node coupled to receive said prescribed bias voltage and a second conduction node made open in said special operation node.

19. The non-volatile semiconductor memory device according to claim 14, further comprising an erase circuit, activated prior to said special operation mode, for selecting a predetermined number of memory cells including said selected memory cell and applying voltages to the stacked gate transistors of the predetermined number of memory cells thereby increasing the absolute value of a threshold voltage of the stacked gate transistors.

20. The non-volatile semiconductor memory device according to claim 19, wherein said bias voltage transmitting circuit includes means, activated prior to said special operation mode and subsequent to activation of said erase circuit, for applying a second bias voltage to said selected memory cell with a current driving capability smaller than that of the selected memory cell implemented when the threshold voltage of the selected memory cell reaches a predetermined value, and means for repeatedly and alternately applying a control voltage of different polarities and of predetermined time widths to a row line connecting the selected memory cell.

* * * * *